United States Patent
Maejima

(10) Patent No.: US 9,922,717 B1
(45) Date of Patent: Mar. 20, 2018

(54) MEMORY DEVICE TO EXECUTED READ OPERATION USING READ TARGET VOLTAGE

(71) Applicant: Toshiba Memory Corporation, Tokyo (JP)

(72) Inventor: Hiroshi Maejima, Setagaya Tokyo (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/445,985

(22) Filed: Mar. 1, 2017

(30) Foreign Application Priority Data

Sep. 16, 2016 (JP) ................................. 2016-181534

(51) Int. Cl.
*G11C 16/04* (2006.01)
*G11C 16/34* (2006.01)
*G11C 16/26* (2006.01)
*G11C 16/10* (2006.01)
*G11C 16/16* (2006.01)

(52) U.S. Cl.
CPC ...... *G11C 16/3427* (2013.01); *G11C 16/0483* (2013.01); *G11C 16/10* (2013.01); *G11C 16/16* (2013.01); *G11C 16/26* (2013.01); *G11C 16/3459* (2013.01)

(58) Field of Classification Search
CPC . G11C 16/3427; G11C 16/3459; G11C 16/16; G11C 16/0483; G11C 16/26; G11C 16/10
USPC .......................... 365/185.02, 185.17–185.18, 365/185.21–185.22, 185.33
See application file for complete search history.

(56) References Cited

U.S. PATENT DOCUMENTS

| | | | |
|---|---|---|---|
| 7,852,676 B2 | 12/2010 | Maejima | |
| 7,936,004 B2 | 5/2011 | Kito et al. | |
| 8,559,224 B2 | 10/2013 | Han et al. | |
| 8,582,361 B2 | 11/2013 | Maejima | |
| 8,830,757 B2 | 9/2014 | Kito | |
| 9,165,651 B2 | 10/2015 | Hosono | |
| 9,373,404 B2* | 6/2016 | Sakui | G11C 16/26 |

* cited by examiner

*Primary Examiner* — David Lam
(74) *Attorney, Agent, or Firm* — Patterson & Sheridan, LLP

(57) ABSTRACT

A memory device includes a first string including first and second memory cells, first and second select transistors, and a third select transistor between the first and second select transistors, a second string including third and fourth memory cells, fourth and fifth select transistors, and a sixth select transistor between the fourth and fifth select transistors, and a controller. During a first read phase, a first voltage is applied to first, second, and third select transistors, and one of fourth and fifth select transistor, and a second voltage lower than the first voltage is applied to sixth select transistor and other of fourth and fifth select transistors. During a second read phase, the second voltage is applied to fourth, fifth, and sixth select transistors, and a read target voltage is applied to a selected word line.

20 Claims, 34 Drawing Sheets

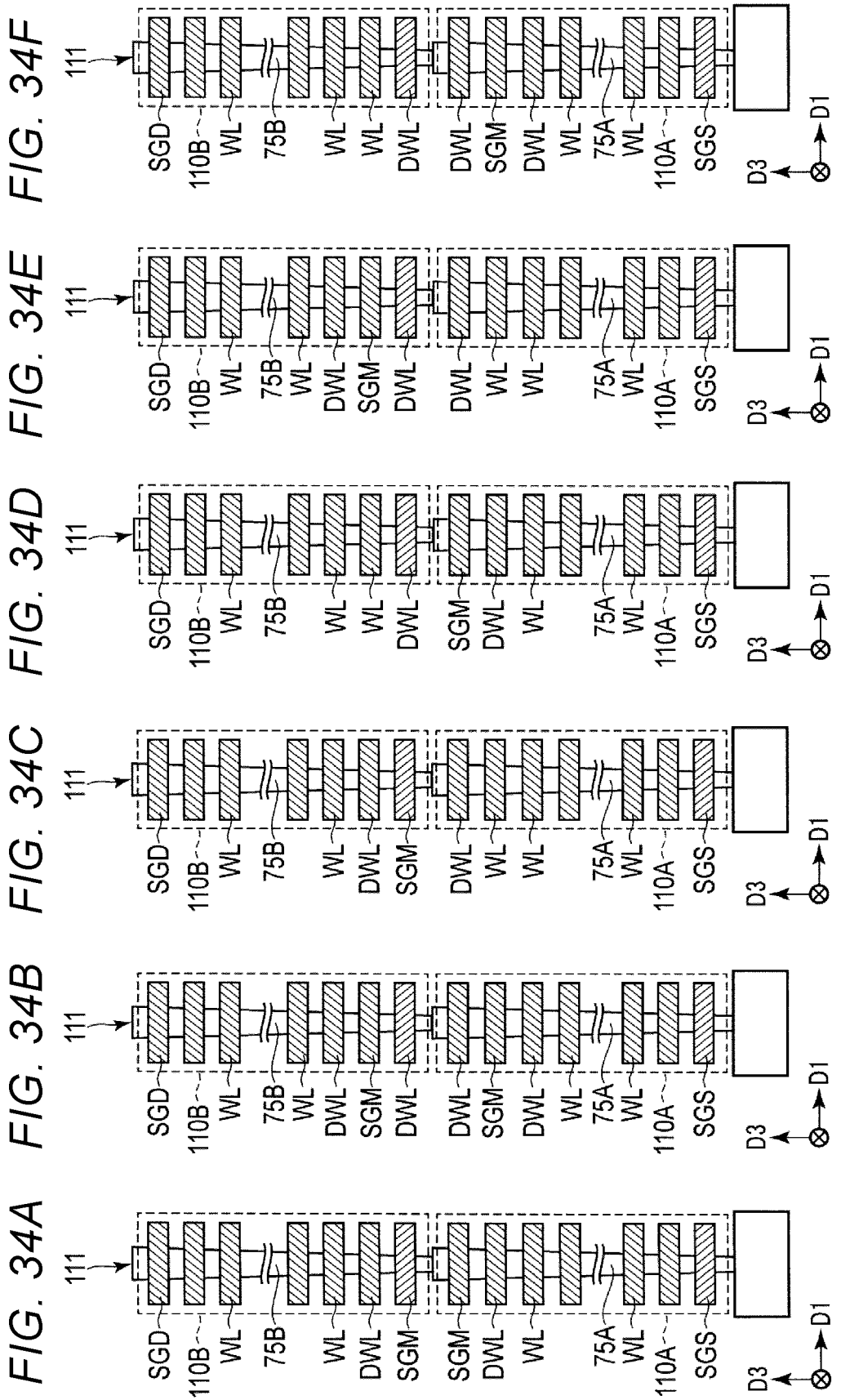

US 9,922,717 B1

MEMORY DEVICE TO EXECUTED READ OPERATION USING READ TARGET VOLTAGE

CROSS-REFERENCE TO RELATED APPLICATION

This application is based upon and claims the benefit of priority from Japanese Patent Application No. 2016-181534, filed Sep. 16, 2016, the entire contents of which are incorporated herein by reference.

FIELD

Embodiments described herein relate generally to a memory device.

BACKGROUND

A NAND type flash memory in which memory cells are arranged in a three-dimensional manner is known.

DESCRIPTION OF THE DRAWINGS

FIGS. 34A to 34F are diagrams illustrating a modification example of the memory device of the embodiment.

DETAILED DESCRIPTION

Figure 1:
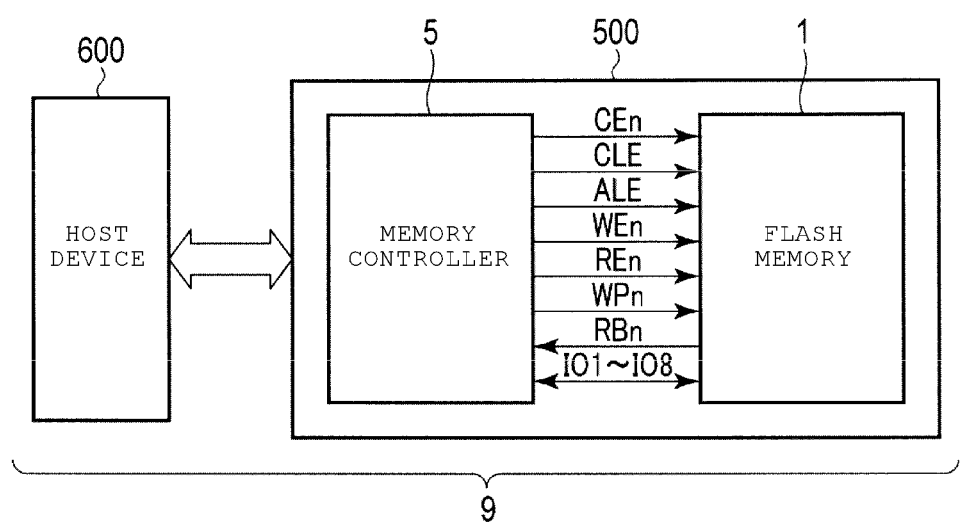
FIG. 1 is a block diagram illustrating a memory system including a memory device of an embodiment.

Operation characteristics of a memory device are improved according to embodiments.

In general, according to an embodiment, a memory device includes a first memory string including a first memory cell, a second memory cell, a first select transistor above the first memory cell, a second select transistor below the second memory cell, and a third select transistor between the first and second memory cells, a second memory string including a third memory cell, a fourth memory cell, a fourth select transistor above the third memory cell, a fifth select transistor below the fourth memory cell, and a sixth select transistor between the third and fourth memory cells, a first word line electrically connected to the first and third memory cells, a second word line electrically connected to the second and fourth memory cells, and a controller configured to execute a read operation on one of the memory cells, the read operation including a first phase and a second phase. When a read target is one of the first and second memory cells, during the first phase, a first voltage is applied to the first, second, and third select transistors, and one of the fourth and fifth select transistors, and a second voltage lower than the first voltage is applied to the sixth select transistor and the other one of the fourth and fifth select transistors, and during the second phase, the second voltage is applied to the fourth, fifth, and sixth select transistors, and a read target voltage is applied to one of the first and second word lines.

Hereinafter, with reference to the drawings, the present embodiment will be described in detail. In the following description, constituent elements having the same function and configuration are given the same reference numerals.

In the following respective embodiments, if constituent elements with reference signs (for example, word lines WL, bit lines BL, and various voltages and signals) have numbers/letters at ends thereof for differentiation. If they are not to be distinguished from each other, the constituent elements are described with reference signs with the numbers/letters omitted at the ends thereof.

Embodiments (1) First Embodiment

With reference to FIGS. 1 to 16, a memory device according to an embodiment will be described.

(a) Configuration

With reference to FIGS. 1 to 9, a description will be made of a configuration example of the memory device of the embodiment.

FIG. 1 is a diagram illustrating a memory system including the memory device of the present embodiment.

As illustrated in FIG. 1, a memory system 9 including the memory device of the present embodiment includes a storage device 500 and a host device 600.

The host device 600 is coupled to the storage device 500 via, for example, a connector, a cable, wireless communication, or the Internet. The host device 600 requests the storage device 500 to perform writing of data or erasing of data or reading of data.

The storage device 500 includes a memory controller 5, and a memory device (semiconductor memory) 1.

The memory controller 5 causes the memory device 1 to perform an operation corresponding to a request from the host device 600.

The memory controller 5 includes, for example, a processor (CPU), an internal memory (for example, a DRAM), a buffer memory (for example, an SRAM), and an ECC circuit. The processor controls the entire operation of the memory controller 5. The internal memory temporarily holds a program (software/firmware) and management information (management table) of the storage device/the memory device. The buffer memory temporarily holds data transmitted and received between the memory device 1 and the host device 600. The ECC circuit detects an error in data read from the memory device 1, and corrects the detected error.

The memory device 1 stores data. The memory device 1 performs writing of data, reading of data, and erasing of data based on commands (requests from the host device 600) from the memory controller 5.

The memory device 1 is, for example, a NAND type flash memory. The storage device 500 (or the memory system 9) including the flash memory 1 is, for example, a memory card (for example, an SD™ card or an eMMC™), a USB memory, or a solid state drive (SSD).

Various signals are transmitted and received between the NAND type flash memory 1 and the memory controller 5. For example, a chip enable signal CEn, a command latch enable signal CLE, an address latch enable signal ALE, a write enable signal WEn, a read enable signal REn, and a write protect signal WPn are used as control signals based on a NAND interface standard between the flash memory 1 and the memory controller 5.

The signal CEn is used to enable the flash memory 1. The signal CLE and the signal ALE are used to respectively notify that signals on I/O lines IO (IO1 to IO8) are a command and an address signal.

The signal WEn and the signal REn are used to given an instruction for inputting and outputting of signals using, for example, eight I/O lines IO. The signal WPn is used to set the flash memory 1 in a protection state, for example, when a power source is turned on and off.

A ready/busy signal RBn is generated based on an operation state of the flash memory 1, and is transmitted to the memory controller 5. The signal RBn is used to notify the memory controller 5 whether the flash memory 1 is in a ready state (a state of being ready to receive a command from the memory controller 5) or a busy state (a state of not being ready to receive a command from the memory controller 5). For example, the signal RBn is at an "L" level (busy state) while the flash memory 1 is performing an operation such as reading of data, and goes to an "H" level (ready state) if such an operation is completed.

Figure 2:
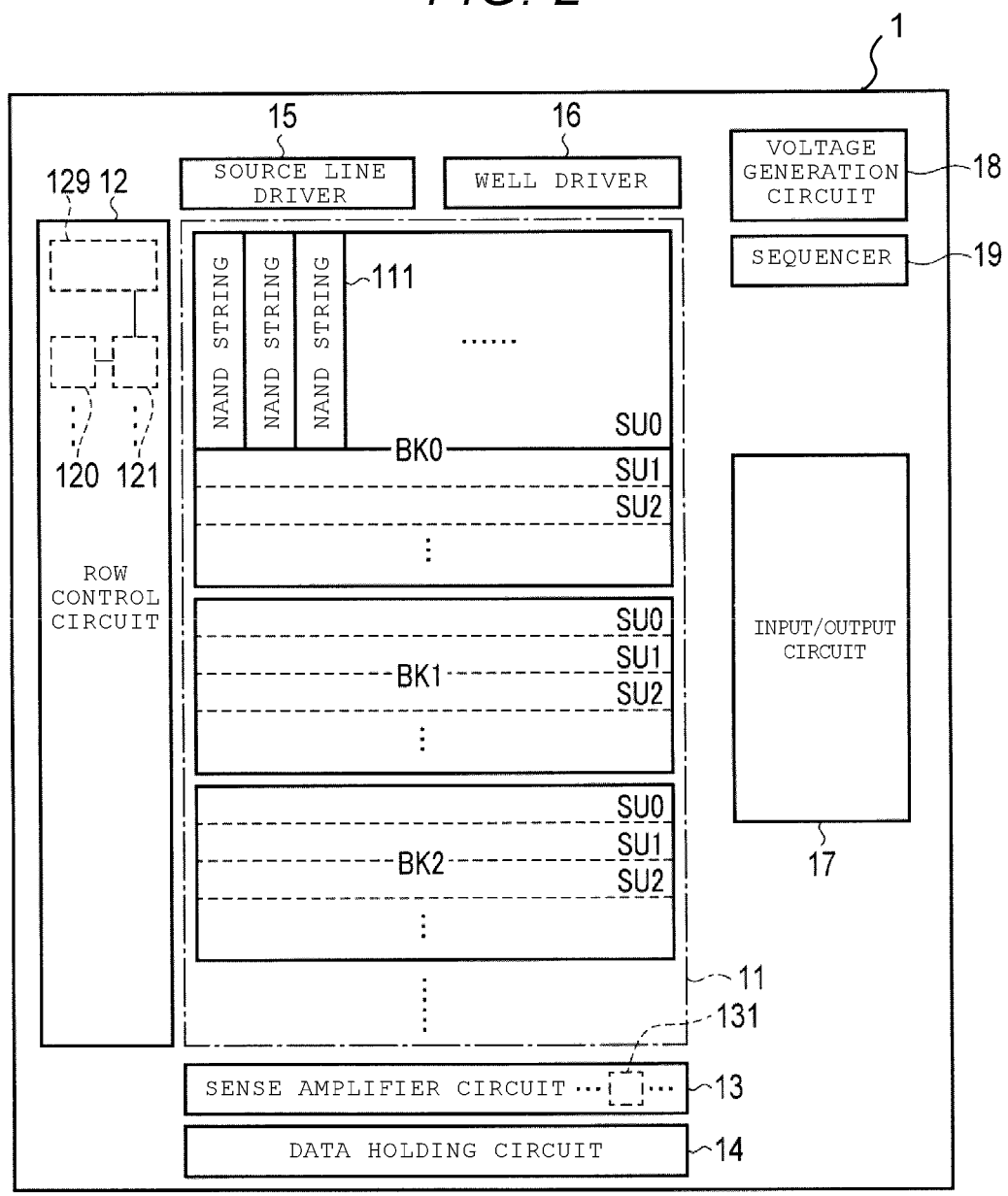
FIG. 2 is a block diagram illustrating an example of an internal configuration of the memory device of the embodiment.

FIG. 2 is a block diagram illustrating an internal configuration of the memory device (for example, a NAND type flash memory) of the present embodiment.

As illustrated in FIG. 2, the NAND type flash memory 1 includes a memory cell array 11, a row control circuit 12, a sense amplifier circuit 13, a data holding circuit 14, a source line driver 15, a well driver 16, an input/output circuit 17, a voltage generation circuit 18, a sequencer 19, and the like.

The memory cell array 11 includes a plurality of blocks BK (BK0, BK1, BK2, . . . ). Each of the blocks BK includes a plurality of string units SU (SU0, SU1, SU2, . . . ). Each of the string units SU includes a plurality of NAND strings (memory cell strings) 111. Each of the NAND strings 111 includes a plurality of memory cells. An internal configuration of the memory cell array 11 will be described later.

The row control circuit 12 controls rows (for example, word lines) of the memory cell array 11.

The row control circuit 12 includes a plurality of address decoders 120, a plurality of switch circuits 121, and a driver 129. A single address decoder 120 corresponds to a single block BK. A single switch circuit corresponds to a single block BK. The address decoders 120 decode addresses from the memory controller 5. The switch circuits 121 enable blocks BK corresponding to addresses, and disable other blocks BK based on decoding results in the address decoders 120. The driver 129 supplies voltages corresponding to enabling/disabling of the blocks BK to the respective blocks BK via the switch circuits 121.

The sense amplifier circuit 13 senses and amplifies a signal (data) which is output to a bit line in the memory cell array 11 during reading of data. For example, the sense amplifier circuit 13 senses the occurrence of a current in the bit line (or a wiring connected to the bit line) or a change in a potential of the bit line, as a signal from the memory cell. Based on such sensing, the sense amplifier circuit 13 reads data held in the memory cell. The sense amplifier circuit 13 controls a potential of the bit line according to data to be written during writing of data. The sense amplifier circuit 13 includes sense amplifier units 131 which control sensing in respective bit lines, and the bit lines.

The data holding circuit (for example, a page buffer circuit) 14 temporarily holds data which is output from the memory cell array 11, or data (data from the memory controller 5) which is input to the memory cell array 11.

The source line driver 15 controls potentials of source lines in the memory cell array 11. The well driver 16 controls a potential of a well region in the memory cell array 11.

The input/output circuit 17 functions as an interface circuit of the above-described various control signals from the memory controller 5 and the I/O lines IO1 to IO8. The voltage generation circuit 18 generates various voltages used for an operation of the memory cell array 11.

The sequencer 19 controls the entire operation of the flash memory 1. The sequencer 19 controls an internal operation of the flash memory 1 based on control signals and commands which are transmitted and received between the memory controller 5 and the flash memory 1.

Circuit Configuration of Memory Cell Array

Figure 3:
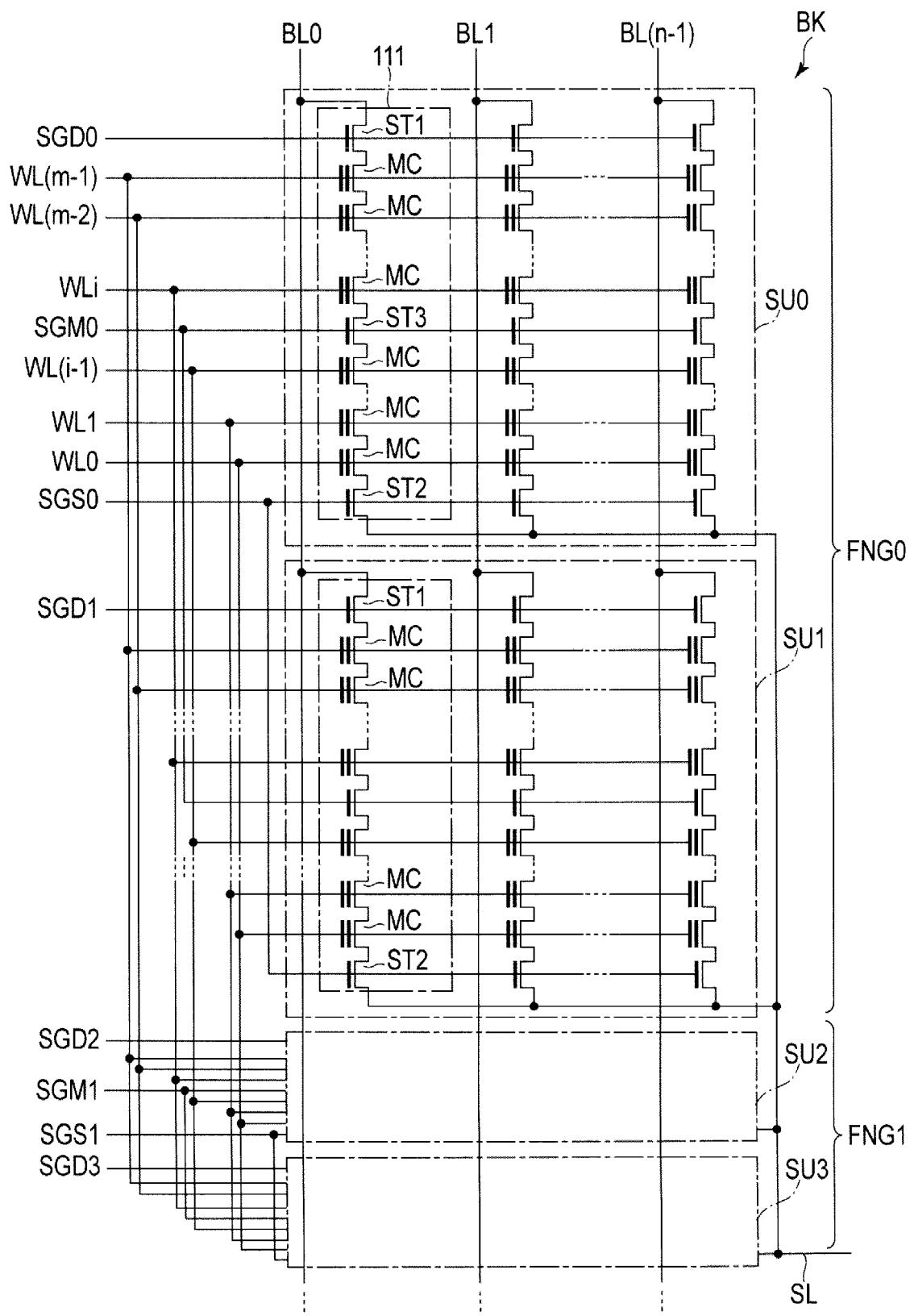
FIG. 3 is a circuit diagram illustrating an example of a memory cell array of the memory device of the embodiment.
Figure 4:
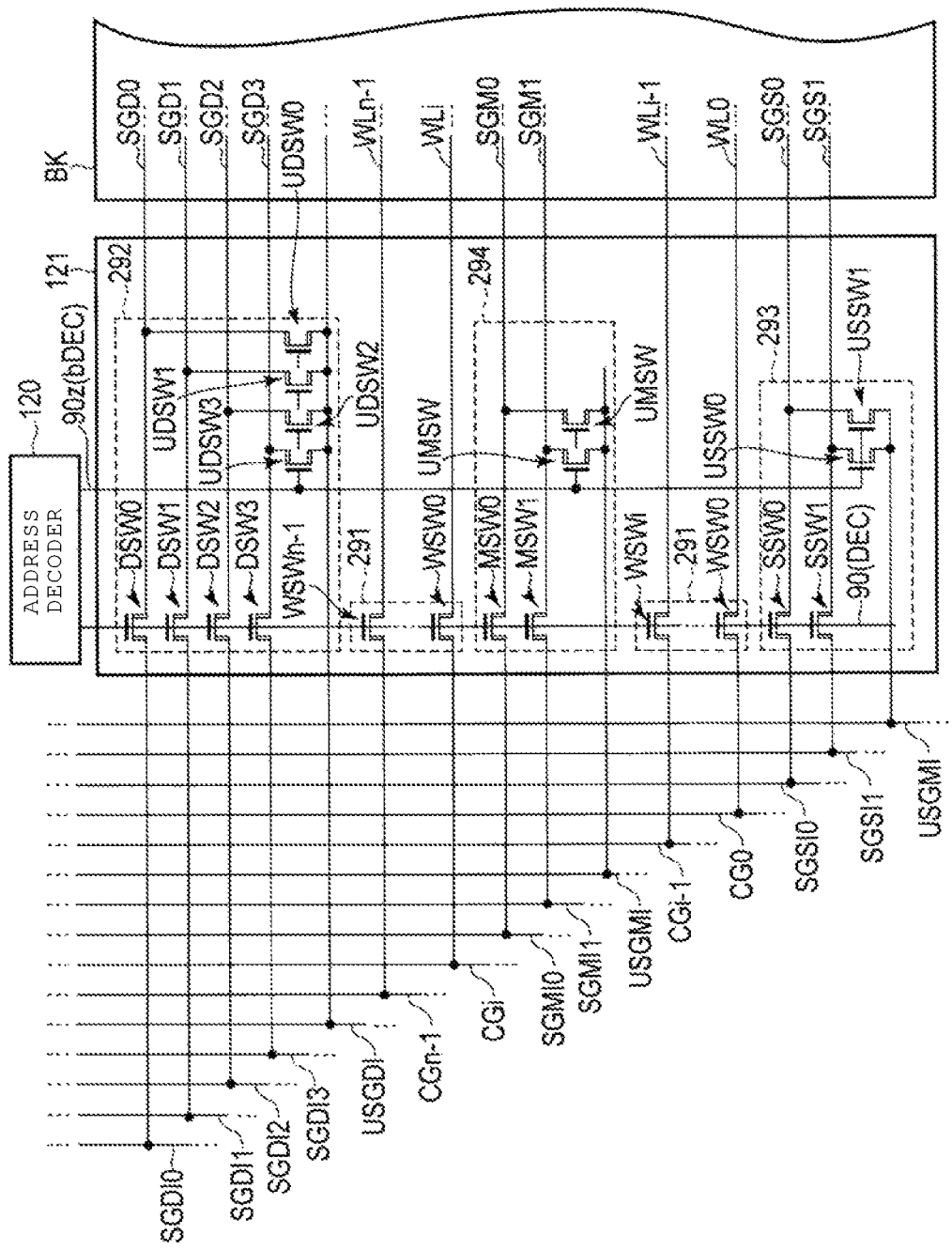
FIG. 4 is a circuit diagram illustrating an example of a row control circuit of the memory device of the embodiment.

With reference to FIGS. 3 and 4, a description will be made of an example of an internal configuration of the memory cell array in the flash memory of the present embodiment.

FIG. 3 is an equivalent circuit diagram of a single block in the memory cell array 11. In the memory cell array 11 of the NAND type flash memory, the block BK is an erasing unit of data. However, an erasing operation on the memory cell array 11 may be performed in the unit (storing area) smaller than the block. The erasing operations disclosed in U.S. patent application Ser. No. 12/679,991, filed on Mar. 25, 2010, entitled "nonvolatile semiconductor memory device and manufacturing method thereof," and U.S. patent application Ser. No. 12/532,030, filed on Mar. 23, 2009, entitled "semiconductor memory and manufacturing method thereof," both of which are incorporated by reference herein, may be used in the embodiments.

As illustrated in FIG. 3, in the memory cell array 11, a single block BK includes a plurality of (for example, two) areas FNG (FNG0 and FNG1). Each of the areas FNG includes one or more string units SU. For example, a single area FNG includes two string units SU.

Each of the NAND strings 111 includes a plurality of memory cells (also referred to as memory portions or memory elements) MC and a plurality of select transistors ST1 and ST2.

Each of the memory cells MC (MC0, MC1, . . . , MC(m–2), and MC(m–1)) includes a control gate and a charge storage layer. In the NAND string 111, the plurality of memory cells MC are connected in series to each other between the two select transistors ST1 and ST2. Among the plurality of memory cells MC connected in series to each other, one end (one of a source or a drain) of the memory cell MC on a drain side is connected to one end of the drain side select transistor ST1. Among the plurality of memory cells MC connected in series to each other, one end of the memory cell MC on a source side is connected to one end of the source side select transistor ST2.

A plurality of word lines WL (WL0, WL1, . . . , WL(m–2), and WL(m–1)) are respectively connected to gates of the corresponding memory cells MC. Here, "m" is a natural number of 2 or more. For example, a single word lines WL is connected in common to the memory cells MC in a plurality of string units SU.

Data writing and data reading are collectively performed on the memory cells MC connected to any one of word lines WL in any one of string units SU. The unit of data reading and data writing is referred to as a page.

A plurality of drain side select gate lines SGD (SGD0 to SGD3) are respectively connected to gates of the drain side select transistors ST1 of the corresponding string units SU.

A plurality of source side select gate lines SGS (SGS0 and SGS1) are connected in common to gates of the source side select transistors ST2 of the string units SU. In the example illustrated in FIG. 3, two source side select gate lines SGS are provided in a single block BK. A single source side select gate line SGS is used in common for two string units SU in the area FNG. The two source side select gate lines SGS in two different areas FNG are separated from each other.

A source line SL is connected to the other end (the other of the source and the drain) of the source side select transistor ST2. The other end of the drain side select transistor ST1 is connected to any one of a plurality of bit lines BL (BL0, BL1, . . . , and BL(n–1)). Here, "n" is a natural number of 1 or more.

In the flash memory of the present embodiment, the block BK includes a plurality of select gate lines SGM (SGM0 and SGM1). Consequently, each of the NAND strings 111 includes one or more select transistors ST3.

One or more select gate lines SGM are provided in a single area FNG. The select gate line SGM is provided between two word lines WLi and WL(i–1). Here, "i" is a natural number of 0 or more and (m–1) or less.

For example, in the area FNG, the select gate line SGM is used in common for a plurality of string units SU. In the example illustrated in FIG. 3, one select gate line SGM0 is connected to the string units SU0 and SU1, and the other select gate line SGM1 is connected to the string units SU2 and SU3. Consequently, the select gate lines SGM are controlled separately for each area FNG.

The select transistor ST3 is provided between two memory cells MC in the NAND string 111. One end of the select transistor ST3 is connected to one end of the memory cells MC adjacent to each other on the drain side. The other end of the select transistor ST3 is connected to one end of the memory cells MC adjacent to each other on the source side. A gate of the select transistor ST3 is connected to the select gate line SGM.

In the description given herein, the select gate lines SGM will be referred to as intermediate select gate lines SGM. The select transistors ST3 connected to the intermediate select gate lines SGM will be referred to as intermediate select transistors ST3.

As illustrated in FIG. 3, a plurality of memory cells MC are provided between the drain side select transistor ST1 and the intermediate select transistor ST3. A plurality of memory cells MC are provided between the source side select transistor ST2 and the intermediate select transistor ST3. The flash memory 1 of the present embodiment can control electrical connection between the plurality of memory cells on the drain side and the plurality of memory cells on the source side by using the intermediate select transistors ST3 and the intermediate select gate lines SGM.

A dummy word line may be provided in each string unit SU. The dummy word line is configured with at least one word line provided near each of select gate lines SGD, SGS and SGM. In the flash memory of the present embodiment, at least one of word lines WL adjacent to the select gate lines SGD, SGS and SGM, for example, at least one of word lines WL0, WL(i–1), WLi, and WL (m–1) may be used as the dummy word line. The dummy word line has an address which is not selected as a data writing target. Memory cells connected to the dummy word line are not used to hold data from a user.

The number of blocks BK in the memory cell array 11, the number of string units SU in a single block BK, or the number of memory cells MC in the NAND string 111 is not limited to any particular number.

Two or more intermediate select gate lines SGM may be provided in a single string unit SU. In such a case, a plurality of intermediate select transistors are provided in a single NAND string 111. A single intermediate select gate line SGM may be provided separately for each of a plurality of string units SU. In such a case, a single intermediate select gate line SGM is provided in a single string unit SU.

The source side select gate lines SGS may be separately provided in the respective string units SU.

A selected string unit and a non-selected string unit are set in the block by controlling a potential of the select gate line.

FIG. 4 is a schematic equivalent circuit diagram for explaining an internal configuration of the row control circuit in the flash memory of the present embodiment.

As illustrated in FIG. 4, a single address decoder 120 and a single switch circuit 121 are provided for a single block BK.

The switch circuit 121 is connected to selection signal lines 90 and 90z of the address decoder. The switch circuit 121 can control enabling and disabling of the block BK based on signals (address decoding results) DEC and bDEC from the address decoder 120. The signals DEC and bDEC have mutually complementary signal levels (an "H" level and an "L" level).

The switch circuit 121 includes a word line switch unit 291, a drain side select gate line switch unit 292, a source side select gate line switch unit 293, and an intermediate select gate line switch unit 294. Each of the switch units 291, 292, 293 and 294 includes a high breakdown voltage transistor as a switch.

The word line switch unit 291 includes switches (selection switches) WSW of the same number as the number of word lines in the block BK. One end of a current path of each switch WSW is connected to a single word line WL, and the other end of the current path of each switch WSW is connected to a single CG line CG corresponding to the word line WL. A control terminal (a gate of the transistor) of each switch WSW is connected to the selection signal line 90 of the address decoder 120. Turning-on and turning-off of each switch WSW are controlled based on the signal (block selection signal) DEC on the selection signal line 90.

A turned-on switch WSW allows various voltages corresponding to operations of the flash memory to be transmitted to the word lines WL in the selected block BK.

The drain side select gate line switch unit 292 includes a plurality of switches (selection switches) DSW0, DSW1, DSW2 and DSW3. The number of switches DSW0 to DSW3 is the same as the number of drain side select gate lines SGD in the block. The switches DSW0 to DSW3 respectively correspond to the drain side select gate lines SGD0 to SGD3 on a one-to-one basis.

One ends of the switches DSW0 to DSW3 are connected to the drain side select gate lines SGD0 to SGD3. The other ends of the switches DSW0 to DSW3 are respectively connected to wirings SGDI0 to SGDI3.

Control terminals of the respective the switches DSW0 to DSW3 are connected to the selection signal line 90. Turning-on and turning-off of the switches DSW0 to DSW3 are controlled based on the signal DEC.

The drain side select gate line switch unit 292 includes a plurality of switches (non-selection switches) UDSW0, UDSW1, UDSW2 and UDSW3. The number of switches UDSW is the same as the number of drain side select gate lines SGD in the block BK. The switches UDSW0, UDSW1, UDSW2 and UDSW3 respectively correspond to the drain side select gate lines SGD0 to SGD3 on a one-to-one basis.

One ends of the switches UDSW0, UDSW1, UDSW2 and UDSW3 are respectively connected to the drain side select gate lines SGD0 to SGD3. The other ends of the switches UDSW0, UDSW1, UDSW2 and UDSW3 are connected in common to a wiring USGDI. Control terminals of the switches UDSW are connected to the selection signal line 90z. Turning-on and turning-off of the switches UDSW are controlled based on the signal bDEC.

If the switches DSW are turned on due to the signal DEC having an "H" level, the switches UDSW are turned off due to the signal having an "L" level. In this case, the drain side select gate lines SGD are respectively electrically connected to the wirings SGDI. The turned-on switches DSW allow voltages applied to the respective wirings SGDI according to operations of the flash memory and selection addresses to be transmitted to the drain side select gate lines SGD in a selected block.

If the switches UDSW are turned on due to the signal bDEC having an "H" level, the drain side select gate lines SGD are respectively electrically connected to the wirings USGDI. The turned-on switches UDSW allow voltages of the wirings USGDI to be transmitted to the drain side select gate lines SGD in a non-selected block.

The source side select gate line switch unit 293 includes a plurality of switches (selection switches) SSW0 and SSW1. The number of switches SSW0 and SSW1 is the same as the number of source side select gate lines SGS in the block BK. The switches SSW0 and SSW1 respectively correspond to the source side select gate lines SGS0 and SGS1 on a one-to-one basis.

One ends of the switches SSW0 and SSW1 are respectively connected to the source side select gate lines SGS0 and SGS1. The other ends of the switches SSW0 and SSW1 are respectively connected to wirings SGSI0 and SGSI1.

Control terminals of the switches SSW0 and SSW1 are connected to the selection signal line 90 of the address decoder 120. Turning-on and turning-off of the switches SSW0 and SSW1 are controlled based on the signal DEC.

The source side select gate line switch unit 293 includes a plurality of switches (non-selection switches) USSW0 and USSW1. The number of switches USSW0 and USSW1 is the same as the number (for example, two) of source side select gate lines SGS in the block BK. The switches USSW respectively correspond to the source side select gate lines SGS on a one-to-one basis.

One ends of the switches USSW0 and USSW1 are respectively connected to the source side select gate lines SGS0 and SGS1. The other ends of the switches USSW0 and USSW1 are connected in common to wirings USGSI.

Control terminals of the switches USSW are connected to the selection signal line 90z. Turning-on and turning-off of the switches USSW are controlled based on the signal bDEC.

If the switches SSW are turned on, and the switches USSW are turned off, based on the signals DEC and bDEC, the turned-on switches SSW allow voltage applied to the wirings SGSI according to operations of the flash memory and selection addresses to be transmitted to the source side select gate lines SGS. In contrast, if the switches SSW are turned off, and the switches USSW are turned on, the turned-on switches USSW allow a voltage applied to the wiring USGSI to be transmitted to the source side select gate lines SGS.

In the flash memory 1 of the present embodiment, the block BK includes the intermediate select gate lines SGM. Switches (selection switches) MSW0 and MSW1 correspond to the intermediate select gate lines SGM0 and SGM1, and switches (non-selection switches) UMSW0 and UMSW1 respectively correspond to the intermediate select gate lines SGM0 and SGM1.

The number of switches MSW and the number of switches UMSW are selected according to the number of the intermediate select gate lines SGM in a single block BK. As in the example illustrated in FIG. 3, if two intermediate select gate lines SGM are provided in a single block BK, the number of switches MSW is two, and the number of switches UMSW is two.

One ends of the switches MSW0 and MSW1 are respectively connected to the intermediate select gate lines SGM0 and SGM1, and the other ends of the switches MSW0 and MSW1 are respectively connected to wirings SGMI0 and SGMI1. Control terminals of the switches MSW are connected to the selection signal line 90. Turning-on and turning-off of the switches MSW are controlled based on the signal DEC.

One ends of the switches UMSW0 and UMSW1 are respectively connected to the intermediate select gate lines SGM0 and SGM1, and the other ends of the switches UMSW0 and UMSW1 are connected to a wiring USGMI. Gates of the switches UMSW are connected to the selection signal line 90z. Turning-on and turning-off of the switches UMSW are controlled based on the signal bDEC.

If the switches MSW are turned on, and the switches UMSW are turned off, based on the signals DEC and bDEC, the turned-on switches MSW allow voltage applied to the wirings SGMI according to operations of the flash memory and selection addresses to be transmitted to the intermediate select gate lines SGM. In contrast, if the switches MSW are turned off, and the switches UMSW are turned on, the turned-on switches UMSW allow a voltage applied to the wiring USGMI to be transmitted to the intermediate select gate lines SGM.

The number of switches in the switch circuit 121 is changed depending on the number of word lines and select gate lines in the block BK.

Structure Example

Figure 5:
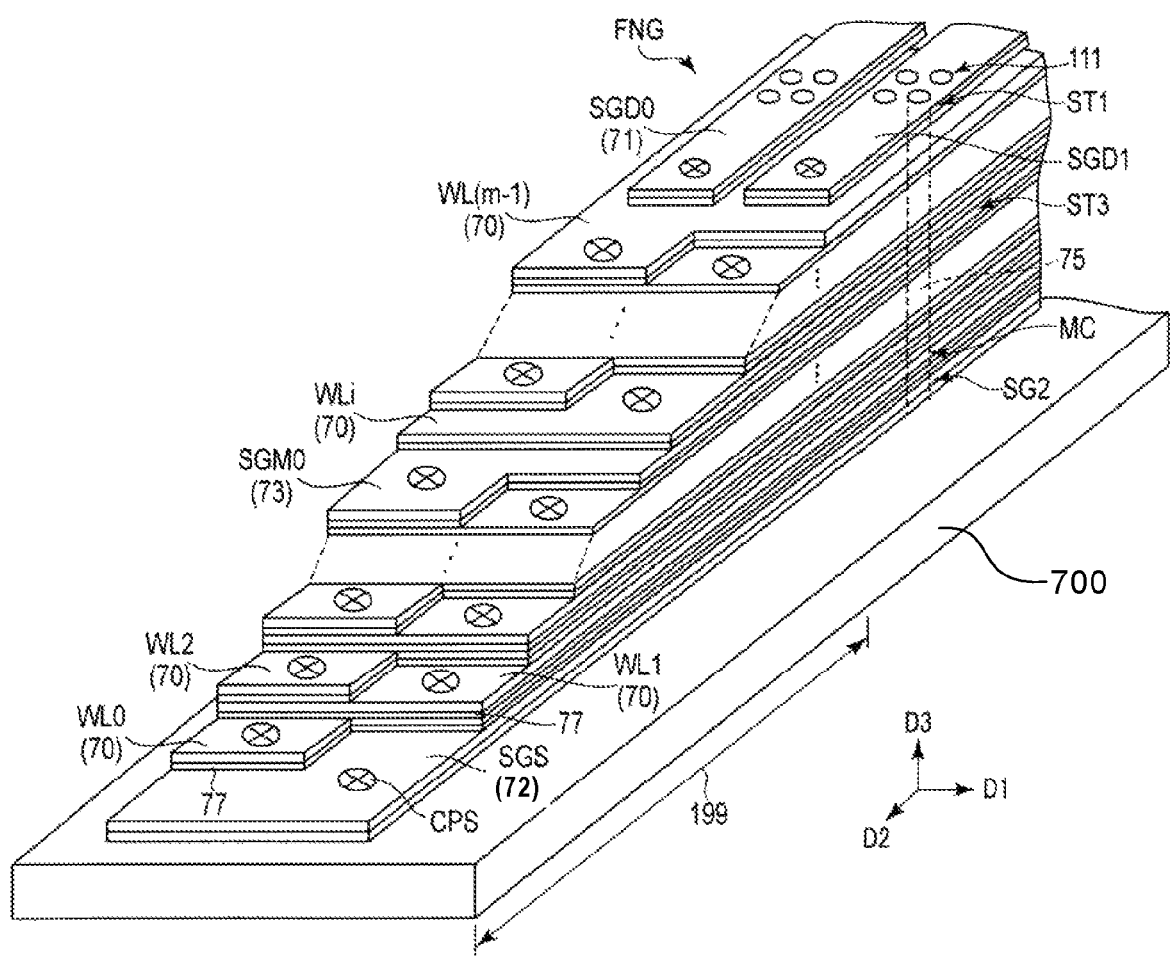
FIG. 5 is a perspective view of the memory cell array of the memory device of the embodiment.
Figure 6:
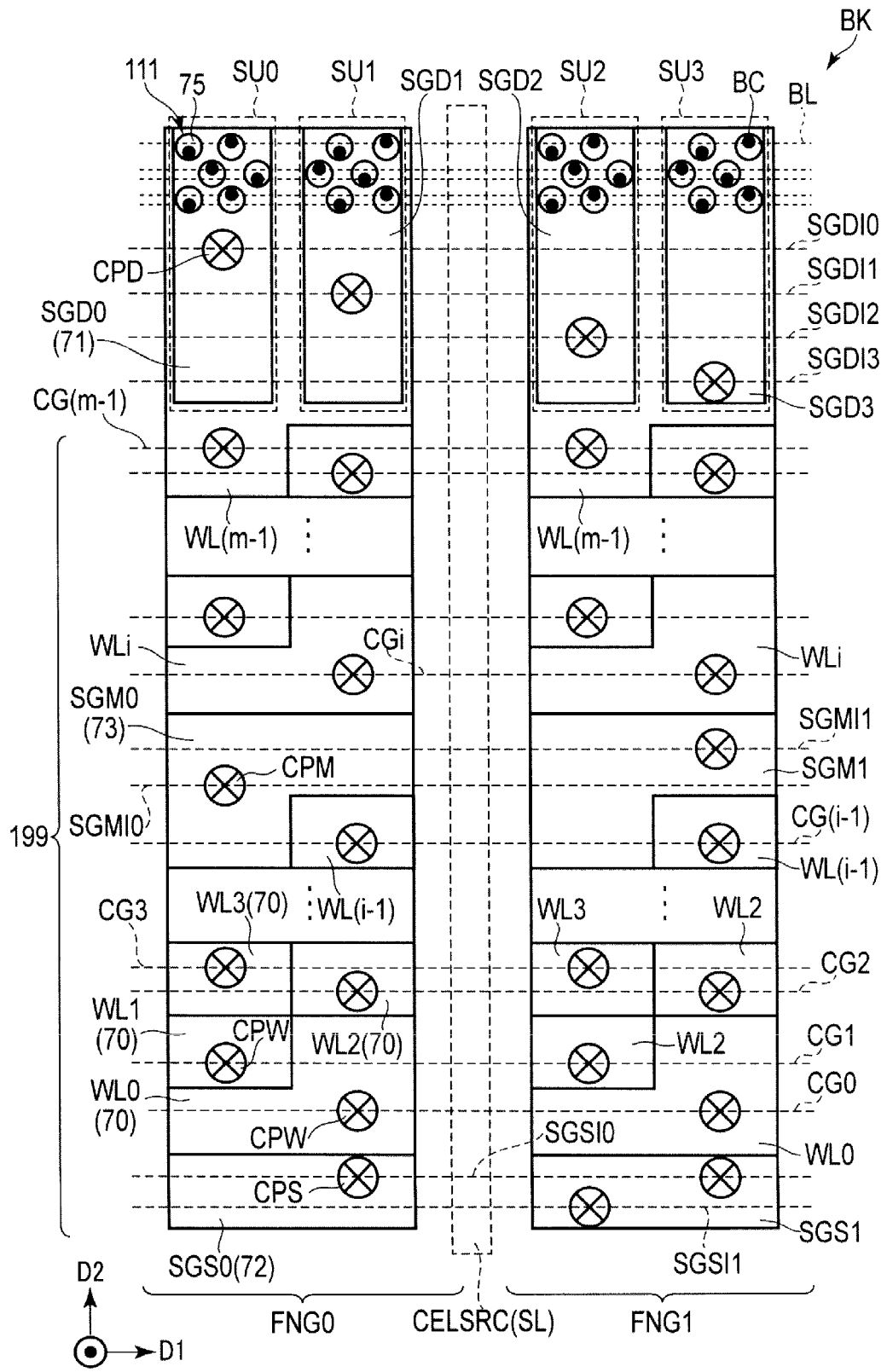
FIG. 6 is a plan view of the memory cell array of the memory device of the embodiment.
Figure 7:
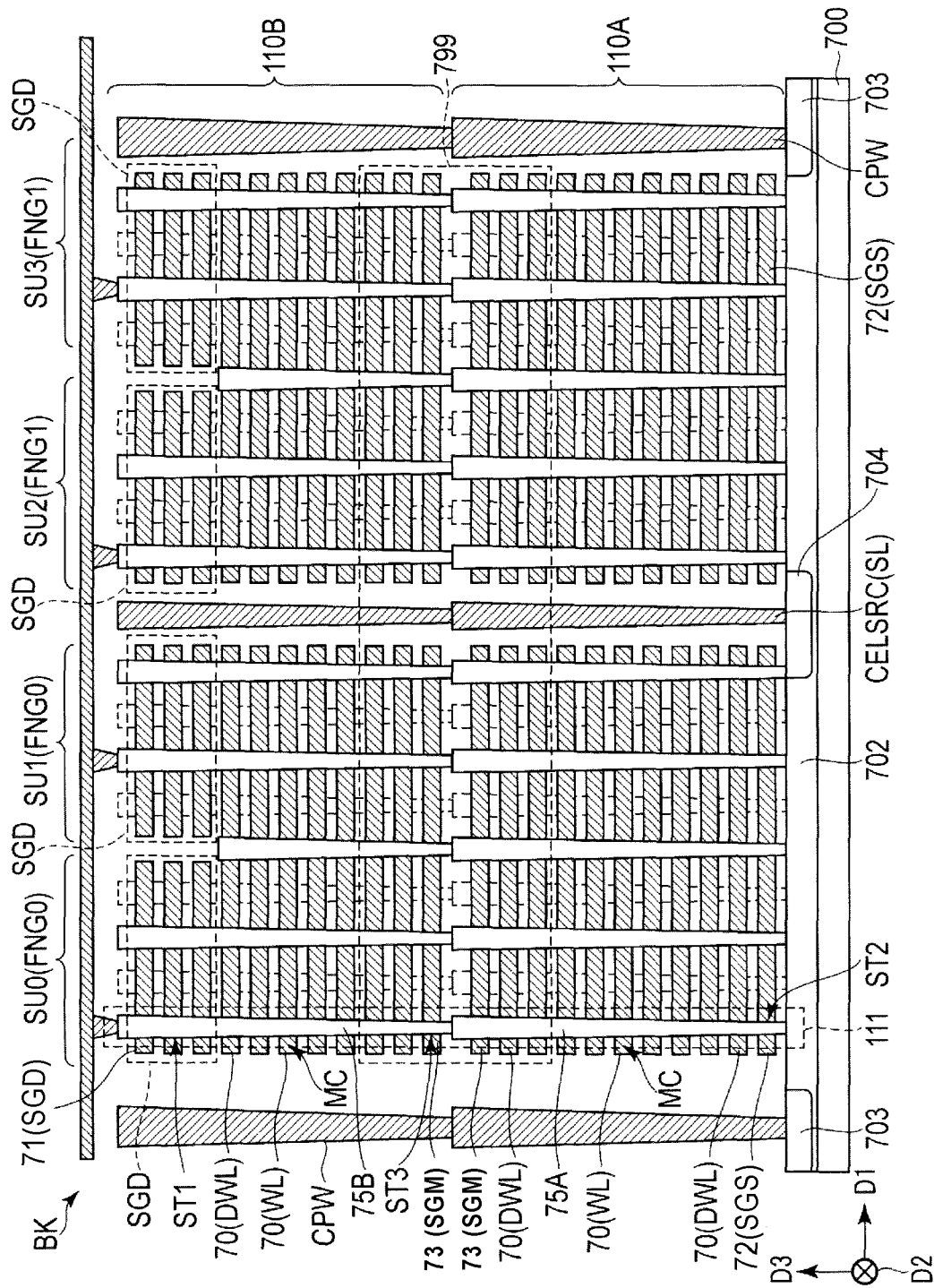
FIG. 7 is a sectional view of the memory cell array of the memory device of the embodiment.

With reference to FIGS. 5 to 7, a description will be given for a structure example of the flash memory of the present embodiment.

FIG. 5 is a perspective view schematically illustrating a structure example of the memory cell array in the flash memory of the present embodiment.

FIG. 5 illustrates an extracted single area FNG (two string units SU) of the two areas FNG in a single block.

As illustrated in FIG. 5, the flash memory of the present embodiment includes the memory cell array 11 having a three-dimensional structure. A plurality of memory cells MC are arranged in a D1 direction and a D2 direction which are parallel to a surface of a substrate 700, and are stacked in a D3 direction which is perpendicular to the surface of the substrate 700. The select gate lines SGD, SGS and SGM and the word lines WL are stacked in the D3 direction.

The word lines WL and the select gate lines SGD, SGS and SGM are configured with conductive layers 70, 71, 72 and 73.

Insulating layers 77 are provided between the stacked conductive layers 70, 71, 72 and 73. Consequently, in the stacked conductive layers 70, 71, 72 and 73, a certain conductive layer is electrically separated from an underlying or an overlying conductive layer.

Semiconductor pillars 75 are provided in the stacked select gate lines SGD (71), SGS (72) and SGM (73), and the word lines WL (70). The semiconductor pillars 75 are columnar semiconductor layers extending in the D3 direction.

The memory cells MC and the select transistors ST1, ST2 and ST3 are provided on side surfaces of the semiconductor pillars 75. More specific structures of the memory cells MC and the select transistors ST1, ST2 and ST3 will be described later.

The select gate lines SGD, SGS and SGM and the word lines WL are extracted in the D2 direction in a region 199 on one end side of the memory cell array 11. The region 199 in which the select gate lines SGD, SGS and SGM and the word lines WL are extracted will be referred to as an extraction region (or a hookup region). The extraction region 199 is provided on one end side of the memory cell array 11.

A stacked structure including the wirings WL, SGD, SGS and SGM has a stepped shape in the extraction region 199. Consequently, upper surfaces of the respective wirings are exposed at ends of the wirings WL, SGD, SGS and SGM in the extension direction (D2 direction), and thus regions (hereinafter, referred to as contact regions) in which contact plugs CP are disposed are secured on the upper surfaces of the respective wirings.

The source side select gate lines SGS (conductive layers 72) are provided under the stacked structure. The drain side select gate lines SGD (conductive layers 71) are provided on an upper side in the stacked structure. The plurality of word lines WL are provided between the drain side select gate lines SGD and the source side select gate lines SGS in the D3 direction.

In the present embodiment, the intermediate select gate lines SGM are provided between the drain side select gate lines SGD and the source side select gate lines SGS in the D3 direction. The intermediate select gate lines SGM are interposed between the word lines WL (or the dummy word lines) in the D3 direction.

The plurality of word lines WL (conductive layers 70) are divided into two groups with the intermediate select gate lines as boundaries. A plurality of word lines WL between the intermediate select gate lines SGM and the source side select gate lines SGS are included in a first group. A plurality of word lines WL between the intermediate select gate lines SGM and the drain side select gate lines SGD are included in a second group.

FIG. 6 is a top view schematically illustrating a structure example of the memory cell array in the flash memory of the present embodiment. FIG. 6 illustrates layouts of the respective wirings in the extraction region 199. FIG. 6 illustrates two areas FNG0 and FNG1 in the block BK. In FIG. 6, wirings (dashed lines in the figure) CG, SGDI, SGSI and SGMI for applying voltages to a selected block are illustrated, wirings for applying voltages to a non-selected block are not illustrated.

As illustrated in FIG. 6, plugs CPS (CPS0 and CPS1) are provided on the contact region of the source side select gate lines SGS. The source side select gate lines SGS of the areas FNG0 and FNG1 are connected to different wirings SGSI as described above.

A plug CPW is provided on the contact region of each of the word lines WL.

The contact regions of the even-numbered word lines WL and the contact regions of the odd-numbered word lines WL are arranged in the D1 direction above the source side select gate lines SGS. However, positions (heights from the surface of the substrate 700) of the contact regions of the even-numbered word lines WL in the D3 direction are different from positions of the contact regions of the odd-numbered word lines in the D3 direction.

As mentioned above, with respect to two stacked wirings, two contact regions are adjacent to each other in the D1 direction intersecting the D2 direction, and thus a size of the extraction region in the D2 direction is reduced.

Regarding the respective word lines WL, even if the word lines are included in different areas FNG, the word lines (word lines having the same wiring level) WL having the same address number are connected to the common wiring CG.

Plugs CPM (CPM0 and CPM1) are provided in the contact regions of the intermediate select gate lines SGM. In the areas FNG0 and FNG1, the intermediate select gate lines SGM are connected to different wirings SGMI via the plugs CPM.

Also regarding the word lines WL(i) to WL(m−1) above the intermediate select gate lines SGM, plugs CPW are provided on the contact regions of the word lines WL in the same layouts as those of the word lines WL below the intermediate select gate lines SGM.

The drain side select gate lines SGD are provided above the intermediate select gate lines SGM and the word lines WL.

The drain side select gate lines SGD are separated for each of the string units SU. If a single block BK includes four string units SU, two drain side select gate lines SGM are provided in each area FNG. Plugs CPD are provided on the contact regions of the respective drain side select gate lines SGD. The drain side select gate lines SGM0 to SGM3 are respectively connected to different wirings SGMI0 SGMI3 via the plugs CPD.

For example, dummy wirings (dummy word lines) may be provided in the memory cell array. The dummy word lines are adjacent to the select gate lines SGD, SGS and SGM in the D3 direction. Contact regions of the dummy word lines have the same layout as the layout of the contact regions of the word lines WL. The respective dummy word lines are connected to the common wiring CG in a plurality of areas FNG and a plurality of string units SU in the same manner as in the connection relationship between the word lines WL and the wiring CG. However, in dummy word lines adjacent to the intermediate select gate lines SGM, potentials of the dummy word lines may be controlled in the same manner as in control of potentials of the intermediate select gate lines SGM. In this case, the dummy word lines are connected to wirings in a relationship similar to the connection relationship between the intermediate select gate lines SGM and the wirings SGMI.

Bit line contacts BC are provided on the semiconductor pillars 75. The bit line contacts BC are connected to bit lines BL.

Two NAND strings 111 adjacent to each other in the D1 direction are connected to different bit lines BL. In this case, two bit line contacts BC adjacent to each other are not arranged on the same straight line which is parallel to the D1 direction in a D1-D2 plane. In a plurality of NAND strings 111 arranged in the D1 direction, positions of the bit line contacts BC are alternately deviated in the D2 direction. A plurality of NAND strings 111 arranged in an inclined direction are connected to different bit lines BL.

FIG. 7 is a schematic sectional view for explaining the entire configuration of the block in the memory cell array of the flash memory of the present embodiment.

As illustrated in FIG. 7, in the memory cell array 11, the block BK is provided on a p-type well region 702 inside the semiconductor substrate (for example, a Si substrate or a semiconductor layer on an insulating layer) 700.

For example, the NAND string 111 in the block BK is provided in a region surrounded by well contacts CPW. The well contacts CPW are provided on p$^+$-type diffusion layers 703 in the p-type well region 702. A source line contact CELSRC is provided on an n$^+$-type diffusion layer 704 in the p-type well region 702 between the two areas FNG. The source line contact CELSRC is connected to the source line SL. Each of the contact CPW and CELSRC has a structure in which two plugs are stacked in the D3 direction.

In the flash memory 1 of the present embodiment, the block BK includes a plurality of array layers (memory stages) 110A and 110B. In FIG. 7, in each area FNG, two array layers 110A and 110B are stacked in the D3 direction. The array layer 110A (hereinafter, referred to as a lower array layer) on the lower side includes a plurality of semiconductor pillars (hereinafter, referred to as lower semiconductor pillars) 75A. The array layer 110B (hereinafter, referred to as an upper array layer) on the upper side includes a plurality of semiconductor pillars (hereinafter, referred to as upper semiconductor pillars) 75B. The semiconductor pillars 75A and 75B extend substantially in a vertical direction (D3 direction) with respect to the surface of the p-type well region 702 (substrate). The semiconductor pillars 75A and 75B are arranged in an array form in the respective array layers 110A and 110B along the D1 direction and the D2 direction.

Each of the NAND strings 111 is provided on the p-type well region 702 so as to encompass the two array layers 110A and 110B. The NAND string 111 includes two semiconductor pillars 75A and 75B. The lower semiconductor pillar 75A is provided on the upper semiconductor pillar 75B. A lower end of the semiconductor pillar 75A is connected to the p-type well region 702. An upper end of the semiconductor pillar 75A is connected to a lower end of the semiconductor pillar 75B. The bit line BL are provided above the upper ends of the semiconductor pillars 75B via the bit line contacts BC.

A plurality of conductive layers 70, 71, 72 and 73 are stacked on the p-type well region 702. The respective conductive layers 70, 71, 72 and 73 oppose side surfaces of the semiconductor pillars 75 via memory films (not illustrated).

A drain side select transistor STD is disposed in a region including the upper semiconductor pillar 75B and one or more conductive layers 71. For example, a plurality of (for example, three) stacked conductive layers 71 serve as a gate electrode of the select transistor STD. The plurality of stacked conductive layers 71 function as the drain side select gate lines SGD.

In the area FNG, the conductive layers 71 are provided in each of the string units SU. Consequently, potentials of the drain side select gate lines SGD are separately controlled in the two string units SU in the area FNG.

A source side select transistor STS is disposed in a region including the lower semiconductor pillar 75A and one or more conductive layers 72. The conductive layers 72 serve as a gate electrode of the source side select transistor STS. The conductive layers 72 function as the source side select gate lines SGS.

For example, in a single area FNG, the conductive layer 72 as the source side select gate line SGS is used in common to two string units SU. Consequently, a potential of the source side select gate line SGS is controlled in common in two string units SU in the area FNG.

The memory cells MC are disposed in a region including the semiconductor pillars 75A and 75B and the conductive layers 70. The conductive layers 70 serve as control gate electrodes of the memory cells MC. A single conductive layer 70 functions as a single word line WL. In the area FNG, the conductive layers 70 as the word lines WL are used in common to two string units SU. The conductive layers 70 may be used in common to four string units SU in the two areas FNG.

The intermediate select gate line SGM and the intermediate select transistor ST3 are provided in a region near a boundary (hereinafter, a boundary region) 799 between the two array layers 110A and 110B. For example, the boundary region 799 includes at least a first conductive layer of the lower array layer 110A and a first conductive layer of the upper array layer 110B when counted from a junction between the two semiconductor pillars 75A and 75B. In the example illustrated in FIG. 7, the boundary region 799 includes three conductive layers of the lower array layer 110A and three conductive layers of the upper array layer 110B centering on the junction between the two semiconductor pillars 75A and 75B.

In the example illustrated in FIG. 7, a plurality of intermediate select gate lines SGM are provided in the string unit SU. The conductive layer 73 of the upper array layer 110B and the conductive layer 73 of the lower array layer 110A are provided as the intermediate select gate lines SGM. In each area FNG, the conductive layers 73 are used in common to two string units SU.

The intermediate select transistor ST3 is disposed in a region including the semiconductor pillars 75A and 75B, and the conductive layers 73. The conductive layers 73 function as the intermediate select gate lines SGM, and also function as a gate electrode of the intermediate select transistor ST3.

Figure 8:
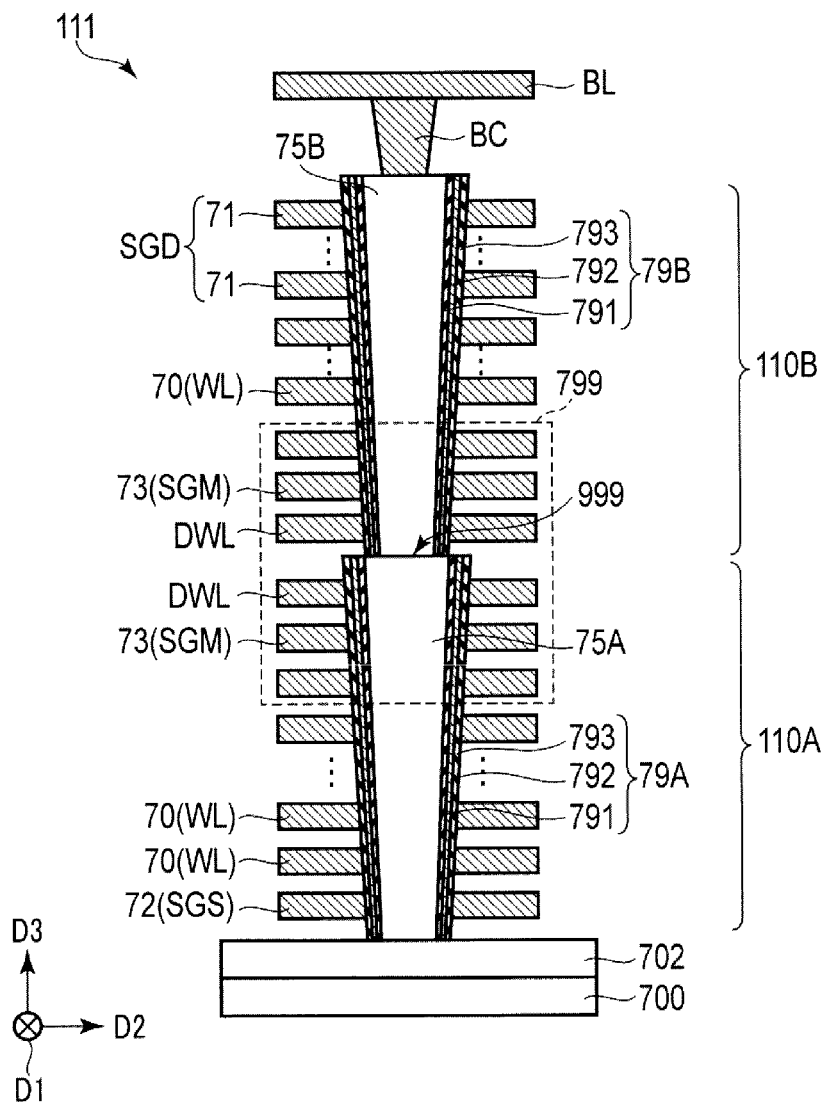
FIG. 8 is a sectional view of a memory string in the memory cell array of the memory device of the embodiment.

FIG. 8 is a schematic sectional view for explaining a structure example of the NAND string. FIG. 8 illustrates an extracted single NAND string.

As illustrated in FIG. 8, in the NAND string 111, the memory cells MC include memory films 79 (79A and 79B) between the semiconductor pillars 75 and the conductive layers (word lines) 70. The memory films 79 cover the side surfaces of the semiconductor pillars 75.

The memory film 79A is continued on the side surface of the semiconductor pillar 75A from the upper end of the semiconductor pillar 75A to the lower end thereof. The memory film 79B is continued on the side surface of the semiconductor pillar 75B from the upper end of the semiconductor pillar 75B to the lower end thereof. The memory film 79A is separated from the memory film 79B.

The memory films 79 have a stacked structure. Each of the memory films 79 includes a gate insulating film 791, a charge storage layer 792, and a block insulating film 793.

The gate insulating film (tunnel insulating film) 791 is provided on the side surface of the semiconductor pillar 75. The charge storage layer 792 is provided between the gate insulating film 791 and the block insulating film 793. The charge storage layer 792 includes an insulating film (for example, a SiN film) having a trap level. The charge storage layer 792 may include a semiconductor film (for example, a silicon film). If the charge storage layer 792 includes the semiconductor film, the semiconductor film is separately formed for each memory cell MC. The block insulating film 793 is provided between the charge storage layer 792 and the conductive layer 70.

The memory film 79 is also provided between the gate electrodes (the conductive layers 71, 72 and 73) of the select transistors ST1, ST2 and ST3, and the semiconductor pillar 75.

The semiconductor pillars 75A and 75B serve as channel regions of the memory cells MC. The semiconductor pillars 75A and 75B contain amorphous silicon or polysilicon. For example, the semiconductor pillar 75 may include a columnar insulator (for example, silicon oxide) and a semiconductor region 751 covering a side surface of the columnar insulator.

For example, as illustrated in FIG. 8, the semiconductor pillars 75A and 75B may have a tapered sectional shape upon manufacturing of the memory cell array. In this case, a dimension (diameter) of the lower part of the semiconductor pillar 75 in the D2 direction (and the D1 direction) is smaller than a dimension of the upper part of the semiconductor pillar 75 in the D2 direction.

As in the example illustrated in FIG. 8, the conductive layer (at least one of the lowermost conductive layer of the upper array layer and the uppermost conductive layer of the lower array layer) adjacent to the junction 999 may be used as a dummy word line DWL. In this case, a conductive layer directly on the dummy word line DWL or a conductive layer directly under the dummy word line DWL is used as the intermediate select gate line SGM.

Figure 9:
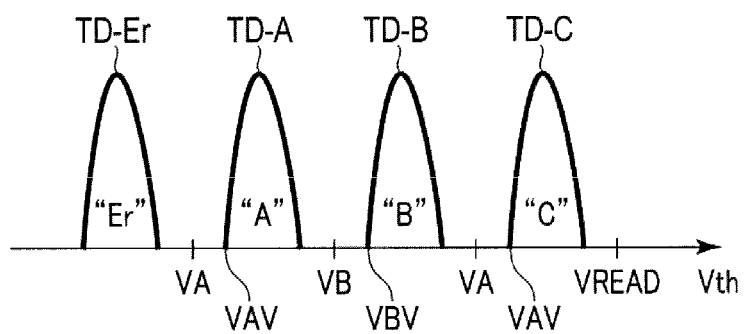
FIG. 9 is a diagram illustrating a relationship between threshold voltage of the memory cell and data.

FIG. 9 is a diagram for explaining a relationship between threshold voltage of the memory cell and data which can be stored. As illustrated in FIG. 9, if the memory cell MC stores data of 2 bits ("11", "10", "01", and "00"), a threshold voltage of a plurality of memory cells MC in the memory cell array (a block or a page) may have four threshold voltage value distributions (states or levels) TD-Er, TD-A, TD-B, and TD-C so as to correspond to 2-bit (four-valued) data.

The Er level corresponds to an erasing state. The A level, the B level, and the C level correspond to a data storing state (holding state). When data is stored, a threshold voltage of the memory cell MC is included in any one of threshold voltage value distributions TD-A, TD-B and TD-C of the A level, the B level, and the C level. Consequently, the memory cell MC stores 2-bit data.

Determination levels (determination voltages) VA, VB, and VC for reading data are set among the threshold voltage value distributions. Consequently, when data is read from the memory cell MC, data held in the memory cell MC is determined. For example, if the memory cell stores 2-bit data, the levels VA, VB, and VC are used as determination levels (hereinafter, also referred to as reading levels) for reading data.

A reading pass voltage VREAD has a voltage value higher than an upper limit voltage value of the highest threshold voltage value distribution (here, the C level) among the plurality of threshold voltage value distributions which can be taken by the memory cell MC. The memory cell MC to which the reading pass voltage VREAD is applied is turned on regardless of stored data.

Determination levels (hereinafter, also referred to as verification levels) for verifying writing of data are set around lower limit voltage values of the respective threshold voltage value distributions. Consequently, when data is written into the memory cell MC, whether or not the memory cell MC reaches a threshold voltage value distribution corresponding to data to be written is determined. Levels VAV, VBV and VCV are respectively set in the threshold voltage value distributions TD-A, TD-B and TD-C as the verification levels. Other levels for determining states of threshold voltages of the memory cell may be provided between the reading levels and the verification levels as the verification levels.

During a read operation of the flash memory 1, a reading voltage having at least one of the plurality of reading levels is applied to the memory cell. During an operation of verifying a write operation of the flash memory 1, a verification voltage having at least one of the plurality of verification levels is applied to the memory cell. Consequently, determines whether or not the memory cell MC is turned on is detected in the read operation and the verification operation. As a result, a state of data stored in the memory cell or a threshold voltage of the memory cell during writing of data is determined.

Data stored in the memory cell MC is not limited to 2-bit data, and a single memory cell MC may store 1-bit data. A single memory cell MC may store data of 3 or more bits.

In the present embodiment, the structure, operation, and manufacturing method of the memory cell array having the three-dimensional structure are as disclosed in, for example, U.S. patent application Ser. No. 12/407,403, filed on Mar. 19, 2009, entitled "three-dimensional stacked nonvolatile semiconductor memory," U.S. patent application Ser. No. 12/406,524, filed on Mar. 18, 2009, entitled "three-dimensional stacked nonvolatile semiconductor memory," U.S. patent application Ser. No. 12/679,991, filed on Mar. 25, 2010, entitled "nonvolatile semiconductor memory device and manufacturing method thereof," and U.S. patent application Ser. No. 12/532,030, filed on Mar. 23, 2009, entitled "semiconductor memory and manufacturing method thereof." All of these patent applications are incorporated by reference herein.

Figure 10A:
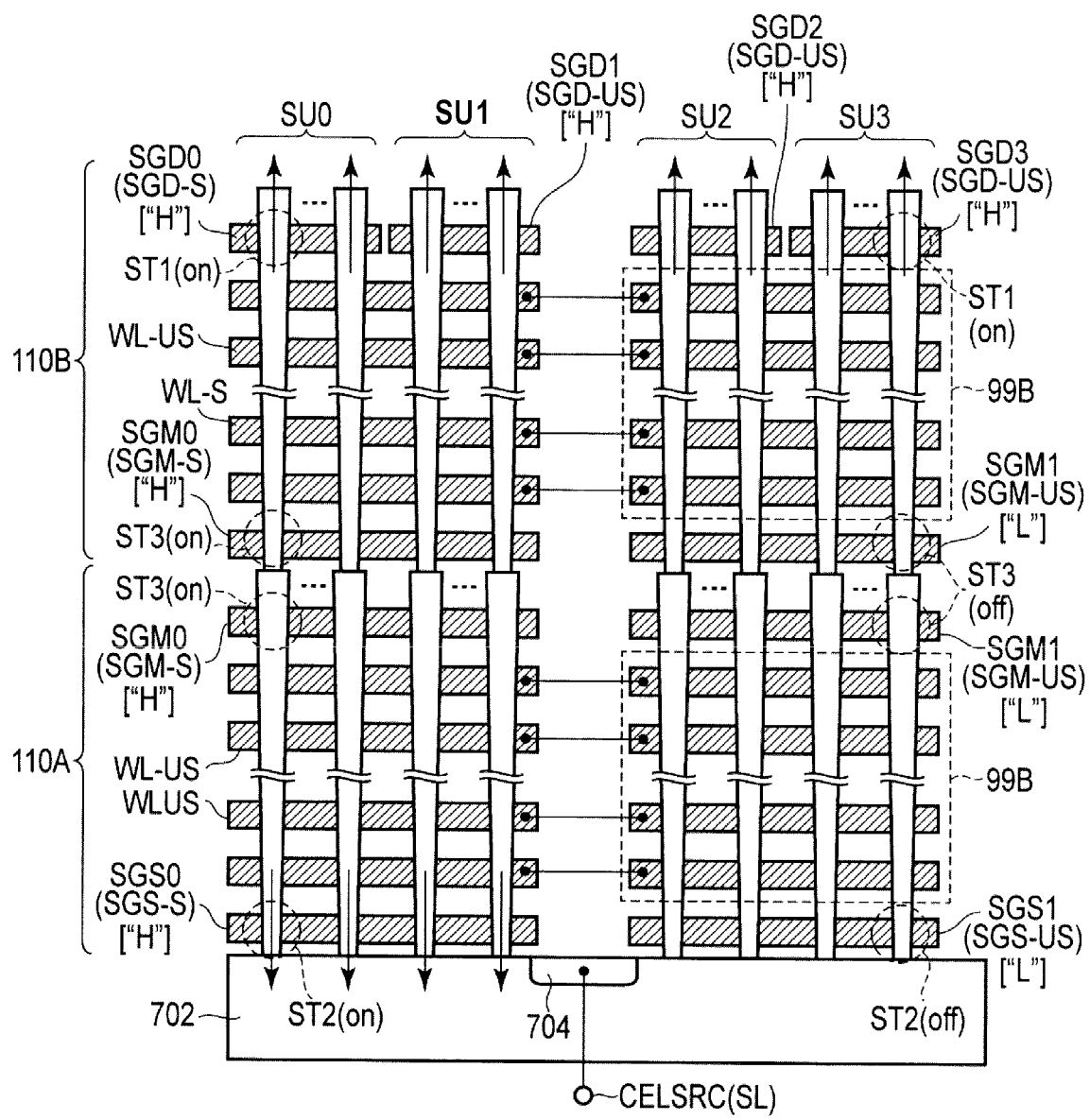
FIG. 10A is a schematic diagram of a first example for explaining a release process carried out in the memory device of the embodiment.
Figure 10B:
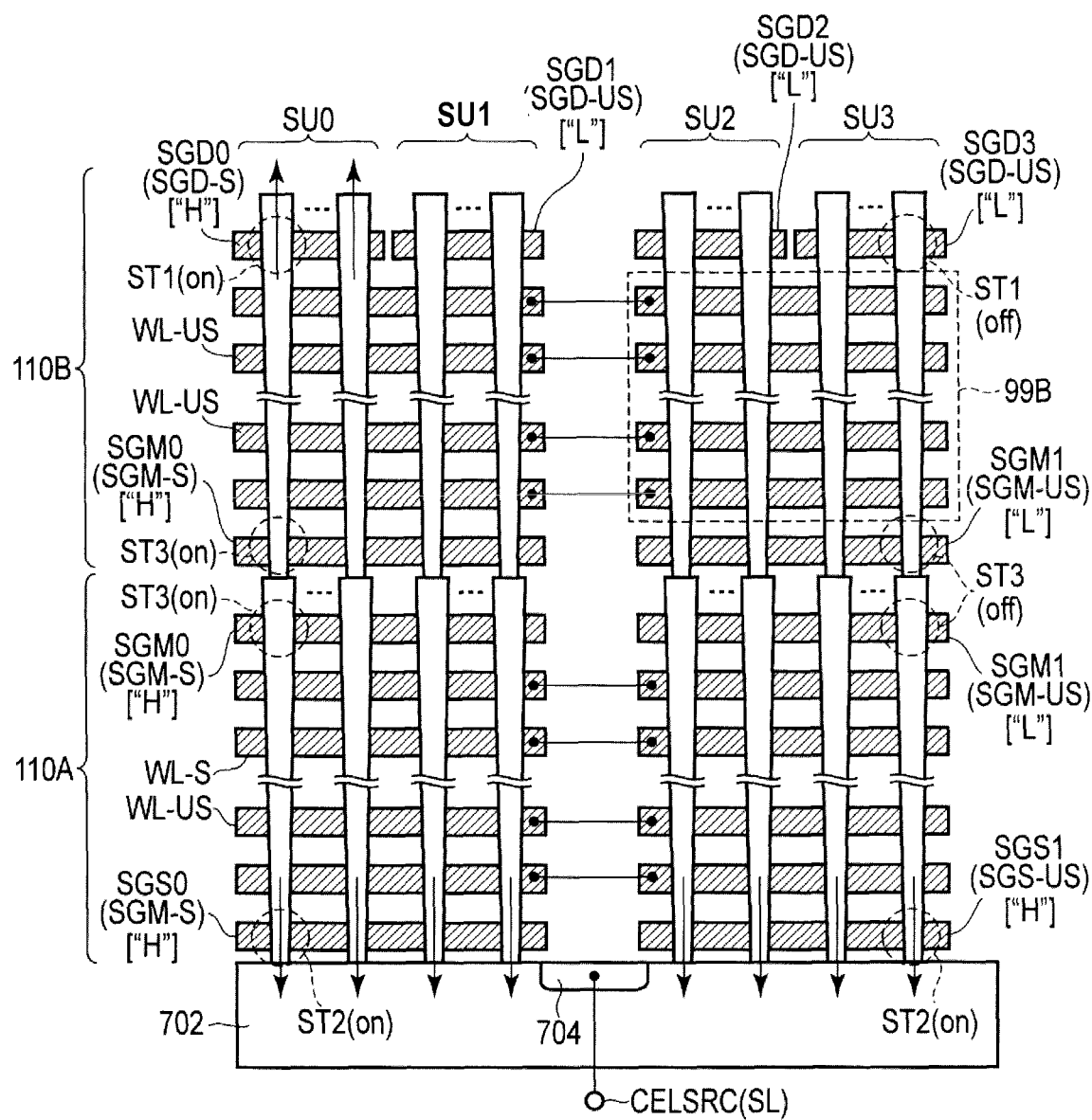
FIG. 10B is a schematic diagram of a second example for explaining a release process carried out in the memory device of the embodiment.

FIGS. 10A and 10B are diagrams for explaining the flash memory of the present embodiment. FIGS. 10A and 10B are diagrams schematically illustrating an operation of the flash memory of the present embodiment. In FIGS. 10A and 10B, for clarity in illustration, the bit lines and the source lines are not illustrated. In the following description, a reference sign of a drain side select gate line (selected drain side select gate line) of a selected string unit including selected cells based on selection addresses uses "SGD-S", and a reference sign of a source side select gate line (selected source side select gate line) of a selected string unit including selected cells based on selection addresses uses "SGS-S". A reference sign of a drain side select gate line (non-selected drain side select gate line) of a non-selected string unit including selected cells based on selection addresses uses "SGD-US", and a reference sign of a source side select gate line (non-selected source side select gate line) of a non-selected string unit including selected cells based on selection addresses uses "SGS-US".

Regarding the intermediate select gate line SGM, a reference sign of a selected intermediate select gate line uses "SGM-S", and a reference sign of a non-selected intermediate select gate line uses "SGM-US".

A reference sign of a selected word line uses "WL-S", and a reference sign of a non-selected word line uses "WL-US".

As described above, the flash memory of the present embodiment includes the intermediate select gate lines SGM and the intermediate select transistors ST3 in the NAND string 111. Consequently, the flash memory of the present embodiment can electrically separate at least a part of one of the lower array layer 110A and the upper array layer 110B from the bit line BL and the source line SL (CELSRC) according to an operation of the memory.

During a read operation (or a verification operation) of the flash memory, electric charge (hereinafter, referred to as residual electric charge) remaining in the semiconductor pillar may be injected into the charge storage layer due to a voltage being applied to the word line. Thus, there is a probability that reading disturbance may occur in the memory cell.

In order to reduce reading disturbance, a process (hereinafter, referred to as a release process) of releasing the residual electric charge in the semiconductor pillar may be performed as an initial operation of the read operation.

In the release process, the semiconductor pillar is electrically connected to at least one of the bit line and the source line. Consequently, the residual electric charge is released from the semiconductor pillar to the bit line or from the semiconductor pillar to the source line.

If the semiconductor pillar is electrically connected to the bit line or the source line during the release process, a capacitance component (parasitic capacitance) is generated in a NAND string of a non-selected string unit due to a potential difference between the word line and the semiconductor pillar when a threshold voltage of the memory cell is determined after the release process. The capacitance component acts as a load during a read operation. Thus, this load may cause an increase in a current (power consumption), the occurrence of noise, deterioration in an operation speed, and the like during a read operation (or a verification operation) of the flash memory.

If a block includes a plurality of array layers in order to increase a memory capacity, the number of memory cells, the number of word lines, and the number of wirings used in common to a plurality of elements in a block are increased, and thus the influence of a load due to a capacitance component further increases.

The flash memory of the present embodiment electrically separates an upper array layer and a lower array layer in a non-selected string unit from each other by controlling a potential of the intermediate select gate line SGM during a read operation (or a verification operation). Consequently, the flash memory of the present embodiment performs a release process on residual electric charge in the semiconductor pillar in a memory stage including a selected word line in a non-selected string unit.

Along with the electric charge release process, in the flash memory of the present embodiment, in the non-selected string unit SU, an array layer not including the selected word line is electrically separated from the bit line and the source line by turning off the select transistor ST3. As a result, the flash memory of the present embodiment can perform channel-boosting on the semiconductor pillar in an array layer not including a selected word line in a non-selected string unit.

FIG. 10A is a diagram schematically illustrating a conduction state between respective members in a block if there is a selected word line in the upper array layer 110B. FIG. 10A illustrates a relationship between potentials during a release process before data is read.

In FIG. 10A, the drain side select gate line SGD0 corresponds to a selected drain side select gate line SGD-S based on a selection address, and the source side select gate line SGS0 corresponds to a selected source side select gate line SGS-S based on a selection address.

In FIG. 10A, a voltage having an "H" level (transistor turning-on voltage) is applied to the respective select gate lines SGD-S, SGS-S and SGM-S of the selected string unit SU0. Consequently, in the selected string unit, the semiconductor pillars of each NAND string are electrically connected to the bit line and the source line.

When a threshold voltage of the memory cell is determined after a release process during a read operation or a verification operation, a non-selected string unit is a string unit in which at least a drain side select gate line is disabled among a plurality of select gate lines in a string unit. In the non-selected string unit, a turning-off voltage of the select transistor ST1 is applied to the drain side select gate line SGD during a determination of a threshold voltage of the memory cell. Consequently, the non-selected string unit is electrically separated from the bit line BL.

In the case of FIG. 10A, a voltage having an "H" level is applied to the drain side select gate lines SGD-US in the non-selected string units SU1, SU2 and SU3.

If a voltage having an "L" level (transistor turning-off voltage) is applied to the intermediate select gate lines SGM-US of the non-selected string units, the lower semiconductor pillar 75A of the lower array layer 110A is electrically separated from the bit line BL, the source line SL (CELSRC), and the upper semiconductor pillar 75B of the upper array layer 110B.

However, as illustrated in FIG. 10A, if a select gate line is shared by the string units SU0 and SU1 adjacent to each other as in the source side select gate line SGS and the intermediate select gate line SGM, potentials of the shared select gate lines SGS and SGM are the same as each other in the non-selected string unit SU1 and the selected string unit SU0. Therefore, in the non-selected string unit SU1, the select transistors ST2 and ST3 are turned on, and thus the lower semiconductor pillar 75A is electrically connected to the upper semiconductor pillar 75B and the source line SL (CELSRC).

In this case, an electric charge release process is performed on the semiconductor pillar 75B in the upper array layer 110B including the selected word line WL-S in the non-selected string unit along with the semiconductor pillars 75A and 75B of the selected string unit. As a result, the flash memory of the present embodiment can reduce reading disturbance caused by hot electrons.

During a determination of a threshold voltage of the memory cell, the reading pass voltage VREAD is applied to the word line WL, and thus the semiconductor pillar 75A in a portion 99A of the lower array layer 110A is subject to channel boosting. Consequently, a capacitance component between the word line WL and the semiconductor pillar 75A is not generated in the lower array layer 110A of the non-selected string unit. As a result, the flash memory 1 of the present embodiment can reduce a load caused by a capacitance component.

FIG. 10B is a diagram schematically illustrating a conduction state between respective members in a block if there is a selected word line in the lower array layer 110A. FIG. 10B illustrates a relationship between potentials during a release process before data is read.

In FIG. 10B, in the same manner as in the example illustrated in FIG. 10A, the drain side select gate line SGD0 and the source side select gate line SGS0 respectively correspond to selected select gate lines SGD-S and SGS-S.

In FIG. 10B, a voltage having an "H" level is applied to the respective select gate lines SGD-S, SGS-S and SGM-S of the selected string unit. In a non-selected string unit, a voltage having an "H" level is applied to the non-selected source side select gate line SGS-US, and a voltage having an "L" level is applied to the non-selected drain side select gate line SGD-US. A voltage having an "L" level is applied to the intermediate select gate line SGM of the non-selected string unit. Consequently, in the non-selected string unit, the intermediate select transistors ST3 are turned off, and thus the upper semiconductor pillar 75B is electrically separated from the bit line BL, the lower semiconductor pillar 75A, and the source line SL.

As illustrated in FIG. 10B, in the non-selected string unit SU1 which shares the select gate lines SGS and SGM with the selected string unit SU0, the select transistors ST2 and ST3 of the non-selected string unit SU1 are turned on, and thus the semiconductor pillars 75A and 75B are connected to the source line SL (CELSRC).

In this case, an electric charge release process is performed on the lower semiconductor pillar 75A in the lower array layer 110A including the selected word line in the non-selected string unit along with the semiconductor pillars 75A and 75B of the selected string unit. As a result, the flash memory of the present embodiment can reduce reading disturbance caused by hot electrons.

During a determination of a threshold voltage of the memory cell, the reading pass voltage VREAD is applied to the word line WL, and thus the semiconductor pillar 75B in a portion 99B of the upper array layer 110B is subject to channel boosting. As a result, the flash memory 1 of the present embodiment can reduce a capacitance component between the word line WL and the semiconductor pillar 75B in the non-selected string unit, and can thus reduce a load during a read operation.

As mentioned above, the flash memory of the present embodiment can reduce reading disturbance while reducing the influence of a parasitic capacitance.

Therefore, the flash memory of the present embodiment can improve operation characteristics.

(1b) Operation Examples

With reference to FIGS. 11 to 16, a description will be made of an operation example (control method) of a memory device according to a first embodiment. Here, an operation of the memory device of the present embodiment will be described with reference to FIGS. 1 to 10B as appropriate in addition to FIGS. 11 to 16.

(1b-1) Basic Example

Figure 11:
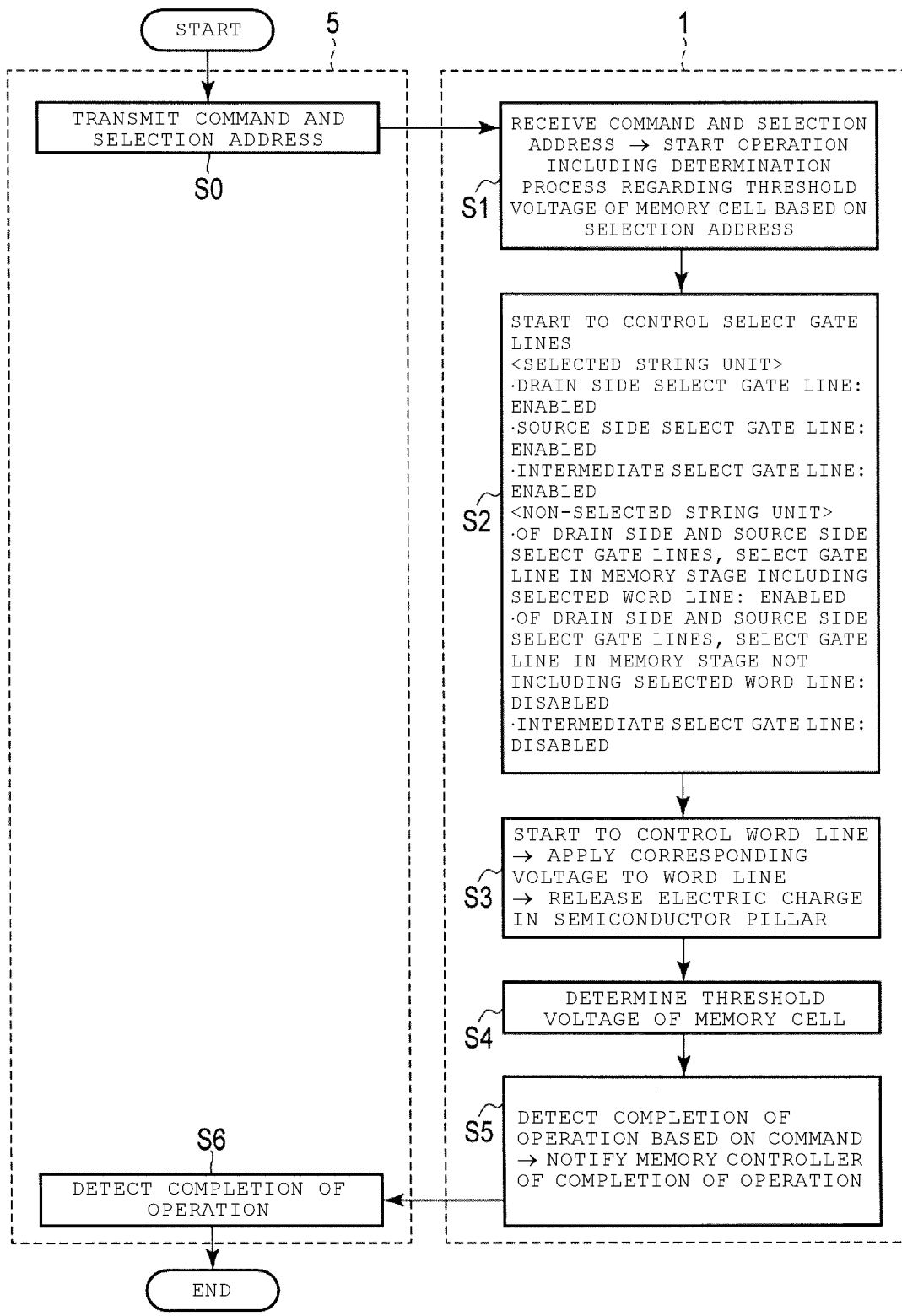
FIG. 11 is a flowchart for explaining an operation example of the memory device of the embodiment.

With reference to FIG. 11, a description will be made for a basic example of an operation of the memory device (for example, a flash memory) of the present embodiment.

In the memory system including the flash memory of the present embodiment, the memory controller 5 transmits commands and addresses (selection addresses) of operation targets to the flash memory 1 (step S0).

The flash memory 1 receives the commands and the selection addresses. Consequently, the flash memory 1 starts an operation based on the commands (step S1). The operation performed by the flash memory includes a determination of a threshold voltage of the memory cell. For example, the determination of a threshold voltage of the memory cell is included in a read operation, or a verification operation in a write operation.

The flash memory 1 selects and enables a block, a string unit, and a page including operation target memory cells.

The flash memory 1 starts control on select gate lines in the selected block (step S2). Consequently, the drain side select gate line SGD, the source side select gate line SGS, and the intermediate select gate lines SGM in the selected string unit SU are enabled. For example, in the selected string unit, a voltage VSG for turning on the select transistors ST1, ST2 and ST3 are applied to the selected select gate lines SGD, SGS and SGM.

In the present embodiment, the flash memory 1 disables the intermediate select gate lines SGM with respect to non-selected string units. The flash memory 1 of the present embodiment enables select gate lines in the array layers 110A and 110B including selected word lines WL of the drain side and source side select gate lines SGD and SGS, and disables select gate lines SGD and SGS in the array layers 110A and 110B not including the selected word lines WL.

As illustrated in FIG. 10A, if the word lines WL in the upper array layer 110B are selected as operation target addresses, the non-selected drain side select gate line SGD is enabled, and the non-selected source side select gate line SGS is disabled. The non-selected intermediate select gate line SGM is disabled. For example, the voltage VSG is applied to the non-selected drain side select gate line SGD, and a voltage (for example, a ground voltage) VSS for turning off the select transistor ST2 is applied to the non-selected source side select gate line SGS.

As illustrated in FIG. 10B, if the word lines WL in the lower array layer 110A are selected as operation target addresses, the non-selected drain side select gate line SGD is disabled, and the non-selected source side select gate line SGS is enabled. The non-selected intermediate select gate line SGM is disabled. For example, the ground voltage VSS for turning off the select transistor ST1 is applied to the non-selected drain side select gate line SGD, and the voltage VSG is applied to the non-selected source side select gate line SGS.

The flash memory 1 controls enabling and disabling of the intermediate select gate lines SGM of each string unit SU and then applies voltages for operating the memory cells to the word lines (step S3).

Consequently, in either one of the lower array layer 110A and the upper array layer 110B in the non-selected string unit, residual electric charge in the semiconductor pillars 75A and 75B is released to the bit line BL or the source line SL via the turned-on memory cell MC and the select transistors. The release process is not performed on the semiconductor pillar which is electrically separated from the bit line BL and the source line SL by turning off the select transistor.

The flash memory 1 determines a threshold voltage of the memory cell connected to the selected word line after performing the electric charge release process (step S4). If a determination of the threshold voltage of the memory cell MC is performed for a read operation, a reading voltage is applied to the selected word line WL.

If a determination of the threshold voltage of the memory cell MC is performed for a verification operation in a write operation, a verification voltage is applied to the selected word line. During the read operation or the verification operation, the reading pass voltage VREAD is applied to word lines (non-selected word lines) other than the selected word line.

Data (a state of a threshold voltage of the memory cell) held in the memory cell is determined based on a turned-on or turned-off result of the memory cell when the reading voltage (or the verification voltage) is applied.

In the present embodiment, in the lower and upper array layers 110A and 110B of the non-selected string unit, the semiconductor pillar in a portion which is electrically separated from other members by the disabled select gate lines SGD, SGS and SGM is in an electrically floating state. Therefore, as in the portion 99A in FIG. 10A or the portion 99B in FIG. 10B, the semiconductor pillar 75 in the electrically separated array layer 110 is subject to channel boosting due to the reading pass voltage VREAD being applied to the non-selected word line, and thus a potential of the semiconductor pillar 75 increases. Consequently, a capacitance component in the portion 99 is reduced.

As a result, a load caused by a capacitance component of a non-selected string unit in a selected block is reduced during an operation of the flash memory.

If an operation including the above-described determination of a threshold voltage of the memory cell is performed one or more times, and then the flash memory 1 detects finishing of an operation based on a command, the flash memory 1 notifies the memory controller 5 of finishing of the operation (step S5). If the operation based on a command is a read operation, the flash memory 1 transmits data to the memory controller 5.

The memory controller 5 is notified of the finishing of the operation by the flash memory 1, and thus detects the finishing of the operation of the flash memory (step S6). If data is transmitted from the flash memory 1 to the memory controller 5, the memory controller 5 receives the data, and transmits the received data to the host device.

Through the above-described operation, the read operation of the flash memory of the present embodiment is completed.

As described above, during an operation of the flash memory, a load caused by a capacitance component between the word line and the semiconductor pillar is reduced.

As a result, the flash memory of the present embodiment can improve operation characteristics.

(b-2) Specific Example

With reference to FIGS. 12 to 16, a specific example of an operation of the flash memory of the present embodiment will be explained.

(b-2-1) Read Operation

Figure 12:
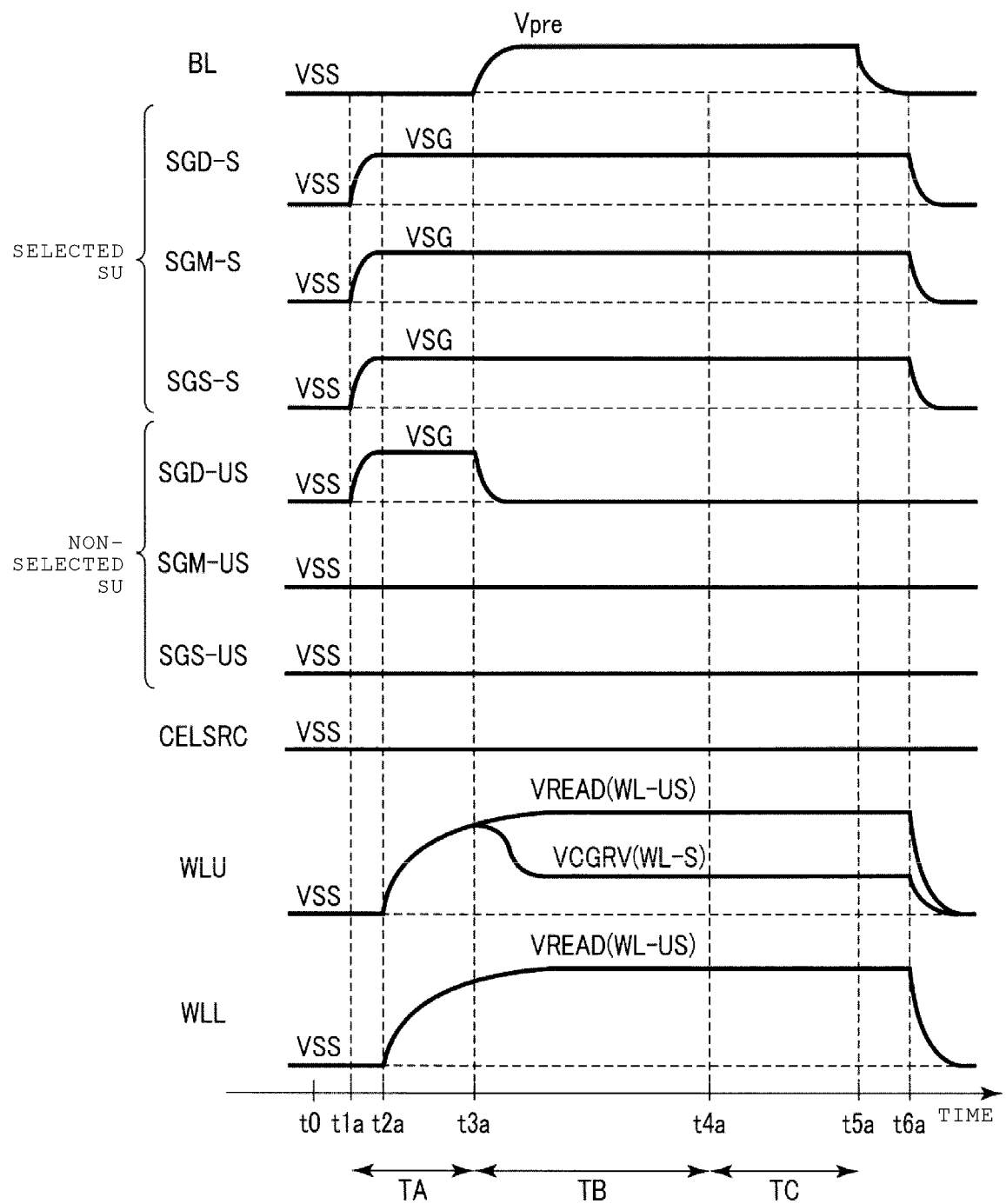
FIGS. 12-16 are each a timing chart illustrating an operation example of a memory device according to a first embodiment.
Figure 13:
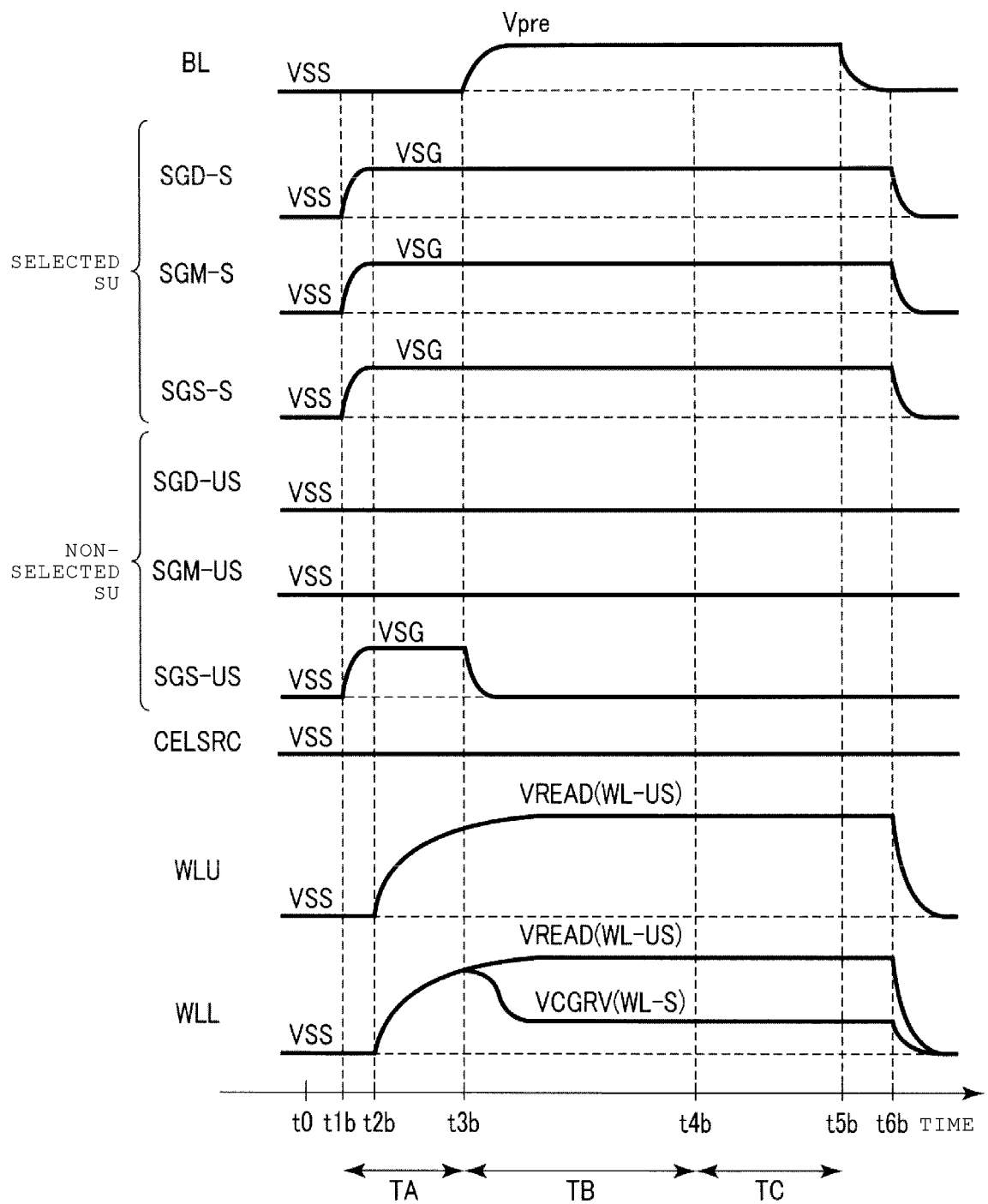

With reference to FIGS. 12 and 13, a read operation of the flash memory of the present embodiment will be explained.

FIGS. 12 and 13 are diagrams illustrating voltage waveforms of the respective wirings during a read operation of the flash memory of the present embodiment.

In the present embodiment, a current sensing method is used as a method of controlling the bit line during the read operation (a process of determining a threshold voltage of the memory cell). In the current sensing method, a state of a threshold voltage of the memory cell is determined by sensing the generation of a bit line current (cell current) according to turning-on or turning-off of the memory cell.

In the present embodiment, a spike operation is employed as a method of controlling the word line during the read operation. In the spike operation, a voltage higher than a reading voltage is applied to a word line (selected word line) indicated by an address and other word lines (non-selected word line), and then a potential of the selected word line is read to be set as a voltage. The spike operation can allow electric charge in the semiconductor pillar to be efficiently released.

Read Operation on Memory Cell of Upper Array Layer

With reference to FIG. 12, a data read operation on the memory cell of the upper array layer will be explained.

Time Point t0

For example, at a time point t0, the memory controller 5 transmits a reading command CMD and a selection address ADR of a data reading target to the flash memory 1 in response to a request from the host device 600.

The flash memory 1 receives the reading command CMD and the selection address ADR. The sequencer 19 starts a read operation based on the reading command CMD.

The sequencer 19 controls each circuit of the flash memory 1 so that the read operation is performed as follows.

At the time point t0, the sequencer 19 causes a signal level of the ready/busy signal R/B to transition from an "H" level to an "L" level. Consequently, the memory controller 5 is notified of starting of the read operation of the flash memory 1.

The voltage generation circuit 18 generates various voltages used for the read operation under the control of the sequencer 19.

Time Point t1a

At a time point t1a, the source line driver 15 applies the ground voltage VSS to the source line SL (CELSRC).

The row control circuit 12 applies the voltage VSG to a selected drain side select gate line SGD-S and a selected source side select gate line SGS-S with respect to a selected string unit SU in a selected block BK. Consequently, the select transistors ST1 and ST2 are turned on.

The bit line BL is electrically connected to the semiconductor pillar 75 via the turned-on select transistor ST1. The source line SL (CELSRC) is electrically connected to the semiconductor pillar 75 via the turned-on select transistor ST2 and the well region 702.

The row control circuit 12 applies the voltage VSG to non-selected drain side select gate lines SGD-US in non-selected string units SU in the selected block BK. The row control circuit 12 applies the ground voltage VSS to non-selected source side select gate lines SGS-US.

Consequently, in the non-selected string units, the select transistors ST1 are turned on, and the select transistors ST2 are turned off.

In the present embodiment, in the selected string unit (for example, the string unit SU0) of the selected block BK, the row control circuit 12 applies the voltage VSG from the driver 129 to the selected intermediate select gate lines SGM-S. Consequently, the intermediate select transistors ST3 are turned on in the selected string unit SU.

In the non-selected string units of the selected block BK, the row control circuit 12 applies the ground voltage VSS to the non-selected intermediate select gate lines SGM-US. Consequently, in the non-selected string units, the intermediate select transistors ST3 are turned off. As a result, in the non-selected string unit, the semiconductor pillar 75A of the lower array layer 110A is electrically separated from the semiconductor pillar 75B of the upper array layer 110B by turning off the intermediate select transistors ST3.

If word lines adjacent to the intermediate select gate lines SGM are used as dummy word lines in the respective string units, respective potentials of the dummy word lines are controlled to be the same as potentials of the adjacent intermediate select gate lines SGM-S and SGM-US.

A time lag occurs from starting of application of a certain voltage to a wiring until a potential of the wiring reaches the voltage due to wiring delay.

Time Point t2a

At a time point t2a, the row control circuit 12 starts to apply the reading pass voltage VREAD to the non-selected word lines WL-US. The row control circuit 12 also starts to apply the reading pass voltage VREAD to the selected word lines WL-S along with the application of the reading pass voltage VREAD to the non-selected word lines WL-US. Potentials of the non-selected word lines WL-US and the selected word lines WL-S increase.

Consequently, during control of potentials of the non-selected word lines WL-US, channels can be formed in memory cells (non-selected cells) connected to the non-selected word lines WL-US, and channels can also be formed in memory cells (selected cells) connected to the selected word lines WL-S.

Electric charge in the semiconductor pillars 75 is released to the bit line BL or the source line SL via the formed channels.

As a result, local electric field concentration around a selected cell can be prevented, and thus the occurrence of erroneous writing on the selected cell and a non-selected cell adjacent to the selected cell can be reduced.

As mentioned above, in the present embodiment, the spike operation on the word lines WL is performed.

Time Point t3a

At a time point t3a, in the sense amplifier circuit 13, the sense amplifier units 131 start to charge the respective bit lines BL under the control of the sequencer 19.

A potential of the selected word line WL-S increases to a reading voltage VCGRV or higher. The row control circuit 12 reduces the potential of the selected word line WL-S to converge on the reading voltage VCGRV. The reading pass voltage VREAD is continuously applied to the non-selected word lines WL-US.

In the non-selected string units, the row control circuit 12 stops application of the voltage to the drain side select gate lines SGD-US. Consequently, potentials of the non-selected drain side select gate lines SGD-US are set to the ground voltage VSS.

In the selected string unit, a potential of the drain side select gate line SGD-S, a potential of the source side select gate line SGS-S, and potentials of the intermediate select gate lines SGM-S are maintained to be the voltage VSG.

In the non-selected string units, potentials of the non-selected intermediate select gate lines SGM-US are maintained to be the ground voltage VSS.

In a period TA from the time point t1a to the time point t3a, the voltage VSG is applied to the non-selected drain side select gate lines SGD-US, and thus the select transistors ST1 connected to the non-selected drain side select gate lines SGD-US are turned on. In the period TA, the upper semiconductor pillars 75B of the non-selected string units are electrically connected to the bit lines BL. Electric charge in the upper semiconductor pillars 75B is released to the bit lines BL via the turned-on select transistors ST1.

On the other hand, in the period TA, the ground voltage VSS is applied to the non-selected intermediate select gate lines SGM-US and the non-selected source side select gate lines SGS-US. Thus, the select transistors ST3 connected to the non-selected intermediate select gate lines SGM-US are turned off, and the select transistors ST2 connected to the non-selected source side select gate lines SGS-US are turned off.

Therefore, the lower semiconductor pillars 75A of the non-selected string units are electrically separated from the bit lines BL and the source line SL (CELSRC) and are thus in an electrically floating state. As a result, the semiconductor pillars 75A in a floating state are subject to channel boosting due to increases in potentials of the non-selected word lines WL-US.

Time Point t4a

After a charging waiting period (development period) TB for the bit line BL elapses, at a time point t4a, a potential of the bit line BL is substantially set to a voltage Vpre with a predetermined magnitude. A potential of the selected word line WL-S is set to the reading voltage VCGRV, and a potential of the non-selected word line WL-US is set to the reading pass voltage VREAD.

The non-selected cell to which the reading pass voltage VREAD is applied is turned on.

Regarding the selected cell MC, the memory cell MC having a threshold voltage which is equal to or lower than the reading voltage VCGRV is turned on, and the memory cell MC having a threshold voltage which is higher than the reading voltage VCGRV is turned off.

If the selected cell MC is turned on due to the application of the reading voltage VCGRV, a current (cell current) flows between the bit line BL and the source line SL (CELSRC). A potential of a node connected to the bit line BL in the sense amplifier unit 131 changes due to the occurrence of the current. On the other hand, if the selected cell is turned off when the reading voltage VCGRV is applied, a current does not flow between the bit line BL and the source line SL connected to the turned-off selected cell. In this case, a potential of a node connected to the bit line BL does not change.

The sense amplifier unit 131 senses the generation of a current in the bit line. The sense amplifier unit 131 incorporates a signal corresponding to a result of the sensing into a latch circuit corresponding to each bit line.

In the above-described way, regarding 1-bit data, whether data stored in the memory cell MC is data of "1" or data of "0" is determined by using the reading voltage VCGRV as a reference (determination level).

In a determination of a threshold voltage of the memory cell, a potential difference between the word line WL-US and the semiconductor pillar 75A in the portion 99A is reduced due to channel boosting of the semiconductor pillar 75A. Thus, a capacitance component of the portion 99A is removed from a capacitance component in the selected block. As a result, a load caused by the semiconductor pillar in the non-selected string unit is reduced.

In FIG. 12, a value of the reading voltage VCGRV is set to a constant value in order to read 1-bit data. However, if a single memory cell stores data of 2 or more bits, the reading voltage VCGRV may have a plurality of values in order to continuously read data in the memory cell MC by 1 bit.

Time point t5a and time point t6a After the generation of a current in the bit line BL is sensed, each wiring is disabled at a time point t5a and a time point t6a.

At the time point t5a, the sense amplifier unit 131 sets a potential of the bit line BL to the ground voltage VSS.

At the time point t6a, potentials of the select gate lines SGD, SGM and SGS, and potentials of the word lines WL-S and WL-US are sequentially set to the ground voltage VSS.

As mentioned above, in a period from the time point t5a to the time point t6a, the respective wirings SGD, SGS, SGM, WL, and BL in the selected block BK are disabled. Consequently, reading of data from the memory cell MC is finished.

The sequencer 19 changes a level of the ready/busy signal R/B to an "H" level. Consequently, the memory controller 5 is notified of finishing of the read operation in the flash memory 1.

The data read from the memory cell is transmitted from the flash memory 1 to the memory controller 5.

As mentioned above, the read operation on the memory cells in the upper array layer of the flash memory 1 of the present embodiment is finished.

Read Operation on Memory Cell of Lower Array Layer With reference to FIG. 13, a data read operation on the memory cell of the lower array layer will be explained. Reading of data from the memory cell of the lower array layer 110A is different from reading of data from the memory cell of the upper array layer 110B in terms of control on select gate lines of a non-selected string unit in addition to control on a selected word line WL-S.

Time Point t1b

At a time point t1b after a command and a selection address are received (time point t0), the source line driver 15 applies the ground voltage VSS to the source line SL (CELSRC).

The row control circuit 12 applies the voltage VSG to selected select gate lines SGD-S and SGS-S with respect to a selected string unit SU in a selected block BK. In the present embodiment, in the selected string unit, the row control circuit 12 applies the voltage VSG from the driver 129 to the selected intermediate select gate lines SGM-S. Consequently, in the selected string unit, the intermediate select transistors ST3 are turned on, and thus the lower semiconductor pillar 75A is electrically connected to the upper semiconductor pillar 75B. In the selected string unit, the semiconductor pillars 75 are electrically connected to the bit line BL and the source line SL (CELSRC) by turning on the intermediate select transistors ST1, ST2 and ST3.

If the selected word line WL-S is a word line in the lower array layer 110A, the row control circuit 12 applies the ground voltage VSS to the non-selected drain side select gate lines SGD-US and applies the voltage VSG to the non-selected source side select gate lines SGS-US in the non-selected string units of the selected block. Consequently, in the non-selected string units, the transistors ST1 are turned off, and the transistors ST2 are turned on. In the non-selected string units, the row control circuit 12 applies the ground voltage VSS to the non-selected intermediate select gate lines SGM-US. Consequently, in the non-selected string units, the intermediate select transistors ST3 are turned off.

As a result, in each of the non-selected string units, the upper semiconductor pillar 75B is electrically separated from the lower semiconductor pillar 75A by turning off the intermediate select transistors ST3.

Time Point t2b

At a time point t2b, the row control circuit 12 starts to apply the reading pass voltage VREAD to the word lines WL-S and WL-US through a spike operation. Potentials of the non-selected word lines WL-US and the selected word line WL-S increase.

In the period TA, electric charge in the semiconductor pillars 75 is released to the bit line BL or the source line SL via the turned-on transistors.

Time Point t3b

At a time point t3b, the row control circuit 12 reduces a potential which is equal to or higher than the reading voltage VCGRV to the reading voltage VCGRV in the selected word line WL-S. The sense amplifier circuit 13 charges the bit line BL.

In the non-selected string units, the row control circuit 12 stops application of the voltage VSG to the non-selected source side select gate lines SGS-US. Consequently, potentials of the non-selected source side select gate lines SGS-US are set to the ground voltage VSS, and thus the select transistors ST2 are turned off.

In the selected string unit, a potential of the drain side select gate line SGD-S, a potential of the source side select gate line SGS-S, and potentials of the intermediate select gate lines SGM-S are maintained to be the voltage VSG. In the non-selected string units, potentials of the non-selected intermediate select gate lines SGM-US are maintained to be the ground voltage VSS.

Time Point t4b

After the bit line BL is charged in the period TB, at a time point t4b, a potential of the bit line BL is substantially set to a voltage Vpre with a predetermined magnitude. A potential of the selected word line WL-S is set to the reading voltage VCGRV, and a potential of the non-selected word line WL-US is set to the reading pass voltage VREAD.

As described above, the selected cell MC is turned on or off due to application of the reading voltage VCGRV, and thus a cell current flows through the bit line BL.

The sense amplifier unit 131 senses the occurrence (or a change in a potential of the node) of a current in the bit line. The sense amplifier unit 131 incorporates a signal corresponding to a result of the sensing into a latch circuit corresponding to each bit line.

When a threshold voltage of the memory cell in the lower array layer 110A is determined, the upper semiconductor pillars 75B of the non-selected string units SU are subject to channel boosting.

Therefore, data held in the memory cell MC is determined in a state in which a capacitance component (load) between the semiconductor pillar and the word line in the upper array layer 110B in each of the non-selected string units.

Time Point t5b and Time Point t6b

At the time point t5b, the sense amplifier circuit 13 sets a potential of the bit line BL to the ground voltage VSS.

At the time point t6b, potentials of the select gate lines SGD, SGM and SGS, and potentials of the word lines WL-S and WL-US are sequentially set to the ground voltage VSS.

As mentioned above, in a period from the time point t5b to the time point t6b, the respective wirings SGD, SGS, SGM, WL, and BL in the selected block BK are disabled, and thus reading of data from the selected cell is finished.

The data read from the memory cell is transmitted from the flash memory 1 to the memory controller 5.

As mentioned above, the read operation on the memory cells in the lower array layer of the flash memory 1 of the present embodiment is finished.

(b-2-2) Write Operation

Figure 14:
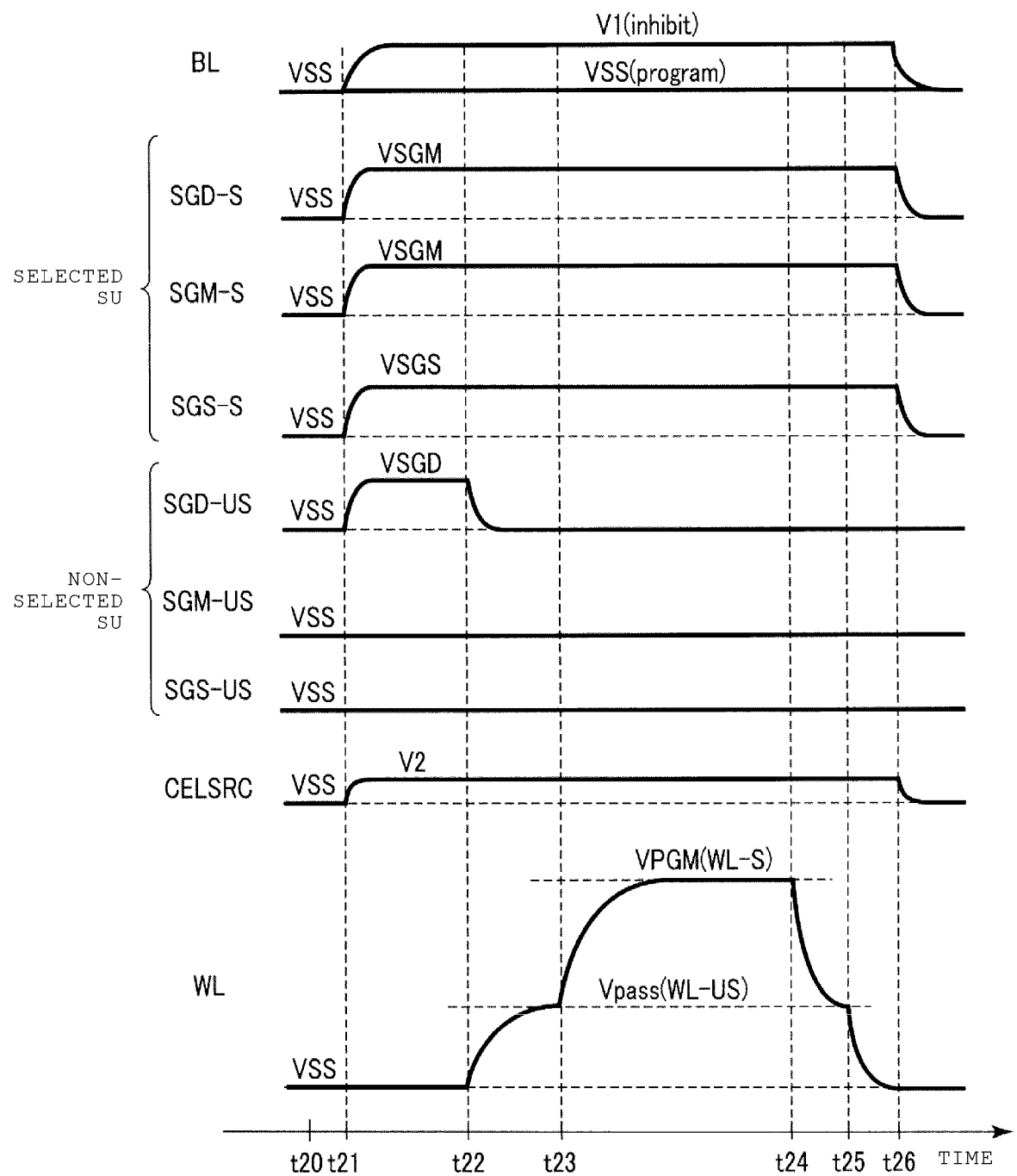

With reference to FIG. 14, a write operation of the flash memory of the present embodiment will be explained. FIG. 14 is a diagram illustrating voltage waveforms of the respective wirings during a write operation of the flash memory of the present embodiment.

Time Point t20

As illustrated in FIG. 14, at a time point t20, for example, the memory controller 5 transmits a writing command, an address (selection address) to which data is to be written, and data to be written, to the flash memory 1 in response to a request from the host device 600. The flash memory 1 receives the writing command, the selection address, and the data. The sequencer 19 starts a write operation based on the writing command.

In the flash memory 1, the write operation includes one or more writing loops. If one or more writing loops are executed, the data is written into a memory cell included in the selection address.

The writing loops include a program operation and a verification operation. Through the program operation, a threshold voltage of a memory cell is shifted in a positive direction. Through the verification operation, whether or not a threshold voltage of a memory cell reaches a value corresponding to data to be written is determined.

The sequencer 19 controls the respective circuits of the flash memory 1 so that the write operation is performed as follows.

Time Point t21

During the program operation, at a time point t21, the sense amplifier circuit 13 starts to control a potential of the bit line BL.

In the sense amplifier circuit 13, the sense amplifier unit 131 applies the ground voltage VSS to the bit line BL connected to a memory cell into which data is to be written. Consequently, the memory cell MC is set to a programmable state (programmable).

In the sense amplifier circuit 13, the sense amplifier unit 131 applies a voltage V1 to the bit line BL connected to a memory cell into which data is not written. Consequently, the memory cell MC is set to a programming inhibition state (inhibit). A memory cell set to the programming inhibition state is a memory cell which is maintained at an "Er" level, or a memory cell whose threshold voltage reaches a value corresponding to data to be written.

The row control circuit 12 starts to control potentials of the respective select gate lines SGD-S, SGD-US, SGS-S, SGS-US, SGM-S and SGM-US.

The row control circuit 12 applies a voltage VSGD to the drain side select gate line SGD-S of a selected string unit. The row control circuit 12 applies the voltage VSGD to the non-selected drain side select gate line SGD-US of a non-selected string unit.

The row control circuit 12 applies a voltage VSGM to the intermediate select gate lines SGM-S of the selected string unit. The row control circuit 12 applies the ground voltage VSS to the non-selected intermediate select gate lines SGM-US of the non-selected string unit.

The row control circuit 12 applies a voltage VSGS to the source side select gate line SGS-S of the selected string unit, and applies the ground voltage VSS to the non-selected source side select gate line SGS-US of the non-selected string unit.

The source line driver 15 applies a voltage V2 to the source line SL (CELSRC).

The voltages VSGD, VSGS and VSGM are voltages for turning on the select transistors ST1, ST2 and ST3. Each of the voltages VSGD, VSGS and VSGM is, for example, about 5 V to 6 V. The voltage V1 is, for example, about 1.5 V to 2.5 V. The voltage V2 is, for example, about 0.8 V to 1.2 V.

In the selected string unit, the select transistors ST1 and ST3 are turned on, and thus the semiconductor pillars 75 are electrically connected to the bit line, in the NAND string 111 of the bit line BL to which the ground voltage VSS is applied. In the NAND string 111 of the bit line BL to which the voltage V1 is applied, the select transistor ST1 is turned off, and thus the bit line BL is electrically separated from the semiconductor pillars 75.

In the non-selected string unit, the select transistor ST1 is turned on, and the select transistor ST3 is turned off. In the non-selected string unit, the upper semiconductor pillar 75B is connected to the bit line BL, and the lower semiconductor pillar 75A is electrically separated from the bit line BL.

With respect to the non-selected string unit sharing the intermediate select gate lines SGM and the source side select gate line SGS with the selected string unit, in the same manner as in the read operation, potentials of the intermediate select gate lines SGM and the source side select gate line SGS of the non-selected string unit are the same as potentials of the intermediate select gate lines SGM and the source side select gate line SGS of the selected string unit.

Time Point t22

At a time point t22, the row control circuit 12 starts to control a position of the word lines WL. The row control circuit 12 applies a writing pass voltage Vpass to the word lines WL.

The row control circuit 12 reduces a potential of the non-selected drain side select gate line SGD-US from the voltage VSGD to the ground voltage VSS. Consequently, the select transistor ST2 of the non-selected drain side select gate line SGD-US is turned off, and thus the semiconductor pillars 75 of the non-selected string unit is electrically separated from the bit line BL.

Time Point t23

At a time point t23, the row control circuit 12 increases a potential of the selected word line WL-S from the writing pass voltage Vpass to a program voltage VPGM. A potential of the non-selected word line WL-US is maintained at the writing pass voltage Vpass. A value of the program voltage VPGM changes with the progress of the write operation. A predetermined voltage value (step-up voltage) is sequentially added to an initial value of the program voltage VPGM according to the number of times of execution of the writing loops.

A threshold voltage of the memory cell of the bit line BL to which the ground voltage VSS is applied is shifted in a positive direction as a result of applying the program voltage VPGM. Consequently, a threshold voltage of a programmable memory cell increases.

The select transistor connected to the bit line BL to which the voltage V1 is applied is cut off. Therefore, the memory cell connected to the bit line BL to which the voltage V1 is applied is subject to channel boosting. Consequently, a threshold voltage of the memory cell in a programming inhibition state scarcely changes during application of the program voltage VPGM.

Time Point t24 to Time Point t26

After a period secured for shifting a threshold voltage of the memory cell (for injecting electric charge into the charge storage layer) elapses, the sequencer 19 reduces a potential of each wiring in order to complete the program operation.

At a time point t24, the row control circuit 12 reduces a potential of the selected word line WL-S from the program voltage Vpgm to the voltage Vpass. At a time point t25, the row control circuit 12 reduces potentials of the selected word line WL-S and the non-selected word line WL-US from the voltage Vpass to the ground voltage VSS.

Thereafter, at a time point t26, the sense amplifier circuit 13 reduces a potential of the bit line BL to which the voltage V1 is applied, from the voltage V1 to the ground voltage VSS.

The row control circuit 12 sets potentials of the selected select gate lines SGD-S, SGS-S and SGM-S to the ground voltage VSS. The source line driver 15 reduces a potential of the source line SL (CELSRC) from the voltage V2 to the ground voltage VSS.

Consequently, the program operation in a certain writing loop is finished.

A verification operation is performed after the program operation illustrated in FIG. 14. The verification operation is similar to the read operation. The verification operation is performed following the program operation without a command from the controller 5. The verification operation is different from the read operation in that a verification voltage having one or more verification levels is applied to the selected word line WL-S instead of a reading voltage. As mentioned above, in the verification operation, a state of a threshold voltage of the memory cell MC is determined. A verification level at which data programming is completed may be omitted from the verification voltage with the progress of the write operation.

If the selected word line WL-S is a word line WLU in the upper array layer 110B in the verification operation, the verification operation is performed in the substantially same manner as in the read operation in FIG. 12. If the selected word line WL-S is a word line WLL in the lower array layer 110A in the verification operation, the verification operation is performed in the substantially same manner as in the read operation in FIG. 13.

A writing loop including the program operation illustrated in FIG. 14 and the verification operation illustrated in FIG. 11 or 12 is repeatedly executed until a threshold voltage of a selected cell reaches a voltage value corresponding to data to be written.

As mentioned above, the write operation of the flash memory of the present embodiment is performed.

(b-2-3) Erasing Operation

Figure 15:
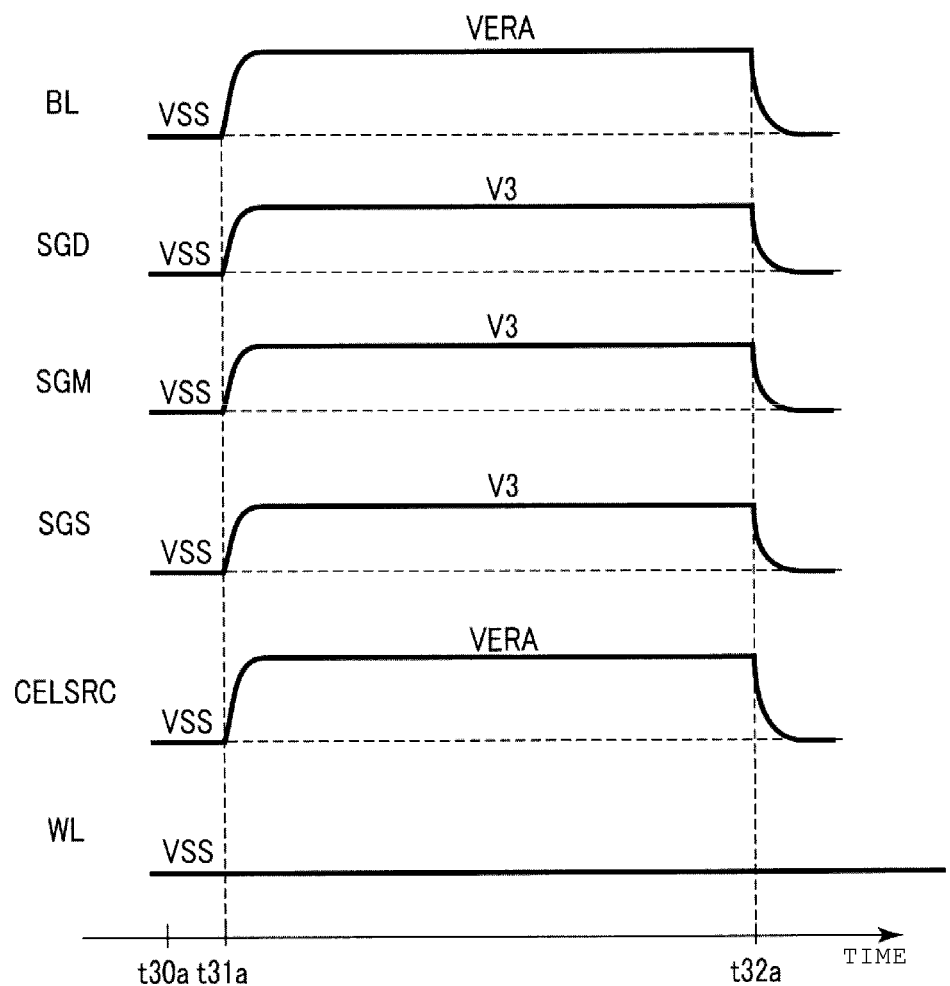
Figure 16:
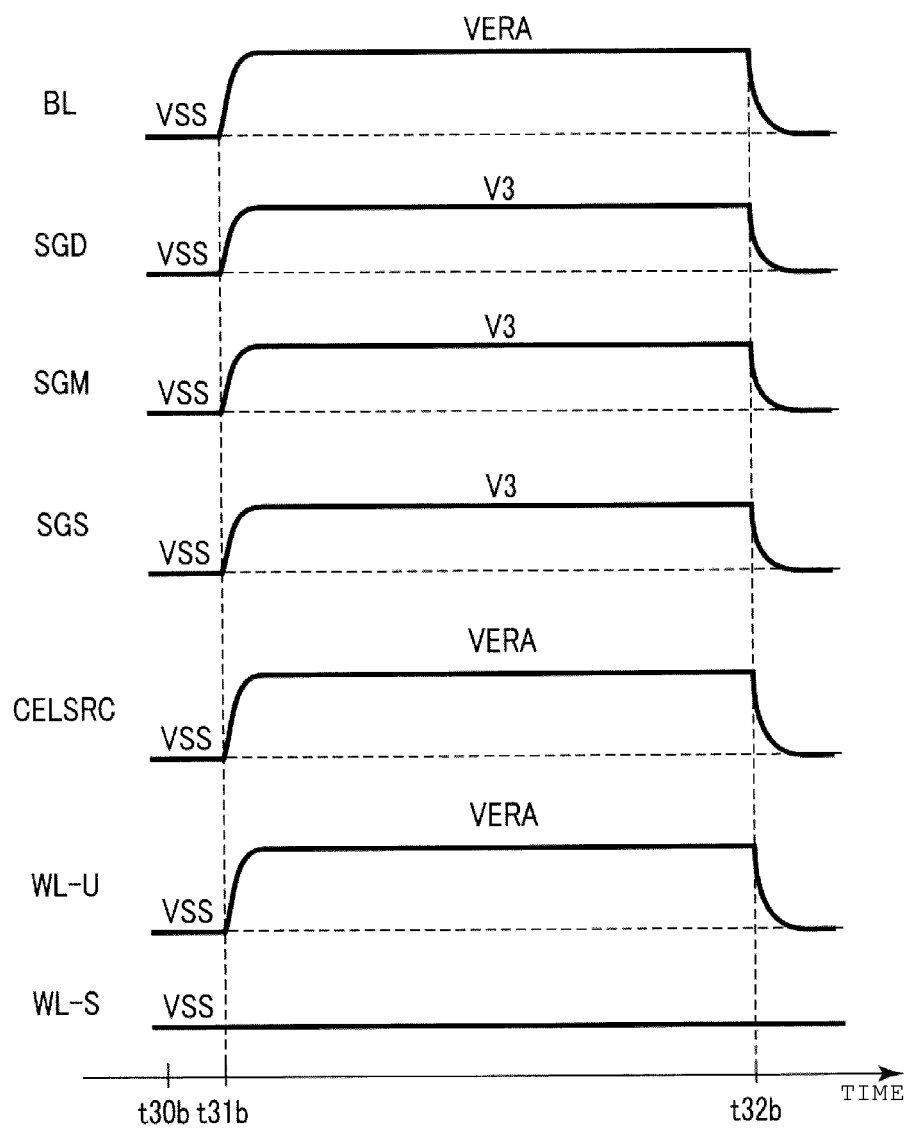

With reference to FIGS. 15 and 16, an erasing operation of the flash memory of the present embodiment will be explained.

Block Erasing Operation

FIG. 15 is a diagram illustrating voltage waveforms of the respective wirings during an erasing operation of the flash memory of the present embodiment. FIG. 15 illustrates an example in which data of the flash memory is erased in the block unit.

Time Point t30a

As illustrated in FIG. 15, for example, at a time point t30a, the sequencer 19 starts an erasing operation on an erasing target block (selected block) based on a command (a request from the host device) from the memory controller 5 or an internal process of the flash memory 1.

Time Point t31a

At a time point t31a, the sense amplifier circuit 13 and the source line driver 15 start to control potentials of the bit line BL and the source line SL. The sense amplifier unit 131 applies an erasing voltage VERA to the bit line BL. The source line driver 15 applies the erasing voltage VERA to the source line SL (CELSRC).

The row control circuit 12 starts to control potentials of the word lines WL and the respective select gate lines SGD, SGS and SGM in the selected block.

The row control circuit 12 applies a voltage V3 to the drain side select gate lines SGD of all of the string units and the source side select gate lines SGS of all of the string units in the selected block. The row control circuit 12 applies the voltage V3 to the intermediate select gate lines SGM of all of the string units in the selected block. Consequently, the respective select transistors ST1, ST2 and ST3 are turned on. The voltage V3 is lower than the erasing voltage VERA. For example, if the erasing voltage VERA is about 20 V, the voltage V3 is about 13 V to 15 V.

The row control circuit 12 applies the ground voltage VSS to all of the word lines WL in the selected block.

The erasing voltage VERA is applied to the semiconductor pillars 75 and the well regions 702 via the bit lines BL and the source lines SL (CELSRC).

As mentioned above, during the erasing operation, a potential of the semiconductor pillar 75 is higher than a potential of the word line WL. Consequently, electric charge in the charge storage layer 792 is released to the semiconductor pillar 75. As a result, the memory cell is set to an erasing state ("Er" level).

Time Point t32a

At a time point t32a, the row control circuit 12 reduces potentials of the select gate lines SGD, SGS and SGM from the voltage V3 to the ground voltage VSS.

In the sense amplifier circuit 13, the sense amplifier unit 131 reduces a potential of the bit line BL from the erasing voltage VERA to the ground voltage VSS. The source line driver 15 reduces a potential of the source line SL (CELSRC) from the erasing voltage VERA to the ground voltage VSS.

Consequently, the erasing operation in the block unit in the flash memory is finished.

Division Erasing Operation

FIG. 16 is a diagram illustrating voltage waveforms of the respective wirings during an erasing operation of the flash memory of the present embodiment. As described above, the flash memory may erase data in the unit smaller than a block. FIG. 16 illustrates an example in which data of the flash memory is erased in the predetermined control unit in a block.

Time Point t30b

As illustrated in FIG. 16, for example, at a time point t30b, the sequencer 19 starts an erasing operation based on a command (a request from the host device) from the memory controller 5 or an internal process of the flash memory 1.

For example, if a partial erasing operation is performed, in a selected block, one of control units for partial erasing, set in the block, is selected. The control unit includes one or more word lines.

Time Point t31b

At a time point t31b, the sense amplifier unit 131 applies an erasing voltage VERA to the bit line BL in the same manner as in the block erasing operation. The source line driver 15 applies the erasing voltage VERA to the source line SL (CELSRC). The row control circuit 12 applies the voltage V3 to the drain side select gate lines SGD of all of the string units SU, the source side select gate lines SGS of all of the string units SU, and the intermediate select gate lines SGM of all of the string units SU, in the selected block.

In the partial erasing operation, the row control circuit 12 applies the ground voltage VSS to word lines WL-S included in an erasing target control unit (selected control unit) in the selected block.

The row control circuit 12 applies the erasing voltage VERA to word lines WL-US included in a control unit (non-selected control unit) other than the erasing target.

A control unit (number of selected word lines) for partial erasing may be a single array layer unit, and may be a unit smaller than the array layer. A partial erasing unit may be larger than the array layer.

In the erasing target control unit, electric charge in the charge storage layer is released to the semiconductor pillar 75 due to a potential difference between the semiconductor pillar 75 and the word line WL-S. As a result, memory cells included in the erasing target control unit are set to an erasing state.

On the other hand, in a non-selected control unit, since the erasing voltage VERA is applied to the word lines WL-US, a potential difference between the semiconductor pillar 75 and the word line WL is scarcely generated. As a result, regarding memory cells included in the non-selected control unit in the partial erasing operation, a threshold voltage of the memory cell MC scarcely changes and is thus maintained to a voltage value before the erasing operation is performed.

Time Point t32b

At a time point t32b, the row control circuit 12 reduces potentials of the word lines WL-US included in the non-selected control unit from the erasing voltage VERA to the ground voltage VSS.

In the same manner as in the block erasing operation, potentials of the select gate lines SGD, SGS and SGM, a potential of the bit line BL, and a potential of the source line SL (CELSRC) are set to the ground voltage VSS.

Consequently, the erasing operation on the control unit smaller than the block in the flash memory is finished.

As mentioned above, in the partial erasing operation of the flash memory, data is erased in an erasing target control unit in a selected block. On the other hand, in the selected block, a non-erasing target control unit holds data before the partial erasing operation.

In the above-described way, in the flash memory of the present embodiment, data held in a certain portion of a block is selectively erased.

(c) Summary

In the flash memory of a memory device of the present embodiment, the memory cell array includes a plurality of stacked array layers. In this case, the NAND string has a structure in which a plurality of semiconductor pillars are stacked.

In the flash memory of the present embodiment, not only the drain side and source select gate lines but also the intermediate select gate lines are connected to the NAND string. The intermediate select gate lines are provided in a region near the junction of the stacked semiconductor pillars. The NAND string includes not only the select transistors provided at one end and the other end of the NAND string, but also the select transistors connected to the intermediate select gate lines.

In the flash memory of the present embodiment, the conductive layers are provided to oppose the side surfaces of the semiconductor pillars in the region near the junction of a plurality of semiconductor pillars. The conductive layers are used as the select gate lines (intermediate select gate lines). The select transistors are provided in a portion where the intermediate select gate lines oppose the semiconductor pillars.

Consequently, the flash memory of the present embodiment can control an electrical conduction state between the semiconductor pillar of the lower array layer and the semiconductor pillar of the upper array layer by controlling potentials of the intermediate select gate lines.

The flash memory of the present embodiment can electrically connect a semiconductor pillar in an array layer including a selected word line, among a plurality of array layers and among a plurality of semiconductor pillars included in the NAND string, to a bit line or a source line, in a non-selected string unit, and can electrically separate the semiconductor pillars in the other array layers from the bit line or the source line.

Consequently, regarding a semiconductor pillar connected to the bit line or the source line, electric charge in the semiconductor pillar can be removed.

Therefore, the flash memory of the present embodiment can reduce the occurrence of reading disturbance.

The flash memory of the present embodiment can cause a semiconductor pillar of an electrically separated portion among the plurality of stacked array layers, to be subject to channel boosting. Consequently, the flash memory of the present embodiment can prevent the occurrence of a capacitance component during an operation.

Therefore, the flash memory of the present embodiment can reduce a load caused by a capacitance component of a semiconductor pillar and can thus reduce a current (load current) caused by the load. As a result, the flash memory of the present embodiment can reduce a peak value of a current generated in a memory cell array, suppress an increase in power consumption, and prevent deterioration in an operation speed.

The flash memory of the present embodiment can electrically separate the upper array layer and the lower array layer from each other by controlling a potential of the select gate line (turning-on and turning-off of the select transistor), and can thus suppress an increase in the number of dummy word lines for securing a distance between elements. Consequently, the flash memory of the present embodiment can realize improvement of memory density in a memory cell array, a reduction in the number of wirings, a reduction in a thickness (a dimension in the D3 direction) of a memory cell array, and the like. As a result, the flash memory of the present embodiment can reduce chip cost of the flash memory.

As mentioned above, the memory device of the present embodiment can improve operation characteristics.

(2) Second Embodiment

Figure 17:
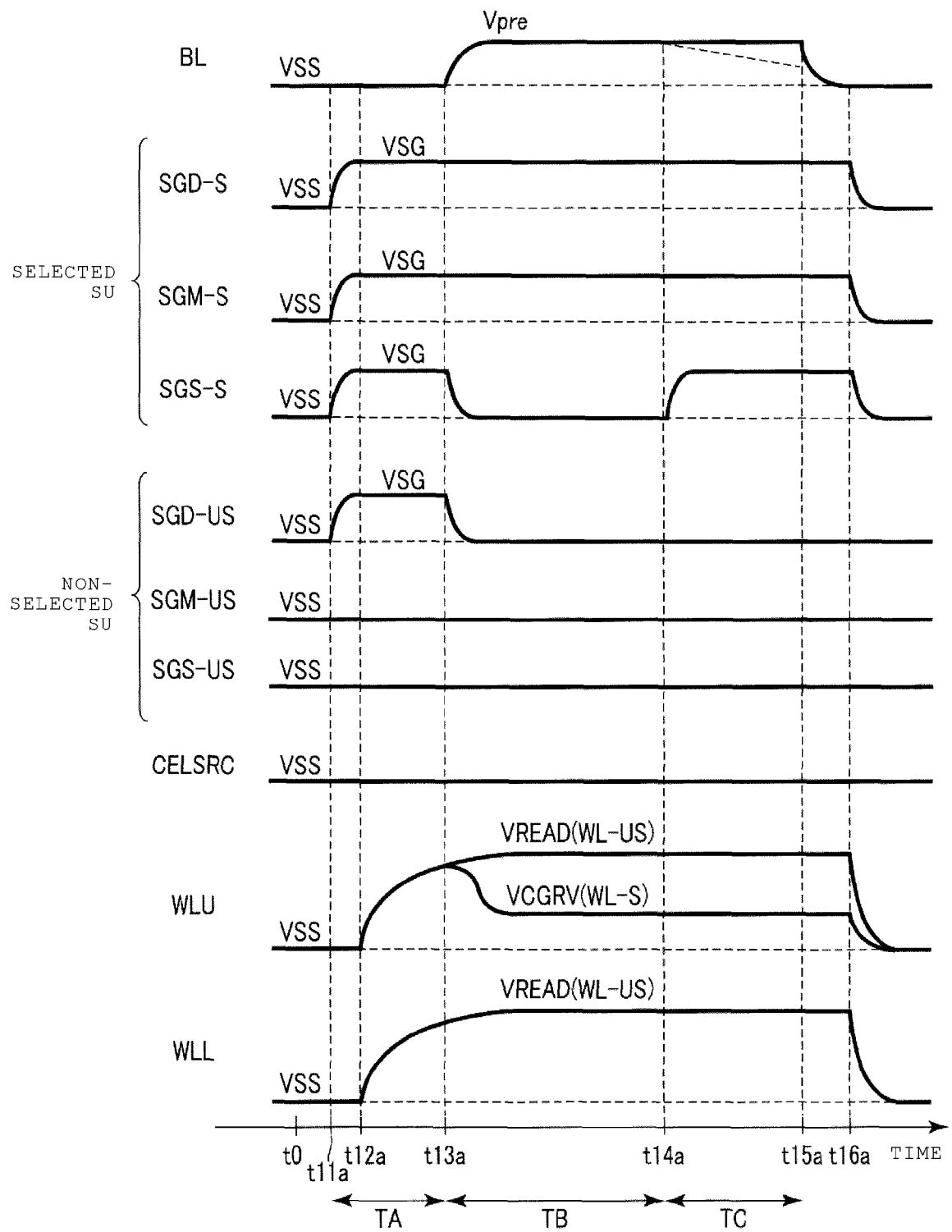
FIGS. 17-18 are each a timing chart illustrating an operation example of a memory device of a second embodiment.
Figure 18:
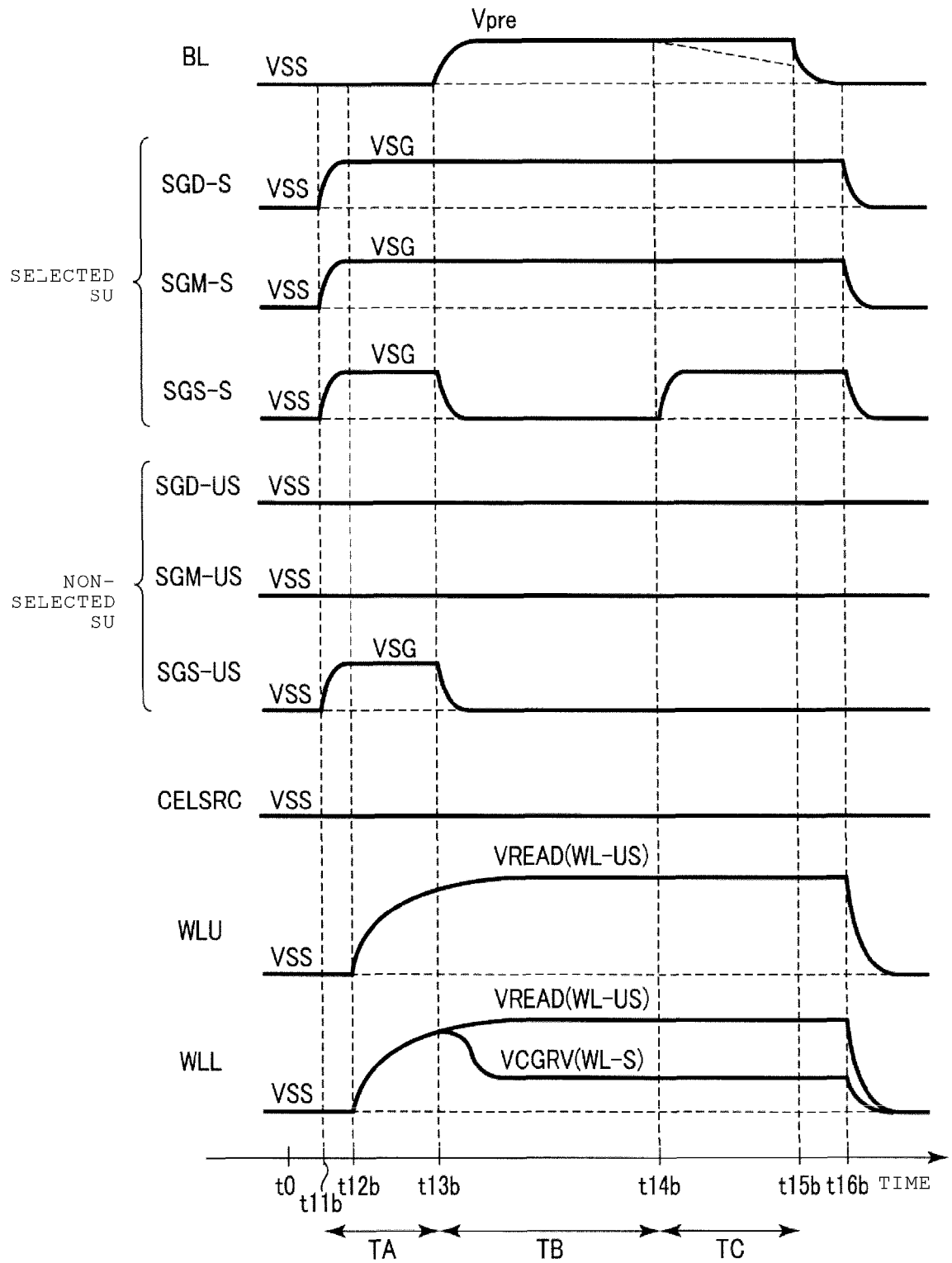

With reference to FIGS. 17 and 18, a memory device and a control method therefor according to a second embodiment will be explained.

In a flash memory of the second embodiment, a voltage sensing method (bit line shield method) is used for a determination of a threshold voltage of a memory cell.

In the voltage sensing method, a change in a potential of a bit line due to turning-on or turning-off of a memory cell is sensed, and thus a state of a threshold voltage of the memory cell is determined.

Fundamental configurations of a circuit and a structure of the flash memory of the present embodiment are substantially the same as the configurations of the flash memory of the first embodiment. However, in the flash memory using the voltage sensing method, a single sense amplifier unit 131 may control two bit lines (even-numbered and odd-numbered bit lines) adjacent to each other.

(2a) Operation Example

Read Operation on Memory Cell of Upper Array Layer

FIG. 17 is a diagram illustrating voltage waveforms of the respective wirings during a read operation of the flash memory of the present embodiment.

Time Point t11a

As illustrated in FIG. 17, in the same manner as in data reading in the flash memory using the current sensing method, at a time point t0, the sequencer 19 starts a data read operation based on a reading command and a selection address from the memory controller 5.

At a time point t11a, the row control circuit 12 starts to control potentials of the drain side select gate lines SGD-S and SGD-US, and potentials of the intermediate select gate lines SGM-S and SGM-US.

The row control circuit 12 applies the voltage VSG to the source side select gate line SGS-S of a selected string unit. The row control circuit 12 applies the ground voltage VSS to the non-selected source side select gate line SGS-US of a non-selected string unit.

Time point t12a and time point t13a At a time point t12a, the row control circuit 12 starts to apply a voltage to the word lines WLU and WLL.

In a period TA from the time point t12a to the time point t13a, the voltage VSG is applied to the non-selected drain side select gate line SGD-US, and thus the select transistor ST1 is turned on. Consequently, the semiconductor pillar 75B of the upper array layer 110B of the non-selected string unit is electrically connected to the bit line BL via the transistor ST1 in the on state. As a result, not only residual electric charge in the semiconductor pillars 75 of the selected string unit but also residual electric charge in the semiconductor pillar 75B of the upper array layer 110B of the non-selected string unit are released to the bit line BL.

In the period TA, in the non-selected string unit SU, the ground voltage VSS is applied to the non-selected source side select gate line SGS-US and the intermediate select gate lines SGM, and thus the select transistors ST2 and the select transistor ST3 are turned off. Therefore, in the period TA, the semiconductor pillar 75A of the lower array layer 110A is electrically separated from the bit line BL and the source line SL (CELSRC) and is thus in an electrically floating state.

At the time point t13a, the row control circuit 12 controls the selected word line WL-S in order to set a potential of the selected word line WL-S of the upper array layer 110B to the reading voltage VCGRV. The sense amplifier unit 131 starts to apply a voltage to the bit line BL. Here, if a single sense amplifier unit 131 controls two bit lines, the sense amplifier unit 131 charges one bit line (for example, an odd-numbered bit line) and applies the ground voltage VSS to the other bit line (for example, an even-numbered bit line).

The row control circuit 12 reduces a potential of the non-selected drain side select gate line SGD-US of the non-selected string unit from the voltage VSGD to the ground voltage VSS. The potential of the selected drain side select gate line SGD-S is maintained to be the voltage VSG.

The row control circuit 12 controls the selected word line WL-S and the bit line BL, and also reduces a potential of the source side select gate line SGS-S from the voltage VSG to the ground voltage VSS. Since the ground voltage VSS is applied, the select transistor ST2 of the source side select gate line SGS-S is turned off. The bit line BL and the semiconductor pillars 75 are electrically separated from the source line SL (CELSRC) by turning off the select transistor ST2, and thus the bit line BL and the semiconductor pillars 75 are charged.

Time Point t14a

In a period TB from the time point t13a to a time point t14a, the bit line BL is charged to a desired potential Vpre.

At the time point t14a, a potential of the selected word line WL-S is set to the reading voltage VCGRV. The row control circuit 12 increases a potential of the source side select gate line SGS-S from the ground voltage VSS to the voltage VSG.

In the selected string unit, if the potential of the source side select gate line SGS-S reaches the voltage VSG, the select transistor ST2 is turned on, and thus the source line SL (CELSRC) is electrically connected to the semiconductor pillar 75B. At this time, in the non-selected string unit, the lower semiconductor pillar 75A is subject to channel boosting.

When the reading voltage VCGRV is applied, if the selected cell is turned on, the bit line BL is electrically connected to the source line SL (CELSRC), and thus the bit line is discharged. Consequently, a potential of the bit line BL is reduced from the voltage Vpre. The sense amplifier unit 131 senses that the potential of the bit line BL is reduced.

When the reading voltage VCGRV is applied, if the selected cell is turned off, the bit line BL is electrically separated from the source line SL (CELSRC). Consequently, a potential of the bit line BL is maintained to be the voltage Vpre. The sense amplifier unit 131 senses that the potential of the bit line BL is maintained.

As mentioned above, in the data read operation using the voltage sensing method, each sense amplifier unit 131 senses whether or not a potential of the bit line BL changes. Consequently, data held in the memory cell MC is determined.

During a determination of a threshold voltage of the memory cell, the lower semiconductor pillar of the non-selected string unit is subject to channel boosting, and thus a load caused by a capacitance component of the lower semiconductor pillar is reduced.

Time point t15a to time point t16a At a time point t15a, the sense amplifier unit 131 reduces a potential of the bit line BL from the voltage Vpre to the ground voltage VSS.

At a time point t16a, the row control circuit 12 reduces potentials of the select gate lines SGD-S, SGM-S and SGS-S from the voltage VSG to the ground voltage VSS. The row control circuit 12 reduces a potential of the selected word line WL-S from the voltage VCGRV to the ground voltage VSS, and reduces a potential of the non-selected word line WL-US from the reading pass voltage VREAD to the ground voltage VSS.

Consequently, reading of data from the memory cell of the upper array layer 110B is finished.

Read Operation on Memory Cell of Lower Array Layer

With reference to FIG. 18, reading of data from the memory cell of the lower array layer in the flash memory using the voltage sensing method will be explained. FIG. 18 is a diagram illustrating voltage waveforms of the respective wirings during a read operation of the flash memory of the present embodiment.

Time Point t11b

As illustrated in FIG. 18, in the same manner as in the example illustrated in FIG. 17, after a data read operation is started based on a reading command and a selection address (time point t0), at a time point to b, the row control circuit 12 applies the voltage VSG to the respective select gate lines SGD-S, SGS-S and SGM-S of a selected string unit.

If the word line WLL of the lower array layer 110A is selected, the row control circuit 12 applies the ground voltage VSS to the non-selected drain side select gate line SGD-US of a non-selected string unit. The row control circuit 12 applies the voltage VSG to the source side select gate line SGS-S of the selected string unit and also to the non-selected source side select gate lines SGS-US of the non-selected string unit. The row control circuit 12 applies the ground voltage VSS to the non-selected intermediate select gate lines SGM-US of the non-selected string unit.

Time point t12$b$ and time point t13$b$ At a time point t12$b$, the row control circuit 12 starts to apply the reading pass voltage VREAD to the word lines WLU and WLL.

In a period TA (a time point t12$b$ to a time point t13$b$), the voltage VSG is applied to the source side select gate line SGS-S, and thus the select transistor ST2 is turned on. Consequently, the semiconductor pillar 75A of the lower array layer 110A of the non-selected string unit is electrically connected to the source line SL (CELSRC). As a result, not only residual electric charge in the semiconductor pillars 75 of the selected string unit but also residual electric charge in the semiconductor pillar 75A of the non-selected string unit are released to the source line SL (CELSRC) (or the well region).

In the period TA, the ground voltage VSS is applied to the intermediate select gate lines SGM-S. Consequently, the semiconductor pillar 75B of the upper array layer 110B of the non-selected string unit is electrically separated from the source line SL (CELSRC). In the upper array layer 110B, the semiconductor pillar 75B is in an electrically floating state.

At the time point t13$b$, the sense amplifier unit 131 starts to charge the bit line BL. The row control circuit 12 reduces potentials of the selected source side select gate line SGS-S and the non-selected source side select gate line SGS-US from the voltage VSG to the ground voltage VSS. The row control circuit 12 applies the reading voltage VCGRV to the selected word line WL-S in the lower array layer 110A.

Time Point t14$b$

At a time point t14$b$, the row control circuit 12 increases a potential of the source side select gate line SGS-S from the ground voltage VSS to the voltage VSG. Since the select transistor ST2 is turned on, the source line SL (CELSRC) is electrically connected to the semiconductor pillar 75A.

The reading voltage VCGRV is applied, and thus the selected cell is turned on or off. A change in a potential of the bit line BL due to turning-on or turning-off of a selected cell is sensed by the sense amplifier unit 131. As a result, data held in the memory cell MC is determined.

In a period TC, in a determination of data held in the memory cell, the semiconductor pillar 75B of the upper array layer 110B of the non-selected string unit is subject to channel boosting, and thus a capacitance component between the semiconductor pillar 75B and the word line WLU is scarcely generated.

Time point t15$b$ to time point t16$b$ At a time point t15$b$, the sense amplifier unit 131 reduces a potential of the bit line BL to the ground voltage VSS.

At a time point t16$b$, the row control circuit 12 reduces potentials of the select gate lines SGD-S, SGM-S and SGS-S to the ground voltage VSS. The row control circuit 12 reduces potentials of the selected word line WL-S and the non-selected word line WL-US to the ground voltage VSS.

Consequently, reading of data from the memory cell of the lower array layer 110A is finished.

In the present embodiment, a data write operation and a data erasing operation are performed in the same manner as in the first embodiment. During a write operation, the operations illustrated in FIGS. 17 and 18 correspond to a verification operation.

As mentioned above, the flash memory of the present embodiment can reduce reading disturbance during an operation even if the voltage sensing method is applied to a determination of a threshold voltage of the memory cell in a read operation (and a verification operation) of the flash memory, and can also reduce a capacitance component of a certain portion in a selected block. As a result, a load caused by a capacitance component of the semiconductor pillar can be reduced.

Therefore, the flash memory of the present embodiment can achieve the same effect that the effect in the first embodiment.

Therefore, the flash memory of the second embodiment can improve operation characteristics.

(3) Third Embodiment

Figure 19:
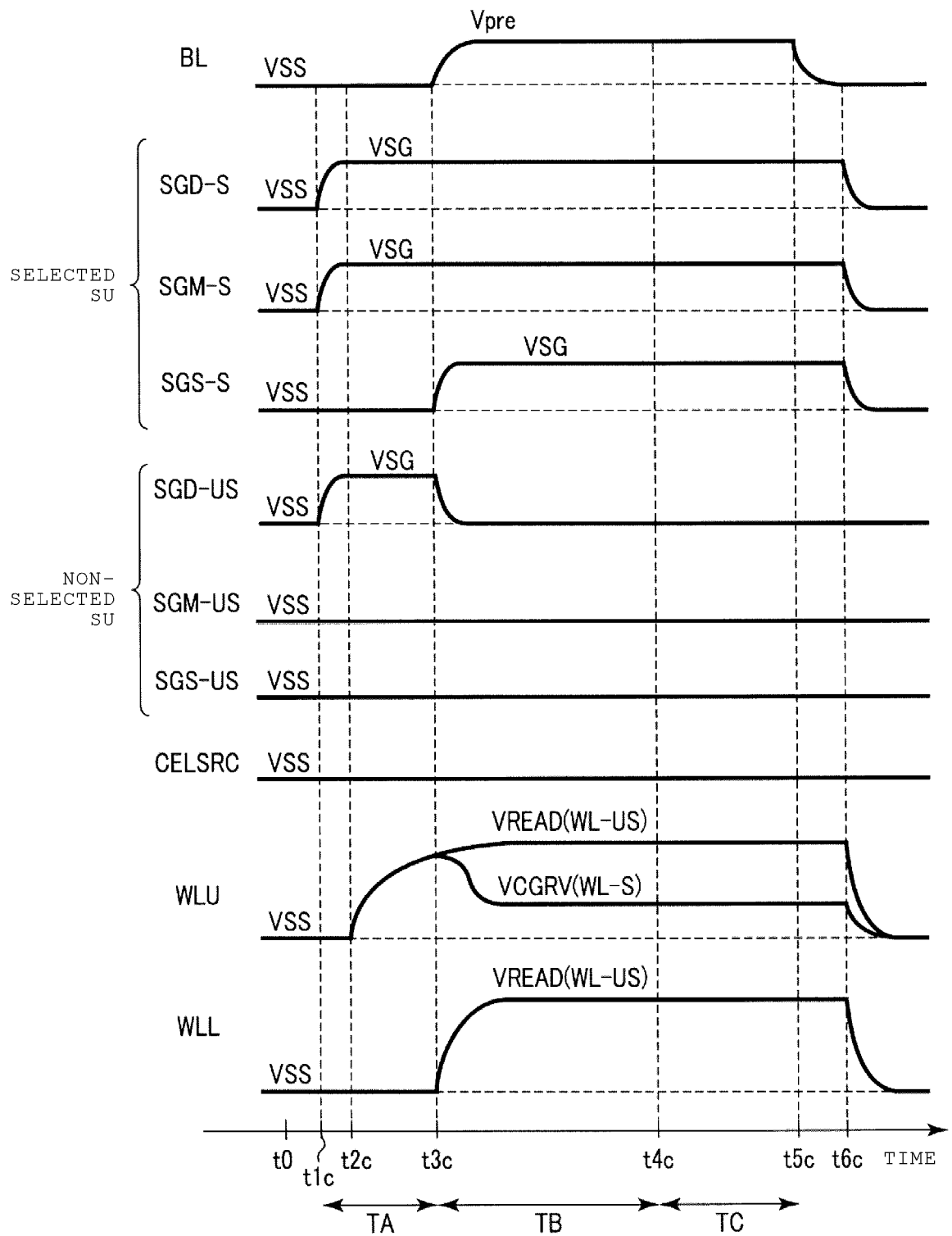
FIG. 19 is a timing chart illustrating an operation example of a memory device of a third embodiment.

With reference to FIG. 19, a memory device and a control method therefor according to a third embodiment will be explained.

FIG. 19 is a diagram illustrating voltage waveforms of the respective wirings during a read operation (or a verification operation) of a flash memory of the present embodiment.

In the present embodiment, in the flash memory using the current sensing method, a timing of applying a voltage to a non-selected word line of the upper array layer and a timing of applying a voltage to a non-selected word line of the lower array layer are different from each other.

Operation Example

Read Operation on Memory Cell of Upper Array Layer

Time Point t1$c$ and Time Point t2$c$

As illustrated in FIG. 19, after reading of data is started, at a time point t1$c$, the voltage VSG is applied to the drain side select gate lines SGD-S and SGD-US, and the selected intermediate select gate lines SGM-S.

At a time point t2$c$, if a word line WL in the upper array layer 110B is selected, a voltage starts to be applied to the selected word line WL-S, and a non-selected word line WL-US in the upper array layer 110B.

In the present embodiment, application of a voltage to the word line WLL in the lower array layer 110A is performed at a timing which is different from a timing at which a voltage is applied to a word line WLU in the upper array layer 110B including the selected word line WL-S.

Therefore, at the time point t2$c$, a voltage does not start to be applied to the word line WLL, and a potential of the word line WLL is maintained to be the ground voltage VSS.

Since the potential of the word line WLL is maintained to be the ground voltage VSS, the selected source side select gate line SGS-S is maintained to be the ground voltage VSS.

The memory cell in the lower array layer 110A is turned off since the ground voltage VSS is applied to the word line WLL. The elements and the wirings of the upper array layer 110B are electrically separated from the source line SL (CELSRC) by turning off the memory cells MC of the lower array layer 110A regardless of turning-on and turning-off of the select transistor ST2 of the selected source side select gate line SGS-S.

If the ground voltage VSS is applied, and thus the memory cell MC of the word line WLL is turned off, an adverse effect does not occur in a read operation even if a potential of the selected source side select gate line SGS-S is maintained to be the ground voltage VSS when a voltage starts to be applied to the selected word line WL-S of the upper array layer 110B.

Time point t3c to time point t5c After a release process in a period TA (the time point t2c to a time point t3c), at the time point t3c, the reading pass voltage VREAD starts to be applied to a word line (non-selected word line) WLL of the lower array layer 110A. In a selected string unit, the voltage VSG starts to be applied to the source side select gate line SGS-S.

Consequently, in a period TB from the time point t3c to the time point t4c, a potential of the word line WLL is set to the reading pass voltage VREAD, and a potential of the selected source side select gate line SGS-S is set to the voltage VSG, along with charging of the bit line BL.

In a period TC from the time point t4c to a time point t5c, the generation of a cell current due to turning-on or turning-off of a selected cell is sensed by the sense amplifier unit 131 in a state in which the lower semiconductor pillar 75A of the non-selected string unit is subject to a channel boosting. Consequently, data held in the selected cell is read.

Thereafter, at the time point t5c and a time point t6c, the word lines WL and the select gate lines SGD, SGS and SGM are disabled, and thus the read operation of the flash memory 1 is completed.

If the word line WLL of the lower array layer 110A is selected, a voltage starts to be applied to the word line WLL of the lower array layer 110A at the time point t2c in FIG. 19. Thereafter, a voltage starts to be applied to the word line WLU of the upper array layer 110B at the time point t3c in FIG. 19.

In this case, in the selected and non-selected string units, timings of applying voltages to the select gate lines SGD, SGS and SGM are the same as the timings illustrated in FIG. 13. However, in the period TA, the ground voltage VSS may be applied to the select gate lines SGD-S and SGM-S of the selected string unit.

As mentioned above, in the flash memory of the present embodiment, even if timings of control on the word lines are different from each other, the substantially same effects as the effects in the above-described embodiments can be achieved.

(4) Fourth Embodiment

Figure 20:
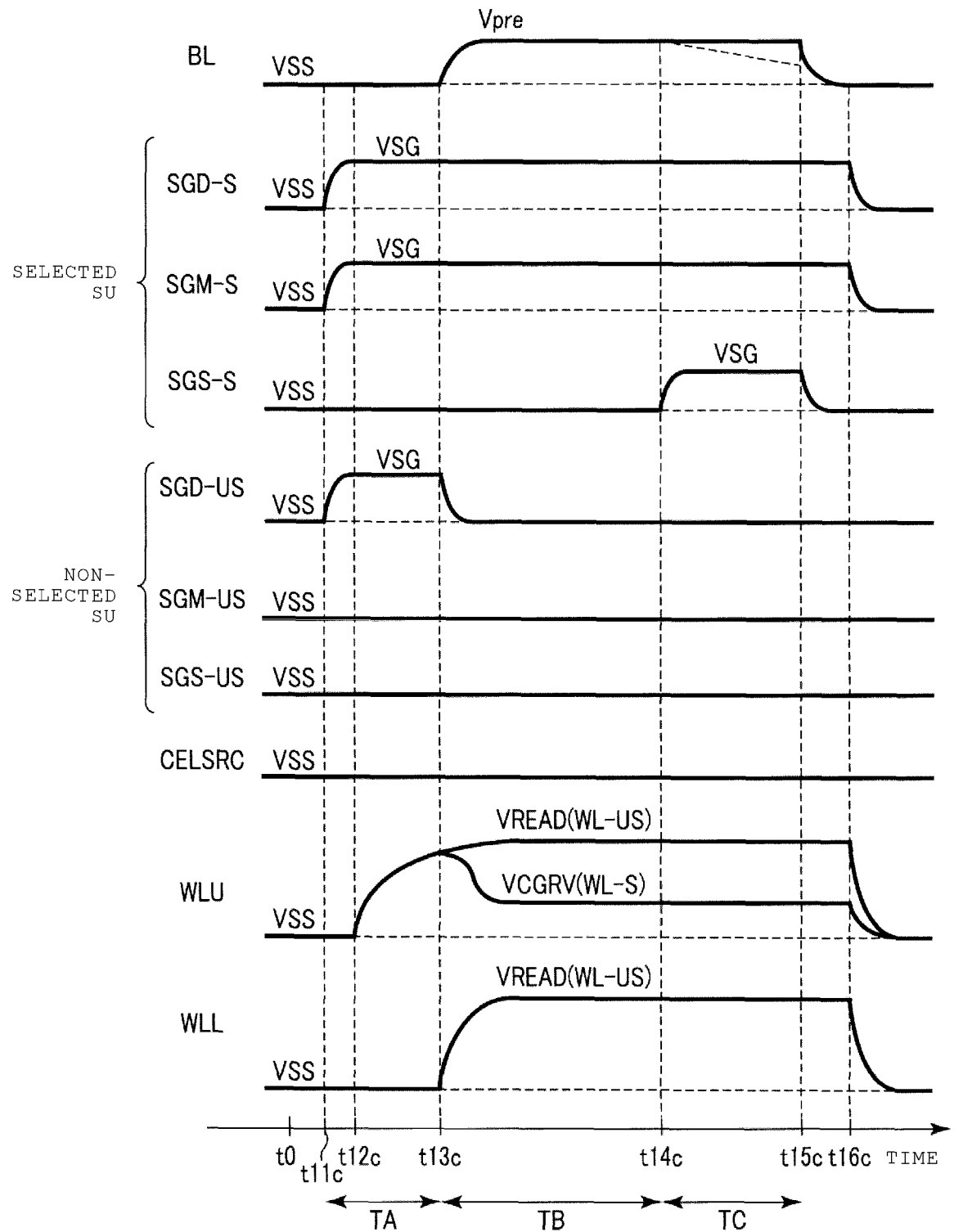
FIG. 20 is a timing chart illustrating an operation example of a memory device of a fourth embodiment.

With reference to FIG. 20, a memory device according to a fourth embodiment will be explained.

FIG. 20 is a diagram illustrating voltage waveforms of the respective wirings during a read operation (or a verification operation) of a flash memory of the present embodiment.

In the present embodiment, in the flash memory using the voltage sensing method, a timing of applying a voltage to a non-selected word line of the upper array layer and a timing of applying a voltage to a non-selected word line of the lower array layer are different from each other.

Operation Example

Read Operation on Memory Cell of Upper Array Layer

Time point t11c and time point t12c As illustrated in FIG. 20, at a time point t11c, the voltage VSG is applied to the drain side select gate lines SGD-S and SGD-US and SGM-S in the same manner as in the example illustrated in FIG. 19.

At a time point t12c, the word line WLU of the upper array layer 110B is selected based on a selection address. A voltage starts to be applied to the word line WLU. A potential of the word line WLL of the lower array layer 110A is maintained to be the ground voltage VSS.

In a period TA from the time point t11c to a time point t13c, potentials of the source side select gate lines SGS-S and SGS-US of the selected string unit and the non-selected string unit are maintained to be the ground voltage VSS. Since the memory cell of the lower array layer 110A is turned off, the source side select transistor ST2 of the NAND string 111 may be turned off.

In the period TA, electric charge in the semiconductor pillars 75A and 75B is released to the bit line BL via the turned-on drain side select transistor ST1.

Time Point t13c

At the time point t13c, the bit line starts to be charged. A potential of the non-selected drain side select gate line SGD-US of the non-selected string unit transitions from the voltage VSG to the ground voltage VSS.

The reading pass voltage VREAD is applied to the word line (non-selected word line) WLL (WL-US) of the lower array layer 110A.

In a period TB from the time point t12c to the time point t13c following the period TA, potentials of the source side select gate lines SGS-S and SGS-US are maintained to be the ground voltage VSS.

Time Point t14c to Time Point t15c

At a time point t14c, in the selected string unit, the voltage VSG is applied to the source side select gate line SGS-S. The select transistor ST2 connected to the source side select gate line SGS-S is turned on. The source line SL (CELSRC) is electrically connected to the NAND string 111 of the selected string unit via the turned-on select transistor ST2.

In a period TC from the time point t14c to a time point t15c, a change in a potential of the bit line BL due to turning-on or turning-off of a selected cell is sensed by the sense amplifier unit 131. As a result, data held in the selected cell is read.

Since the lower pillar of the non-selected string unit is subject to channel boosting when a potential of the bit line BL is sensed, a load caused by a capacitance component of the semiconductor pillar is reduced.

If the word line WLL of the lower array layer 110A is selected, voltages start to be applied to the selected and non-selected word lines WLL of the lower array layer 110A at the time point t12c in FIG. 20, and a voltage starts to be applied to the word line WLU of the upper array layer 110B at the time point t13c in FIG. 20. In this case, timings of applying voltages to the select gate lines SGD, SGS and SGM are the same as in the example illustrated in FIG. 18. However, in the period TA, the ground voltage VSS may be applied to the select gate lines SGD-S and SGM-S of the selected string unit.

As mentioned above, a read operation on the memory cell of the lower array layer 110A is performed.

As mentioned above, even if timings of control on the word lines are different from each other, the flash memory of the present embodiment can improve operation characteristics in a voltage sensing type flash memory.

(5) Fifth Embodiment

Figure 21:
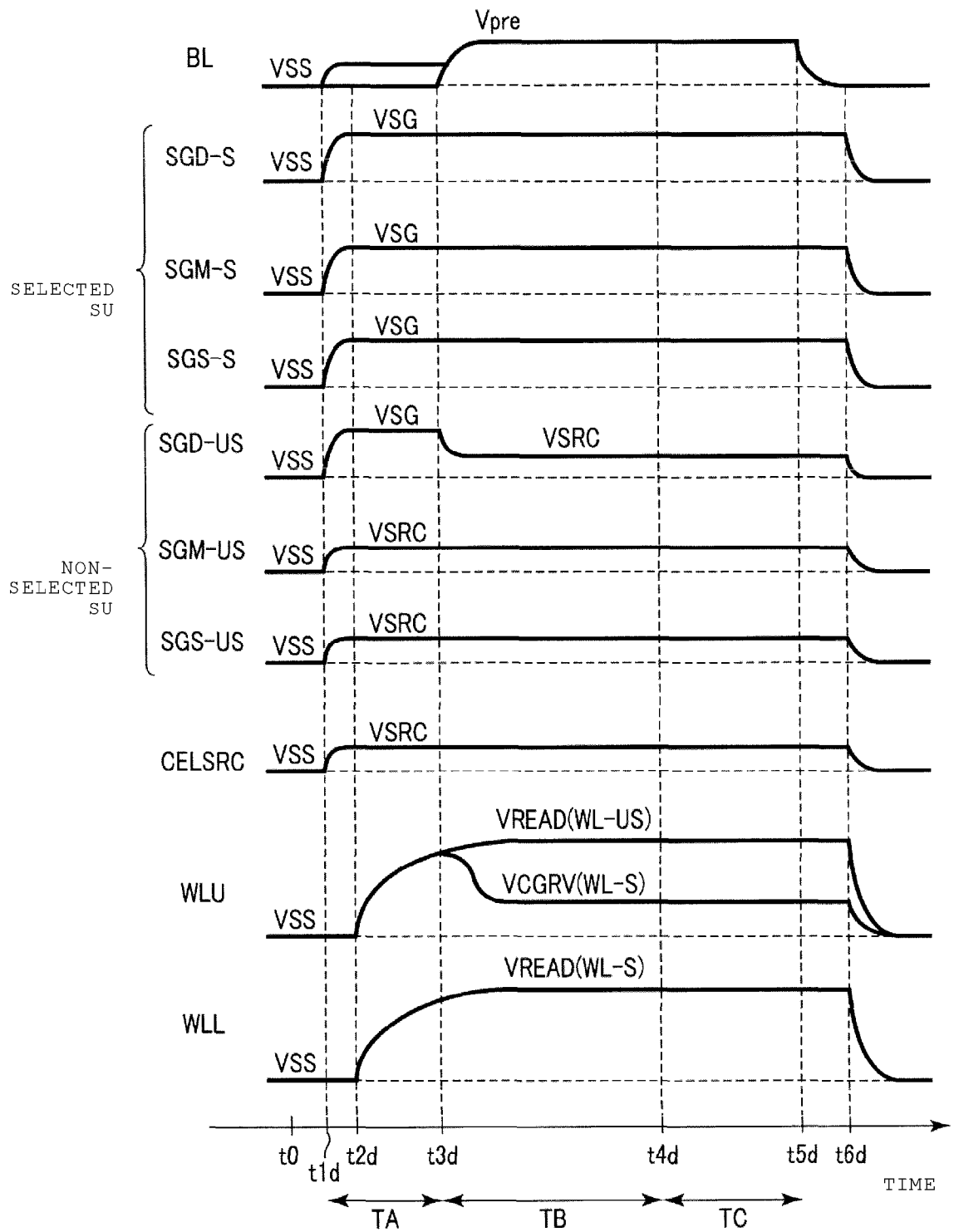
FIGS. 21-22 are each a timing chart illustrating an operation example of a memory device of a fifth embodiment.
Figure 22:
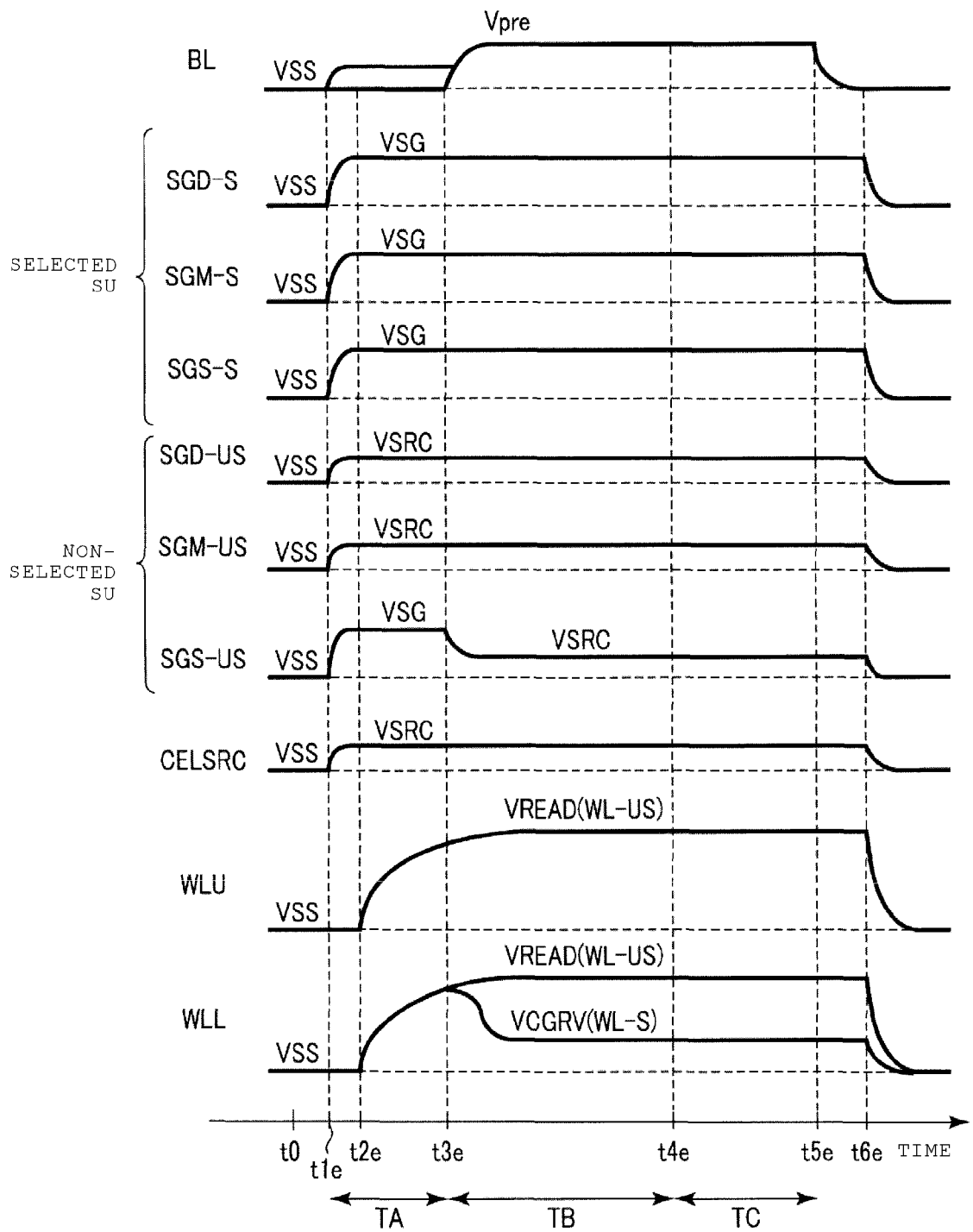

With reference to FIGS. 21 and 22, a memory device and a control method therefor according to a fifth embodiment will be explained. FIGS. 21 and 22 are diagrams illustrating voltage waveforms of the respective wirings during a read operation (or a verification operation) of a flash memory of the present embodiment.

During a data read operation of the flash memory, a voltage VSRC higher than the ground voltage VSS may be applied to the source line SL (CELSRC). Since the positive voltage VSRC is applied to the source line (and the well region), even if a part of a threshold voltage value distribution corresponding to data is present in a negative voltage region, a threshold voltage of the memory cell may be regarded as having a positive voltage value due to a relative potential relationship.

Hereinafter, in the read operation of the flash memory, an operation example of the flash memory of the present embodiment if a certain voltage VSRC (VSRC>VSS) is applied to the source line SL will be explained. In the present embodiment, a determination of a threshold voltage of each memory cell in the flash memory is performed by using the current sensing method.

Operation Example

Read Operation on Upper Array Layer

Time Point t1d

As illustrated in FIG. 21, at a time point t1d, the voltage VSG is applied to the drain side select gate lines SGD-S and SGD-US, and the source side select gate line SGS-S of a selected string unit.

In the present embodiment, the source line driver 15 applies the source line voltage VSRC to the source line SL (CELSRC). The voltage VSRC is higher than the ground voltage VSS. For example, the voltage VSRC is lower than the voltage VSG.

If the voltage VSRC is applied to the source line SL (CELSRC), the row control circuit 12 applies the voltage VSRC to the non-selected source side select gate line SGS-US and the non-selected intermediate select gate lines SGM-US of a non-selected string unit.

Since the voltage VSG is sufficiently higher than the voltage VSRC, even if the voltage VSRC is applied to the sources or the drains of the transistors ST1, ST2 and ST3, and the select transistors ST1, ST2 and ST3 of which the voltage VSG is applied to the gates are turned on. A voltage higher than the voltage VSG may be applied to the select gate lines SGD, SGS and SGM in consideration of application of the voltage VSRC.

For example, at the time point t1d, the sense amplifier unit 131 applies the voltage VSRC to the bit line BL. Since a potential of the bit line BL is set to be the same as a potential of the source line SL (CELSRC), a through-current can be prevented from flowing through the NAND string 111. However, in a period TA, a potential of the bit line BL may be set to the ground voltage VSS.

In the non-selected string unit, if the voltage VSRC is applied to the source or the drain of the transistor although the voltage VSRC is applied the gate thereof, the potentials of the gate and the source or the drain are substantially the same as each other, and thus the select transistors ST1, ST2 and ST3 are turned off.

Time Point T2d to Time Point T3d

At a time point t2d, voltages start to be applied to the word lines WLU and WLL. In the same manner as in the above-described embodiments, in the period TA, residual electric charge is released from the semiconductor pillars 75 to the bit line BL or the source line SL (CELSRC) via the turned-on select transistors ST1 and ST2. In the non-selected string unit, the semiconductor pillar 75A of the lower array layer 110A is electrically separated from the bit line BL and the source line SL (CELSRC) by turning off the select transistors ST2 and ST3.

At a time point t3d, among a plurality of word lines WLU and WLL, a potential of the selected word line WL-S of the upper array layer 110B is controlled to be set to the reading voltage VCGRV. A potential of the non-selected drain side select gate line SGD-US is reduced from the voltage VSG to the voltage VSRC.

In the period TA, if a potential of the bit line BL is set to the ground voltage VSS, the bit line BL starts to be charged at the time point t3d.

Time Point t4d to Time Point t6d

In a period TC from a time point t4d to a time point t5d, the generation of a current in the bit line BL is sensed. In the period TC, potentials of the source line SL (CELSRC) and the non-selected select gate lines SGD-US, SGM-US and SGS-US are maintained to be the voltage VSRC.

In the period TC, in the non-selected string unit, the semiconductor pillar 75A of the lower array layer 110A is subject to channel boosting, and thus a capacitance component between the word line WL and the semiconductor pillar 75A is scarcely generated. Therefore, a state of a threshold voltage of the memory cell is determined in a state in which a load caused by a parasitic capacitance of the semiconductor pillar 75A is reduced.

At a time point t5d, a potential of the bit line BL is set to the ground voltage VSS.

At a time point t6d, potentials of the word lines WLU and WLL, and potentials of the select gate lines SGD, SGM and SGS are set to the ground voltage VSS.

In a period from the time point t3d to the time point t6d, a potential of the source line SL (CELSRC), and potentials of the non-selected select gate lines SGD-US, SGM-US and SGS-US are maintained to be the voltage VSRC.

At the time point t6d, the source line driver 15 controls the source line CELSRC so as to set a potential of the source line SL (CELSRC) to the ground voltage VSS. The row control circuit 12 sets potentials of the non-selected select gate lines SGD-US, SGM-US and SGS-US to the ground voltage VSS.

Consequently, in the flash memory of the present embodiment, reading of data from the memory cell MC of the upper array layer 110B is finished.

Read Operation on Memory Cell of Lower Array Layer

With reference to FIG. 22, a data read operation on the memory cell of the lower array layer will be explained.

Time Point t1e

During a read operation on the lower array layer 110A, at a time point t1e, the voltage VSRC is applied to the source line SL (CELSRC), and the non-selected drain side select gate lines SGD-US and SGM-US of a non-selected string unit. The voltage VSG is applied to the non-selected source side select gate line SGS-US of the non-selected string unit.

Potentials of the select gate lines SGD-S, SGS-S and SGM-S of a selected string unit are controlled in the same manner as in the example illustrated in FIG. 21.

Time Point t2e to Time Point t3e

At a time point t2e, voltages start to be applied to the word lines WLU and WLL.

In a period TA, residual electric charge is released to the bit line BL or the source line SL (CELSRC) via the turned-on select transistors ST1, ST2 and ST3.

At a time point t3e, a potential of the selected word line WL-S of the lower array layer 110A is set to the reading voltage VCGRV, and a potential of the non-selected source side select gate line SGS-US is set to the voltage VSRC.

Time Point t4e to Time Point t6e

After the bit line BL is charged to the predetermined voltage Vpre, a current of the bit line BL is sensed in a period TC in the same manner as in the example illustrated in FIG. 21. In the period TC, the upper semiconductor pillar 75B of the non-selected string unit is subject to channel boosting, and thus a load caused by a capacitance component of the upper semiconductor pillar 75B is reduced.

Thereafter, at a time point t5e and a time point t6e, potentials of the respective wirings are set to the ground voltage VSS.

As mentioned above, reading of data from the memory cell of the lower array layer 110A in the flash memory of the present embodiment is finished.

An operation similar to the operation illustrated in FIG. 21 or 22 is also applied to a verification operation, and thus a state of a threshold voltage of a memory cell in a write operation can be determined.

As in the present embodiment, even if a read operation (or a verification operation) is performed in a state in which the voltage VSRC higher than the ground voltage is applied to the source line SL (CELSRC), the flash memory of the present embodiment can improve operation characteristics.

(6) Sixth Embodiment

Figure 23:
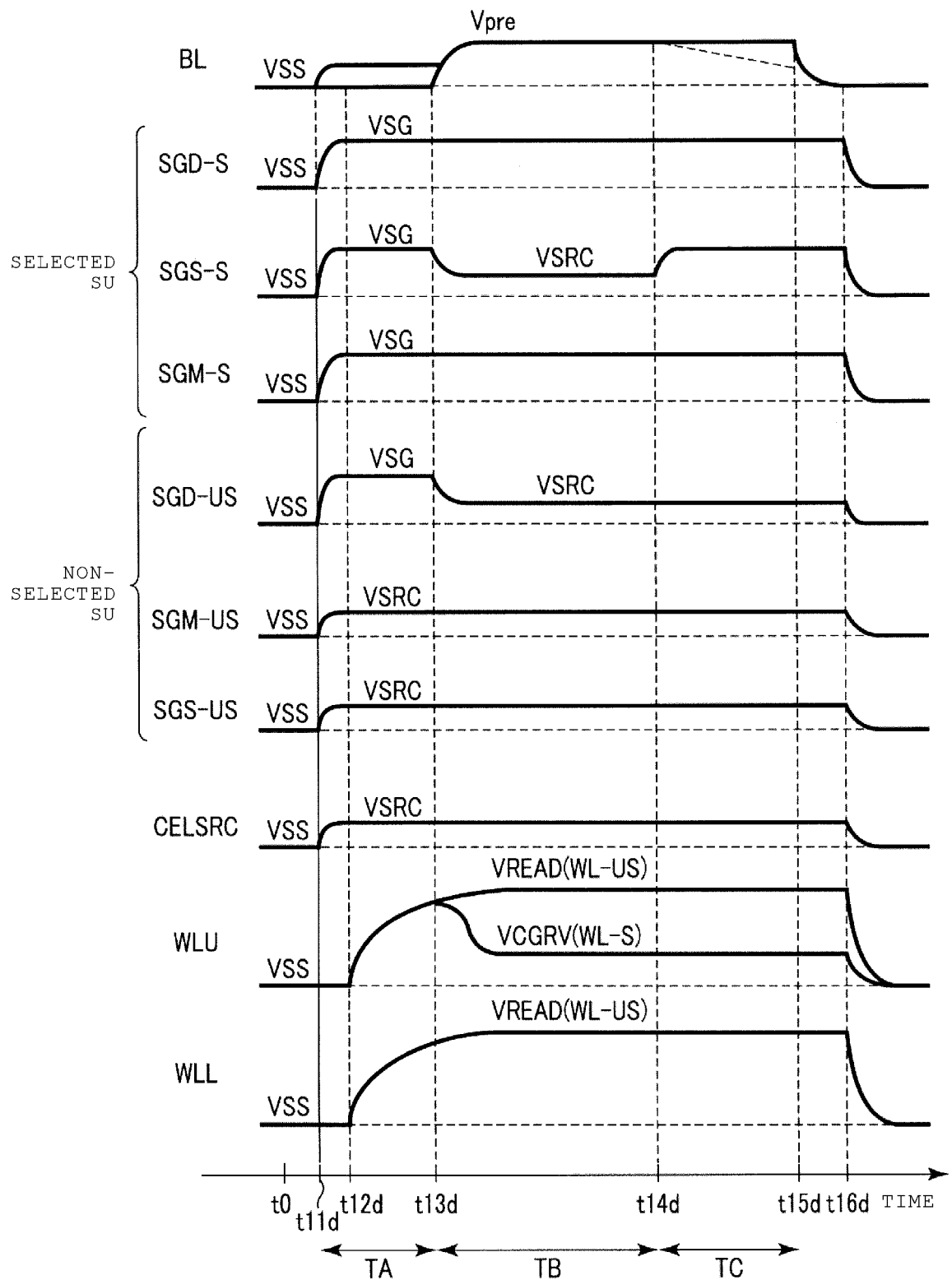
FIGS. 23-24 are each a timing chart illustrating an operation example of a memory device of a sixth embodiment.
Figure 24:
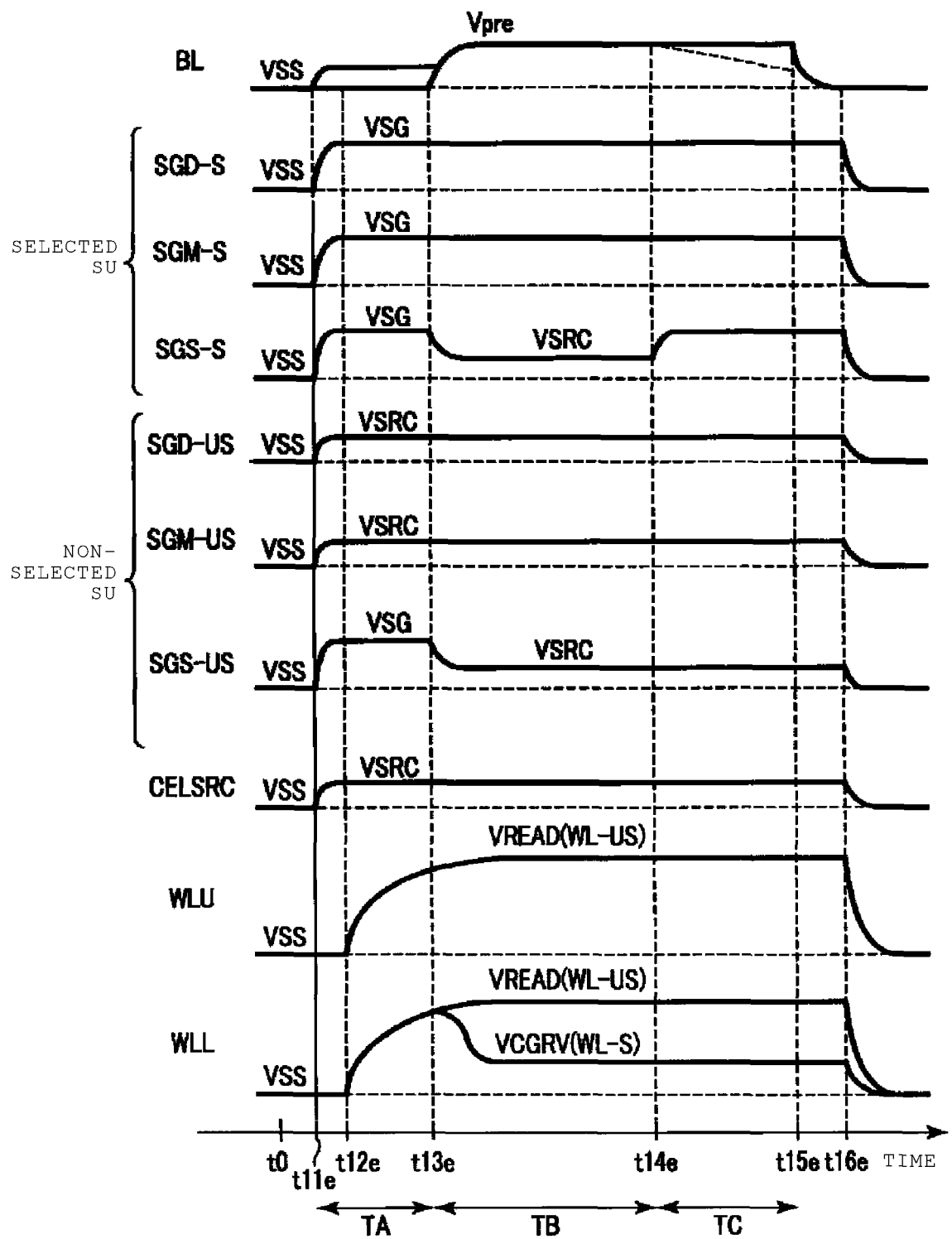

With reference to FIGS. 23 and 24, a memory device and a control method therefor according to a sixth embodiment will be explained. FIGS. 23 and 24 are diagrams illustrating voltage waveforms of the respective wirings during a read operation (or a verification operation) of a flash memory of the present embodiment.

If a read operation (or a verification operation) of the flash memory is performed according to the voltage sensing method, the voltage VSRC may be applied to the source line SL.

Hereinafter, a description will be made of an example in which the flash memory of the present embodiment performs a determination of a threshold voltage of a memory cell according to the voltage sensing method in a state in which the voltage VSRC is applied to the source line SL.

Operation Example

Read Operation on Upper Array Layer

With reference to FIG. 23, a read operation on a memory cell of the upper array layer according to the voltage sensing method in the flash memory of the present embodiment will be explained.

Time Point t11d to Time Point T12d

As illustrated in FIG. 23, at a time point t11d, the voltage VSG is applied to the drain side select gate lines SGD-S and SGD-US, the source side select gate line SGS-S, and non-selected the intermediate select gate lines SGM-US. In a non-selected string unit, the voltage VSRC is applied to the non-selected intermediate select gate lines SGM-US and the non-selected source side select gate line SGS-US.

The voltage VSRC is applied to the source line SL (CELSRC). For example, the voltage VSRC is applied to the bit line BL.

As described above, the select transistors ST1, ST2 and ST3 of a selected string unit are turned on, and the drain side select transistor ST1 of the non-selected string unit is turned on.

In a period TA (the time point t12d to a time point t13d), electric charge in the semiconductor pillars 75 is released to the bit line BL or the source line SL (CELSRC) via the turned-on select transistors ST1, ST2 and ST3.

Time Point t13d

At the time point t13d, the bit line BL starts to be charged.

A potential of the source side select gate line SGS-S is reduced from the voltage VSG to the voltage VSRC. Consequently, the select transistor ST2 connected to the source side select gate line SGS-S is turned off, and, in the selected string unit, the bit line BL and the semiconductor pillars 75 are charged in a state of being electrically separated from the source line SL (CELSRC).

A potential of the non-selected drain side select gate line SGD-US is reduced from the voltage VSG to the voltage VSRC, and thus the select transistor ST1 is turned off.

A potential of the selected word line WL-S of the upper array layer 110B is set to the reading voltage VCGRV.

Time Point t14d

At a time point t14d, in the selected string unit, a potential of the source side select gate line SGS-S is increased from the voltage VSRC to the voltage VSG. Consequently, the select transistor ST2 is turned on, and thus the lower semiconductor pillar 75A is electrically connected to the source line SL (CELSRC).

In a period TC, a potential of the bit line BL is sensed, and thus data held in the memory cell of the upper array layer 110B is read. In this case, in the non-selected string unit, the semiconductor pillar 75A of the lower array layer 110A is subject to channel boosting, and thus a capacitance component between the semiconductor pillar 75A and the word line WLL is reduced.

Time Point t15d and Time Point t16d

At a time point t15d, charging of the bit line BL is stopped, and a potential of the bit line BL is set to the ground voltage VSS.

At a time point t16d, potentials of the word lines WLU and WLL, and potentials of the selected select gate lines SGD-S, SGM-S and SGS-S are set to the ground voltage VSS. Potentials of the non-selected select gate lines SGD-US, SGM-US and SGS-US are set to the ground voltage VSS.

The source line driver 15 sets a potential of the source line SL (CELSRC) to the ground voltage VSS.

As mentioned above, reading of data from the memory cell of the upper array layer 110B in the flash memory of the present embodiment is finished.

Read Operation on Memory Cell of Lower Array Layer

With reference to FIG. 24, a read operation on a memory cell of the lower array layer according to the voltage sensing method in the flash memory of the present embodiment will be explained.

Time Point t11e and Time Point t12e

As illustrated in FIG. 24, at a time point t11e, the voltage VSG is applied not only to the respective select gate lines SGD-S, SGS-S and SGM-S of a selected string unit but also to the non-selected source side select gate line SGS-US of a non-selected string unit.

The voltage VSRC is applied to the non-selected drain side select gate line SGD-US and the non-selected intermediate select gate lines SGM-US.

In the same manner as in the example illustrated in FIG. 23, the voltage VSRC is applied to the source line SL (CELSRC) and the bit line BL.

In a period TA, electric charge in the semiconductor pillars 75 is released to the bit line BL or the source line SL (CELSRC) via the turned-on select transistors ST1, ST2 and ST3.

In this case, in the non-selected string unit SU, the upper semiconductor pillar 75B is electrically separated from the bit line BL and the lower semiconductor pillar 75A.

Time Point t13e

At a time point t13e, in order to charge the bit line BL and the semiconductor pillars 75, potentials of the source side select gate lines SGS-S and SGS-US are reduced from the voltage VSG to the voltage VSRC. Consequently, the source side select transistors ST2 are turned off.

The selected word line WL-S of the lower array layer 110A is reduced to the reading voltage VCGRV.

Time Point t14e to Time Point t16e

At a time point t14e, in the selected string unit, a potential of the source side select gate line SGS-S is increased from the voltage VSRC to the voltage VSG. Consequently, the select transistor ST2 is turned on, and thus the lower semiconductor pillar 75A is electrically connected to the source line SL (CELSRC).

A state of a potential of the bit line BL corresponding to turning-on and turning-off of a selected cell is sensed, and thus data held in the memory cell of the lower array layer 110A is read.

When the data held in the memory cell of the lower array layer 110A is read, in the non-selected string unit, the semiconductor pillar 75B of the upper array layer 110B is subject to channel boosting, and thus a capacitance component between the semiconductor pillar 75B and the word line WLU is reduced. As a result, a load current caused by the capacitance component between the word line and the upper semiconductor pillar is reduced.

In the same manner as in the example illustrated in FIG. 23, at a time point t15e and a time point t16e, the respective wirings are disabled.

As mentioned above, reading of data from the memory cell of the lower array layer 110A in the flash memory of the present embodiment is finished.

Even if a read operation is performed in a state in which the voltage VSRC higher than the ground voltage VSS is applied to the source line SL (CELSRC), the flash memory of the present embodiment can perform a read operation using the voltage sensing method.

As mentioned above, the flash memory of the present embodiment can improve operation characteristics in the same manner as in the above-described embodiments.

(7) Seventh Embodiment

Figure 25:
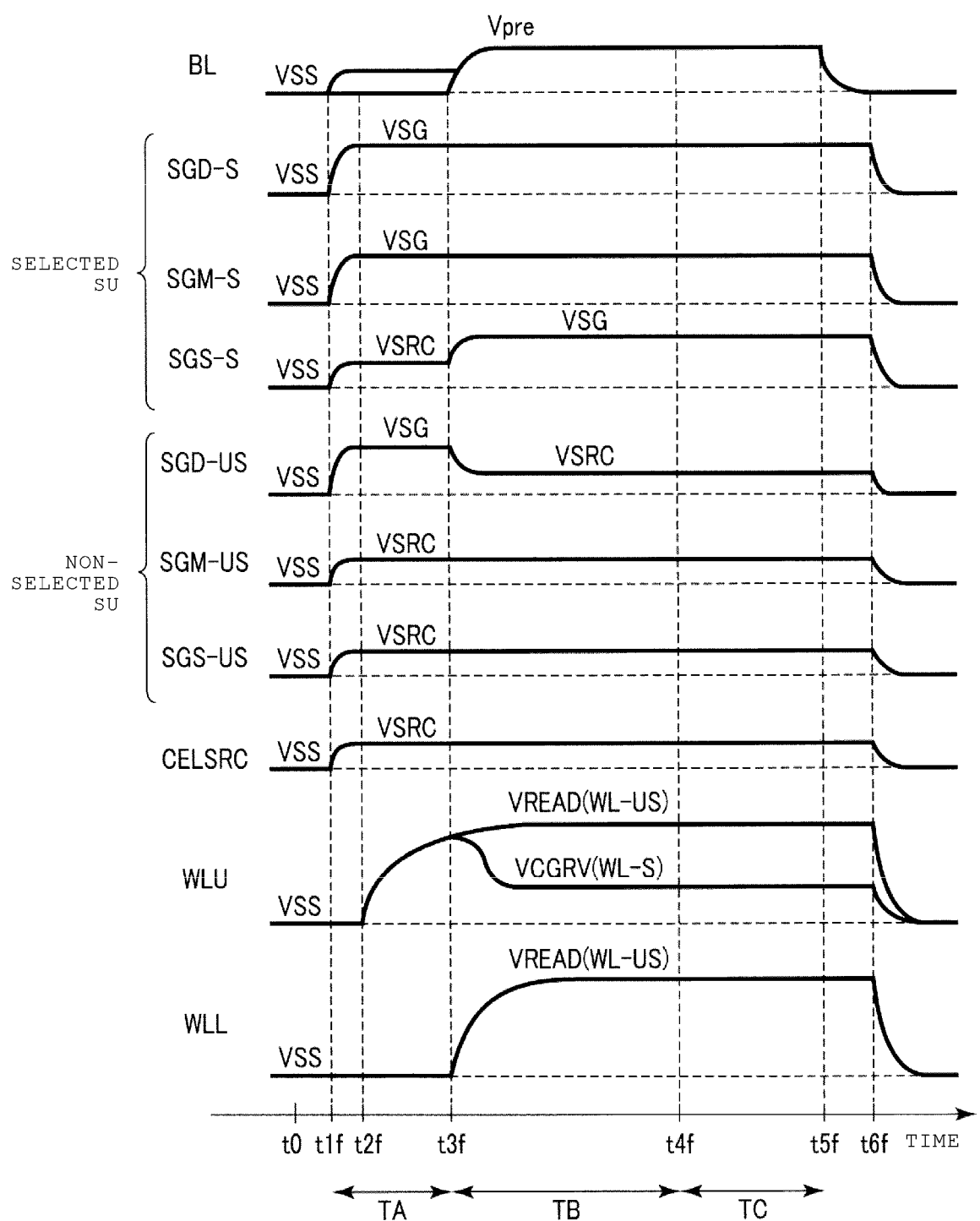
FIG. 25 is a timing chart illustrating an operation example of a memory device of a seventh embodiment.

With reference to FIG. 25, a memory device and a control method therefor according to a seventh embodiment will be explained. FIG. 25 is a diagram illustrating voltage waveforms of the respective wirings during a read operation (or a verification operation) of a flash memory of the present embodiment.

In a read operation of the flash memory using the current sensing method, timings for controlling a voltage of a word line may be different between an array layer including a selected word line and an array layer not including the selected word line even if data is read in a state in which the voltage VSRC is applied to the source line SL (CELSRC). Some word lines of a selected block are disabled during an initial operation, and thus an amount of a cell current generated in the selected block is reduced. As a result, the flash memory of the present embodiment can reduce power consumption.

Read Operation on Memory Cell of Upper Array Layer

With reference to FIG. 25, a read operation on a memory cell of the upper array layer according to the current sensing method in the flash memory of the present embodiment will be explained.

Time Point t1f

As illustrated in FIG. 25, at a time point t1f, the voltage VSG is applied to the drain side select gate lines SGD-S and SGD-US, and the intermediate select gate lines SGM-S. The voltage VSRC is applied to the source side select gate lines SGS-S and SGS-US, and the non-selected intermediate select gate lines SGM-US.

The voltage VSRC is applied to the source line SL (CELSRC) and the bit line BL. A potential of the gate of the transistor is substantially the same as a potential of the source or the drain thereof, and thus the select transistors ST2 and ST3 of which the voltage VSRC is applied to the gates are maintained to be turned off.

Time Point t2f

If the word line WLU of the upper array layer 110B is selected as a read operation target, a voltage starts to be applied to the word line WLU at a time point t2f.

A potential of the word line WLL of the lower array layer 110A is maintained to be ground voltage VSS. Since the memory cell of the lower array layer 110A is turned off, the source side select transistor ST2 may be turned off. In this case, at the time point t1f and the time point t2f, the voltage VSRC is applied to the source side select gate line SGS-S of a selected string unit.

Time Point t3f

At a time point t3f, the reading voltage VCGRV for the selected word line WL-S is controlled, and a voltage also starts to be applied to the word line (non-selected word line) WLL of the lower array layer 110A.

In the selected string unit, a potential of the source side select gate line SGS-S is increased from the voltage VSRC to the voltage VSG.

In a non-selected string unit, a potential of the non-selected drain side select gate line SGD-US is reduced from the voltage VSG to the voltage VSRC. Consequently, the drain side select transistor ST1 of the non-selected string unit is turned off.

In a period TA from the time point t2f to the time point t3f, residual electric charge is released from the semiconductor pillars 75 to the bit line BL via the turned-on transistors ST1 and ST3 and memory cell MC. In the period TA, a potential of the word line WLL of the lower array layer 110A is set to the ground voltage VSS, and thus the memory cell MC is turned off. The semiconductor pillar 75B of the upper array layer 110B is electrically separated from the source line SL (CELSRC). In the period TA, even if a potential of the selected source side select gate line SGS-S is set to the voltage VSRC, an adverse effect on removal of residual electric charge in the semiconductor pillar 75B scarcely occurs.

Time point t4f to time point t6f After the bit line BL is charged in a period TB, in a period TC from a time point t4f to a time point t5f, the generation of a current in the bit line BL is sensed in a state in which a capacitance component (load) of the lower semiconductor pillar 75A of the non-selected string unit is reduced.

Thereafter, potentials of the respective wirings are set to the ground voltage VSS.

Consequently, reading of data from the memory cell of the upper array layer 110B in the flash memory of the present embodiment is finished.

If the word line WLL of the lower array layer 110A is selected as a reading target, potentials of the bit line BL, the source line SL (CELSRC), and the respective select gate lines SGS, SGD and SGM are controlled in the same manner as in the example illustrated in FIG. 22.

However, in the present embodiment, control of voltages for the word lines WLL and WLU are different from the control in the example illustrated in FIG. 25. A voltage starts to be applied to the word line WLL of the lower array layer 110A at the time point t2f in FIG. 25. Application of the reading voltage VCGRV to the selected word line WL-S and application of a voltage to the word line WLU of the upper array layer 110B are started at the time point t3f in FIG. 25.

As mentioned above, a read operation on the memory cell of the lower array layer 110A is performed.

As mentioned above, as illustrated in FIG. 25, even if application of a voltage to each wiring is controlled, a release process on residual electric charge in a semiconductor pillar of a selected block can be performed, and thus a capacitance component of a non-selected string unit can be reduced when data is read.

Therefore, the flash memory of the present embodiment can improve operation characteristics in the same manner as in the above-described embodiments.

(8) Eighth Embodiment

Figure 26:
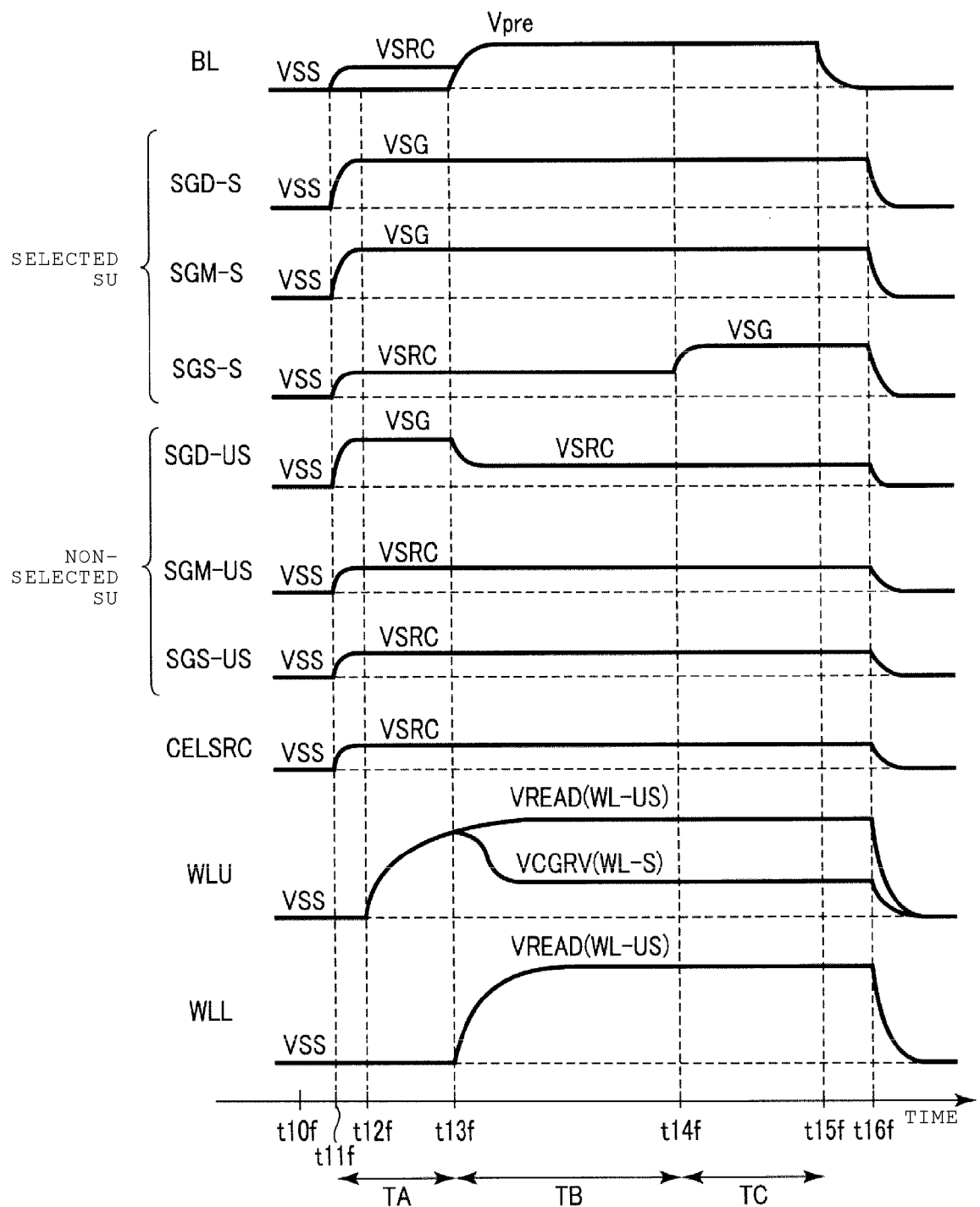
FIG. 26 is a timing chart illustrating an operation example of a memory device of an eighth embodiment.

With reference to FIG. 26, a memory device and a control method therefor according to an eighth embodiment will be explained. FIG. 26 is a diagram illustrating voltage waveforms of the respective wirings during a read operation (or a verification operation) of a flash memory of the present embodiment.

In a read operation of the flash memory using the voltage sensing method, timings for controlling a voltage of a word line may be different between an array layer including a selected word line and an array layer not including the selected word line even if data is read in a state in which the voltage VSRC is applied to the source line SL.

Operation Example

Read Operation on Memory Cell of Upper Array Layer

With reference to FIG. 26, a read operation on a memory cell of the upper array layer according to the voltage sensing method in the flash memory of the present embodiment will be explained.

Time Point t11f and Time Point t12f

As illustrated in FIG. 26, in the same manner as in the above-described example (for example, the example illustrated in FIG. 23), at a time point t11f, potentials of the select gate lines SGD, SGS and SGM, the bit line BL, and the source line SL (CELSRC) start to be controlled. A potential of the source side select gate line SGS-S of a selected string unit is set to the voltage VSRC.

Thereafter, if the word line WLU of the upper array layer 110B is selected, at the time point t11f, a voltage starts to be applied to the word line WLU of the upper array layer 110B. A potential of the word line WLL of the lower array layer 110A is maintained to be ground voltage VSS.

Since the memory cell of the lower array layer 110A is turned off, the upper semiconductor pillar 75B is not connected to the source line SL (CELSRC). Therefore, in the selected string unit, a potential of the source side select gate line SGS-S may be set to the voltage VSRC so that the select transistor ST2 is turned off.

In a period TA, residual electric charge is released to the bit line BL from the semiconductor pillars 75 via the turned-on transistors.

Time Point t13f

At the time point t13f, the bit line BL starts to be charged. A potential of the non-selected drain side select gate line SGD-US of a non-selected string unit is reduced from the voltage VSG to the voltage VSRC.

The reading pass voltage VREAD is applied to the word line WLL of the lower array layer 110A. A potential of the selected word line WL-S of the upper array layer 110B is reduced to the reading voltage VCGRV.

Time Point t14f to Time Point t16f

After a period TB elapses, at a time point t14f, in the selected string unit, a potential of the source side select gate line SGS-S is increased from the voltage VSRC to the voltage VSG. Consequently, in the selected string unit, the select transistor ST2 is turned on, and thus the semiconductor pillar 75A is electrically connected to the source line SL (CELSRC).

In a period TC, a state of a potential of the bit line BL is sensed in a state in which the lower semiconductor pillar 75A of the non-selected string unit is subject to channel boosting. Thus, data held in the memory cell is read. In the period TC, potentials of the select gate lines SGD-US, SGM-US and SGS-US of the non-selected string unit are maintained to be the voltage VSRC.

Thereafter, at a time point t15f and a time point t16f, potentials of the respective wirings are set to the ground voltage VSS.

As mentioned above, the data read operation on the memory cell of the upper array layer 110B is completed.

Read Operation on Lower Array Layer

If the word line WLL of the lower array layer 110A is selected as a reading target, potentials of the bit line BL, the source line SL (CELSRC), and the respective select gate lines SGS, SGD and SGM are controlled in the same manner as in the example illustrated in FIG. 24.

However, in the present embodiment, control of voltages for the word lines WLL and WLU are different from the control in the example illustrated in FIG. 26. A voltage starts to be applied to the word line WLL of the lower array layer 110A at the time point t12f in FIG. 26. Application of the voltage VCGRV to the selected word line WL-S and application of a voltage to the word line WLU of the upper array layer 110B are started at the time point t13f in FIG. 26.

As mentioned above, a data read operation on the memory cell of the lower array layer 110A is performed.

As illustrated in FIG. 26, even if application of a voltage to each wiring is controlled, a release process on residual electric charge in a semiconductor pillar of a selected block can be performed, and thus a capacitance component of a non-selected string unit and a load caused by the capacitance component can be reduced when data is read.

Therefore, the flash memory of the present embodiment can improve operation characteristics in the same manner as in the above-described embodiments.

(9) Ninth Embodiment

Figure 27:
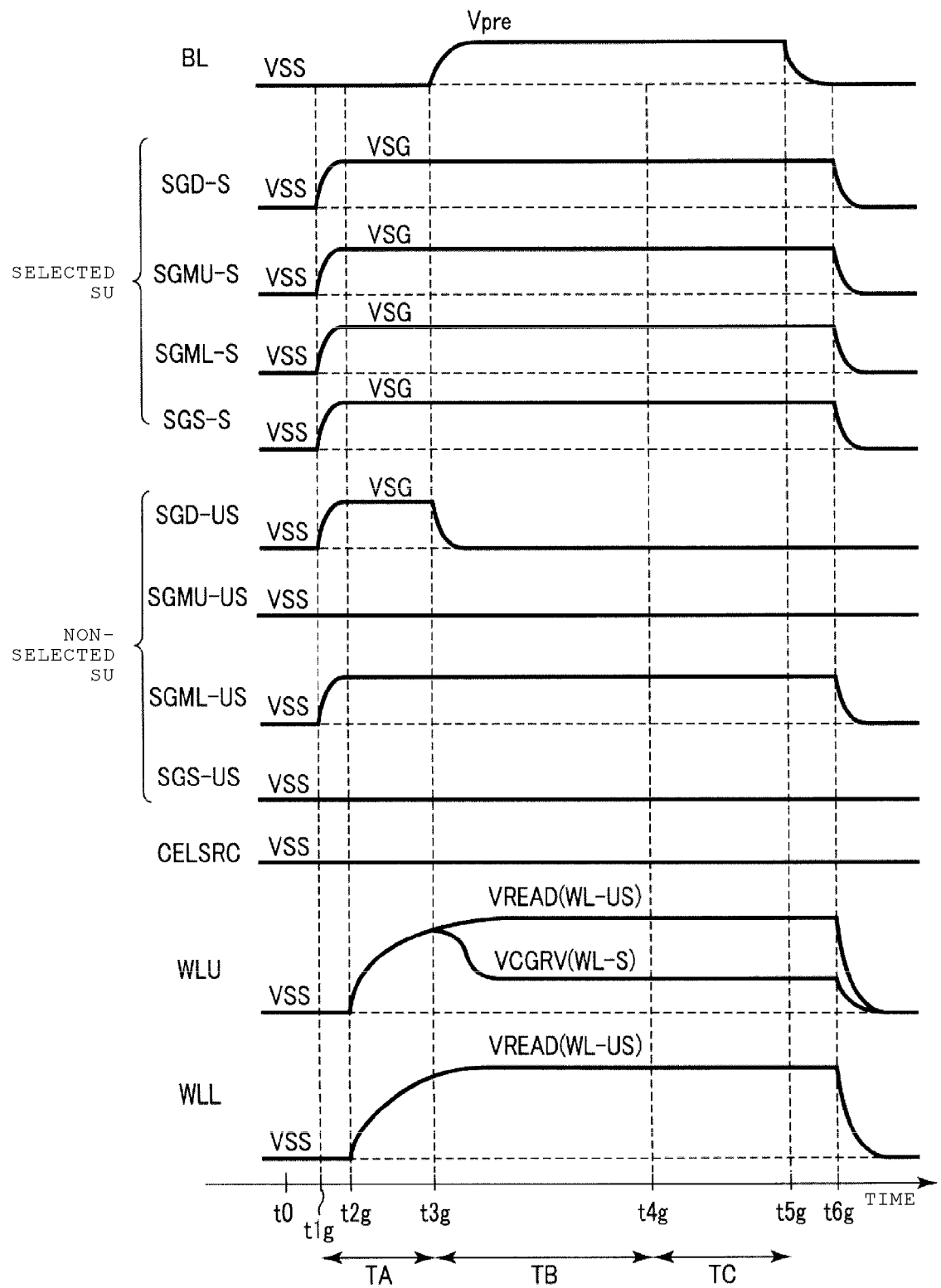
FIGS. 27-28 are each a timing chart illustrating an operation example of a memory device of a ninth embodiment.
Figure 28:
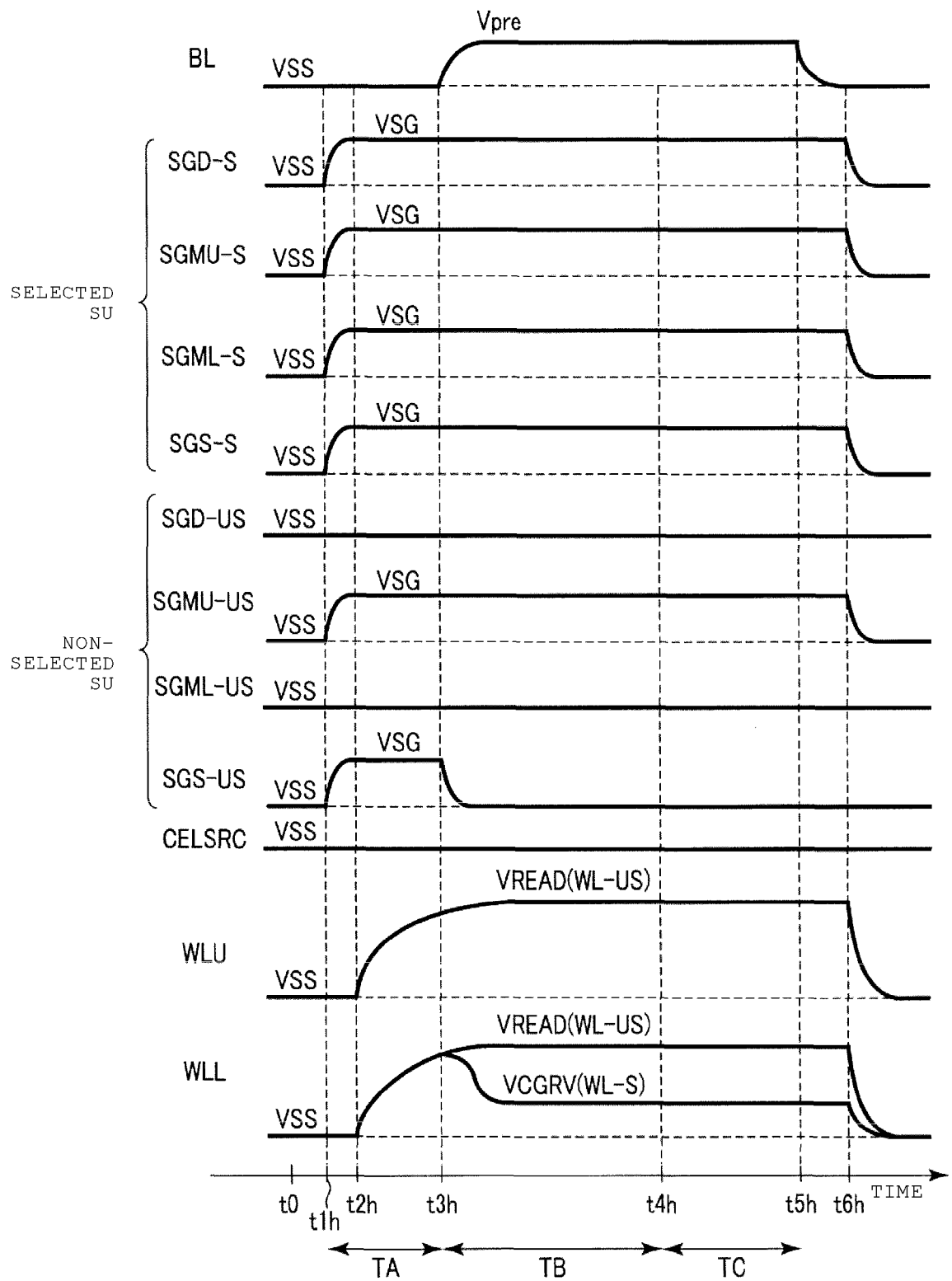

With reference to FIGS. 27 and 28, a memory device and a control method therefor according to a ninth embodiment will be explained.

As illustrated in FIGS. 27 and 28, the lower array layer 110A and the upper array layer 110B respectively include intermediate select gate lines SGMU and SGML. In this case, a potential of the intermediate select gate line SGM of the lower array layer 110A and a potential of the intermediate select gate line SGM of the upper array layer 110B may be controlled separately from each other.

Hereinafter, For clarity purpose, the intermediate select gate line of the lower array layer 110A is referred to as a lower intermediate select gate line SGML (SGML-S or SGML-US), and the intermediate select gate line of the upper array layer 110B is referred to as an upper intermediate select gate line SGMU (SGMU-S or SGMU-US).

Operation Example

Hereinafter, with reference to FIGS. 27 and 28, an operation example of the flash memory of the present embodiment will be described. For example, in the present embodiment, the flash memory performs a read operation according to the current sensing method.

Read Operation on Upper Array Layer

FIG. 27 is a voltage waveform diagram for explaining reading of data from a memory cell of the upper array layer in a read operation of the flash memory of the present embodiment.

Time Point t1g

As described above, at a time point t0, the sequencer 19 starts a read operation. One of a plurality of word lines WLU of the upper array layer 110B is set as a selected word line WL-S based on a selection address.

As illustrated in FIG. 27, at a time point t1g, the row control circuit 12 applies the voltage VSG to the select gate lines SGD-S, SGS-S, SGMU-S and SGML-S of a selected string unit.

With respect to a non-selected string unit, the row control circuit 12 applies the voltage VSG to the non-selected drain side select gate line SGD-US, and applies the ground voltage VSS to the non-selected source side select gate line SGS-US.

In the present embodiment, if data reading on the memory cell of the upper array layer 110B is performed, the row control circuit 12 applies the ground voltage VSS to the intermediate select gate line SGMU-US of the upper array layer 110B including the selected word line WL-S of the two intermediate select gate lines SGMU-US and SGML-US, and applies the voltage VSG to the intermediate select gate line SGML-US of the lower array layer 110A, with respect to each of the non-selected string units.

Consequently, in the non-selected string unit, the select transistor ST3U connected to the intermediate select gate line SGMU-US is turned off, and the select transistor ST3L connected to the intermediate select gate line SGML-US is turned on. The turned-off select transistor ST3U is included in the same array layer 110B as the selected word line WL-S, and the turned-on intermediate select transistor ST3L is included in the array layer 110A differently from the selected word line WL-S.

Time Point t2g to Time Point t3g

At a time point t2g, voltages start to be applied to the word lines WLU and WLL. In a period TA, electric charges in the semiconductor pillars 75A and 75B of the selected string unit and electric charge in the upper semiconductor pillar 75B of the non-selected string unit are released to the bit line BL or the source line SL (CELSRC) via the turned-on select transistors.

At a time point t3g, the bit line BL starts to be charged. Among the word lines WLU, the selected word line WL-S is controlled so that a potential of the selected word line WL-S is set to the reading voltage VCGRV.

In the non-selected string unit, a potential of the non-selected drain side select gate line SGD-US is reduced from the voltage VSG to the ground voltage VSS.

Time Point t4g to Time Point t6g

After the potential of the selected word line WL-S reaches the reading voltage VCGRV, at a time point tog, a current of the bit line BL is sensed in a state in which a part (here, the lower semiconductor pillar 75A) of the semiconductor pillars 75 of the non-selected string unit is subject to channel boosting. In the present embodiment, in the same manner as in the above-described example, a load caused by a capacitance component of the semiconductor pillar is reduced, and thus data held in the memory cell is determined.

Thereafter, at a time point t5g and a time point t6g, potentials of the respective wirings are set to the ground voltage VSS through control of the potentials of the respective wirings.

As mentioned above, reading of data from the memory cell of the upper array layer in the flash memory of the present embodiment is finished.

Read Operation on Memory Cell of Lower Array Layer

FIG. 28 is a voltage waveform diagram for explaining reading of data from a memory cell of the lower array layer in a read operation of the flash memory of the present embodiment.

Time Point t1h

In the same manner as in the example illustrated in FIG. 27, at a time point t0, the sequencer 19 starts a read operation. One of a plurality of word lines WLL of the lower array layer 110A is set as a selected word line WL-S based on a selection address.

At a time point t1h, the row control circuit 12 applies the voltage VSG to the select gate lines SGD-S, SGS-S, SGMU-S and SGML-S of a selected string unit.

With respect to a non-selected string unit, the ground voltage VSS is applied to the non-selected drain side select gate line SGD-US, and the voltage VSG is applied to the non-selected source side select gate line SGS-US.

If data reading on the memory cell of the lower array layer 110A is performed, unlike in the example illustrated in FIG. 27, the voltage VSG is applied to the intermediate select gate line SGMU-US of the upper array layer 110B, and the ground voltage VSS is applied to the intermediate select gate line SGML-US of the lower array layer 110A including the selected word line, with respect to each of the non-selected string units.

Consequently, in the non-selected string unit, the select transistor ST3U of the upper array layer 110B is turned on, and the select transistor ST3L of the lower array layer 110A is turned off. The turned-on select transistor ST3U is included in the array layer 110B differently from the selected word line, and the turned-off intermediate select transistor ST3L is included in the same array layer 110A as the selected word line WL-S.

Time point t2h to time point t3h At a time point t2h, voltages start to be applied to the word lines WLU and WLL.

In a period TA, an electric charge in the semiconductor pillars 75 is released to the bit line BL or the source line SL (CELSRC).

At a time point t3h, the bit line BL starts to be charged. The selected word line WL-S of the lower array layer 110A is controlled to be set to the reading voltage VCGRV. In the non-selected string unit, a potential of the non-selected source side select gate line SGS-US is reduced from the voltage VSG to the ground voltage VSS.

Time point t4h to time point t6h After the potential of the selected word line WL-S reaches the reading voltage VCGRV, at a time point t4h, a current of the bit line BL is sensed. Consequently, a load caused by a capacitance component of the semiconductor pillar is reduced, and, in this state, data held in the memory cell is determined.

Thereafter, at a time point t5h and a time point t6h, potentials of the respective wirings are set to the ground voltage VSS through control of the potentials of the respective wirings.

Consequently, reading of data on the lower array layer in the flash memory of the present embodiment is finished.

The operations illustrated in FIGS. 27 and 28 may be applied to a verification operation.

In the present embodiment, in the read operations illustrated in FIGS. 27 and 28, a potential of the source line SL (CELSRC) may be set to the voltage VSRC higher than the ground voltage VSS in the same manner as in the examples illustrated in FIGS. 21 and 22. In the present embodiment, timings of applying a voltage to the word lines WL may differ between the lower array layer 110A and the upper array layer 110B according to an array layer including the selected word line WL-S in the same manner as in the examples illustrated in FIGS. 19 and 25.

Summary

In the flash memory of the present embodiment, a plurality of intermediate select gate lines of a string unit can be controlled separately from each other.

In the period TA in which residual electric charge in the semiconductor pillar is released during the read operation, among the plurality of intermediate select gate lines of a non-selected string unit, the ground voltage VSS is applied to the intermediate select gate line SGML of an array layer including a selected word line, and the voltage (a voltage for turning on the transistor ST3) VSG is applied to the intermediate select gate line of an array layer not including the selected word line.

The flash memory of the present embodiment can cause a region (a region near the junction) between the two intermediate select gate lines to be subject to channel boosting by turning on the select transistor ST3 connected to the select gate lines SGM corresponding to one of the two intermediate select gate lines SGML and SGMU. Consequently, the flash memory of the present embodiment can further reduce a load caused by a parasitic capacitance of the semiconductor pillar.

In the junction of the stacked semiconductor pillars 75A and 75B, a distance between the lowermost conductive layer of the upper array layer 110B and the uppermost conductive layer of the lower array layer 110A is longer than a distance (gap) between the word lines adjacent to each other in the same array layer. The upper end of the semiconductor pillar is different from the lower end of the semiconductor pillar due to a manufacturing process, and thus a shape around the junction 999 is not uniform. Thus, a relatively large potential gradient may easily occur near the junction 999. There is a probability that a hot carrier may be generated in the junction 999 due to this potential gradient.

The hot carrier generated in the junction 999 hardly reaches an array layer including a selected word line since the transistor ST3 connected to the select gate line SGM of the array layer 110 including the selected word line WL-S is turned off, and a length of the junction 999 between the stacked intermediate select gate lines SGM is relatively large.

As a result, the flash memory of the present embodiment can prevent hot carrier generation type reading disturbance.

As mentioned above, the flash memory of the present embodiment can improve operation characteristics.

(10) Tenth Embodiment

Figure 29:
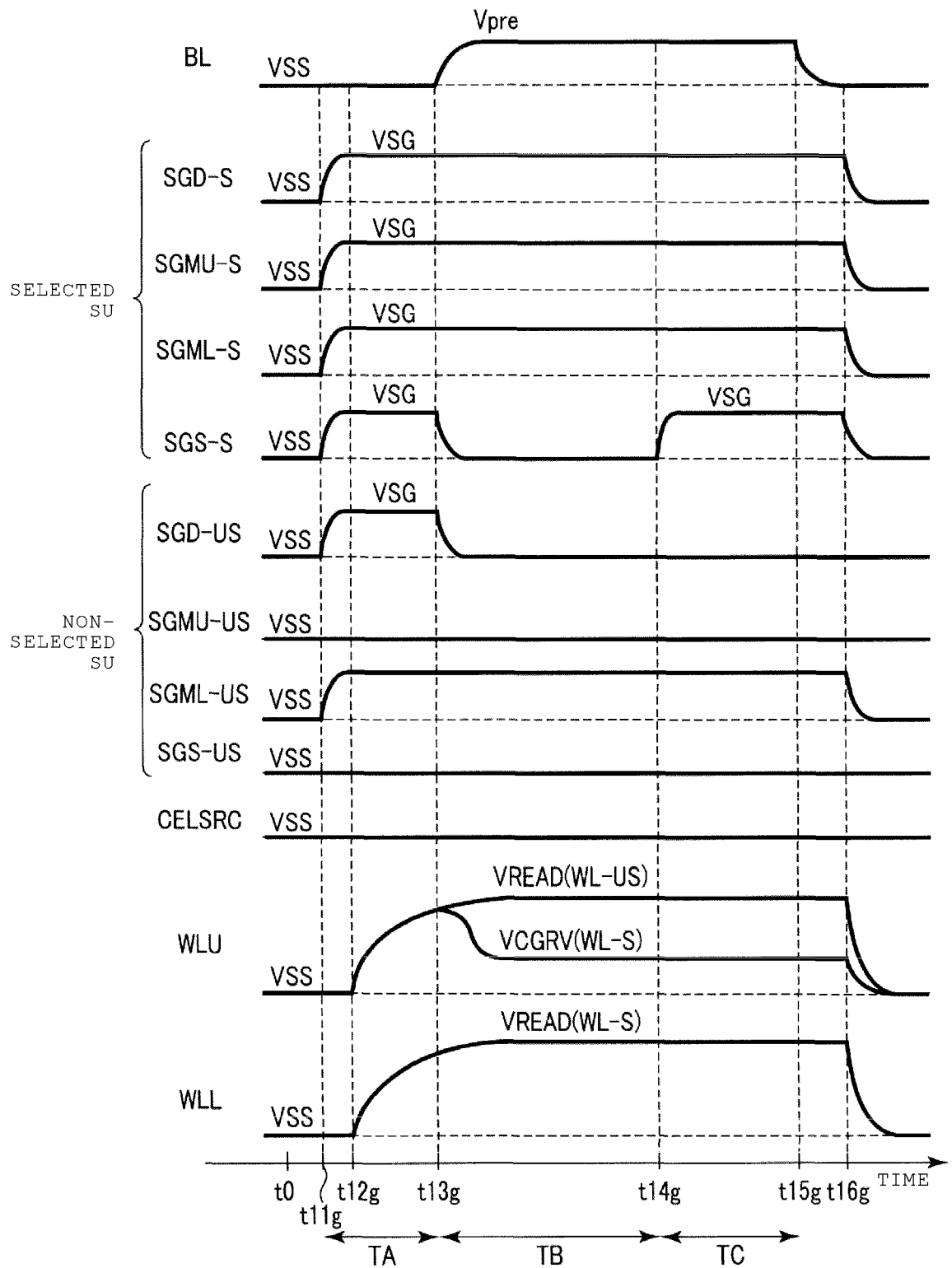
FIGS. 29-30 are each a timing chart illustrating an operation example of a memory device of a tenth embodiment.
Figure 30:
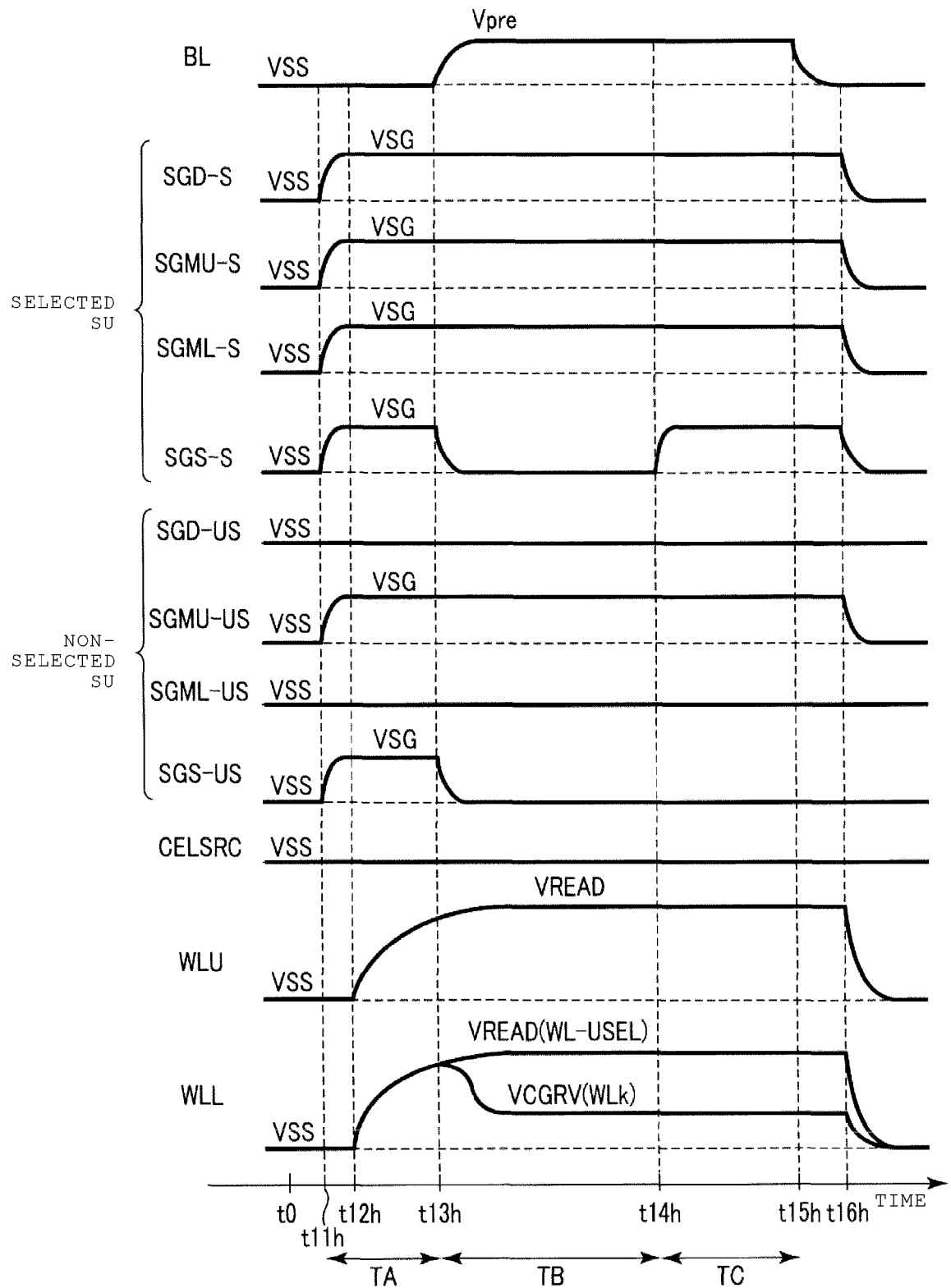

With reference to FIGS. 29 and 30, a memory device and a control method therefor according to a tenth embodiment will be explained.

In the flash memory performing a read operation using the voltage sensing method, the intermediate select gate line SGMU of the upper array layer 110B and the intermediate select gate line SGML of the lower array layer 110A may be controlled separately from each other.

Operation Example

Read Operation on Upper Array Layer

FIG. 29 is a voltage waveform diagram for explaining reading of data from a memory cell of the upper array layer in a read operation of the flash memory of the present embodiment.

Time Point t11g

As illustrated in FIG. 28, when a read operation is started (time point t0), a word line WLU of the upper array layer 110B is set as a selected word line WL-S based on a selection address.

At a time point t11g, the row control circuit 12 applies the voltage VSG to the select gate lines SGD-S, SGS-S, SGMU-S and SGML-S of a selected string unit.

With respect to a non-selected string unit, the voltage VSG is applied to the non-selected drain side select gate line SGD-US, and the ground voltage VSS is applied to the non-selected source side select gate line SGS-US.

In the present embodiment, with respect to the non-selected string unit, the ground voltage VSS is applied to the intermediate select gate line SGMU-US of the upper array layer 110B, and the voltage VSG is applied to the intermediate select gate line SGML-US of the lower array layer 110A.

Consequently, in the non-selected string unit, the select transistor ST3U of the array layer 110A including the selected word line WL-S is turned off, and the select transistor ST3L of the array layer 110B not including the selected word line WL-S is turned on.

Time point t12g to time point t13g

At a time point t12g, voltages start to be applied to the word lines WLU and WLL.

After electric charge is released in a period TA, at a time point t13g, the bit line BL starts to be charged. The selected word line WL-S of the upper array layer 110B is controlled so that a potential of the selected word line WL-S is set to the reading voltage VCGRV. A potential of the source side select gate line SGS-S is reduced from the voltage VSG to the ground voltage VSS.

In the non-selected string unit, a potential of the drain side select gate line SGD-US is reduced from the voltage VSG to the ground voltage VSS. A potential of the intermediate select gate line SGML-US is maintained to be the voltage VSG. Time point t14g to time point t16g After the potential of the selected word line WL-S reaches the reading voltage VCGRV, at a time point t14g, the voltage VSG is applied to the source side select gate line SGS-S in the selected string unit. The lower semiconductor pillar 75A is applied to the source line SL (CELSRC) via the turned-on select transistor ST2. A potential of the bit line BL is sensed. As mentioned above, data held in the memory cell is determined in a state in which the lower semiconductor pillar 75A of the non-selected string unit is subject to channel boosting.

Thereafter, in the same manner as in the above-described operation examples, at a time point t15g and a time point t16g, potentials of the respective wirings are set to the ground voltage VSS through control of the potentials of the respective wirings.

As mentioned above, reading of data from the memory cell of the upper array layer 110B in the flash memory of the present embodiment is finished.

Read Operation on Memory Cell of Lower Array Layer

FIG. 30 is a voltage waveform diagram for explaining reading of data from a memory cell of the lower array layer 110A in a read operation of the flash memory of the present embodiment.

Time Point t11h

In the same manner as in the example illustrated in FIG. 29, at a time point to, a word line WLL of the lower array layer 110A is set as a selected word line WL-S based on a selection address.

At a time point t11h, the voltage VSG is applied to the select gate lines SGD-S, SGS-S, SGMU-S and SGML-S of a selected string unit.

With respect to a non-selected string unit, the ground voltage VSS is applied to the drain side select gate line SGD-US, and the voltage VSG is applied to the non-selected source side select gate line SGS-US. If data reading on the memory cell of the lower array layer 110A is performed, unlike in the example illustrated in FIG. 29, the voltage VSG is applied to the intermediate select gate line SGMU-US, and the ground voltage VSS is applied to the intermediate select gate line SGML-US, with respect to each of the non-selected string units.

Consequently, in the non-selected string unit, the select transistor ST3U of the upper array layer 110B is turned on, and the select transistor ST3L of the lower array layer 110A including the selected word line WL-S is turned off.

Time point t12h to time point t13h At a time point t12h, voltages start to be applied to the word lines WLU and WLL.

After residual electric charge in the semiconductor pillars is released, at a time point t13h, the bit line BL starts to be charged, and the selected word line WL-S of the lower array layer 110A is controlled to be set to the reading voltage VCGRV.

In the selected and non-selected string units, potentials of the source side select gate lines SGS-S and SGS-US are set to the ground voltage VSS.

Time point t14h to time point t16h At a time point t14h, the potential of the selected word line WL-S reaches the reading voltage VCGRV, and then a potential of the source side select gate line SGS-S is set to the voltage VSG.

A potential of the bit line BL is sensed in a state in which the upper semiconductor pillar 75B of the non-selected string unit is subject to the channel boosting. Consequently, data held in the memory cell is determined.

Thereafter, at a time point t15h and a time point t16h, potentials of the respective wirings are set to the ground voltage VSS through control of the potentials of the respective wirings.

Consequently, reading of data on the lower array layer in the flash memory of the present embodiment is finished.

As in the present embodiment, even if the flash memory performs a read operation using the voltage sensing method, the flash memory of the present embodiment can achieve the same effect as the effect in the ninth embodiment.

The control of a timing of enabling a non-selected word line as in FIGS. 20 and 26, and the control of a potential of the source line as in FIGS. 23 and 24 may be applied to the flash memory of the present embodiment.

(11) Modification Examples

With reference to FIGS. 31 to 34, modification examples of the memory devices and the control methods therefor according to the embodiments will be explained.

(a) Modification Example 1

Structure Example

Figure 31:
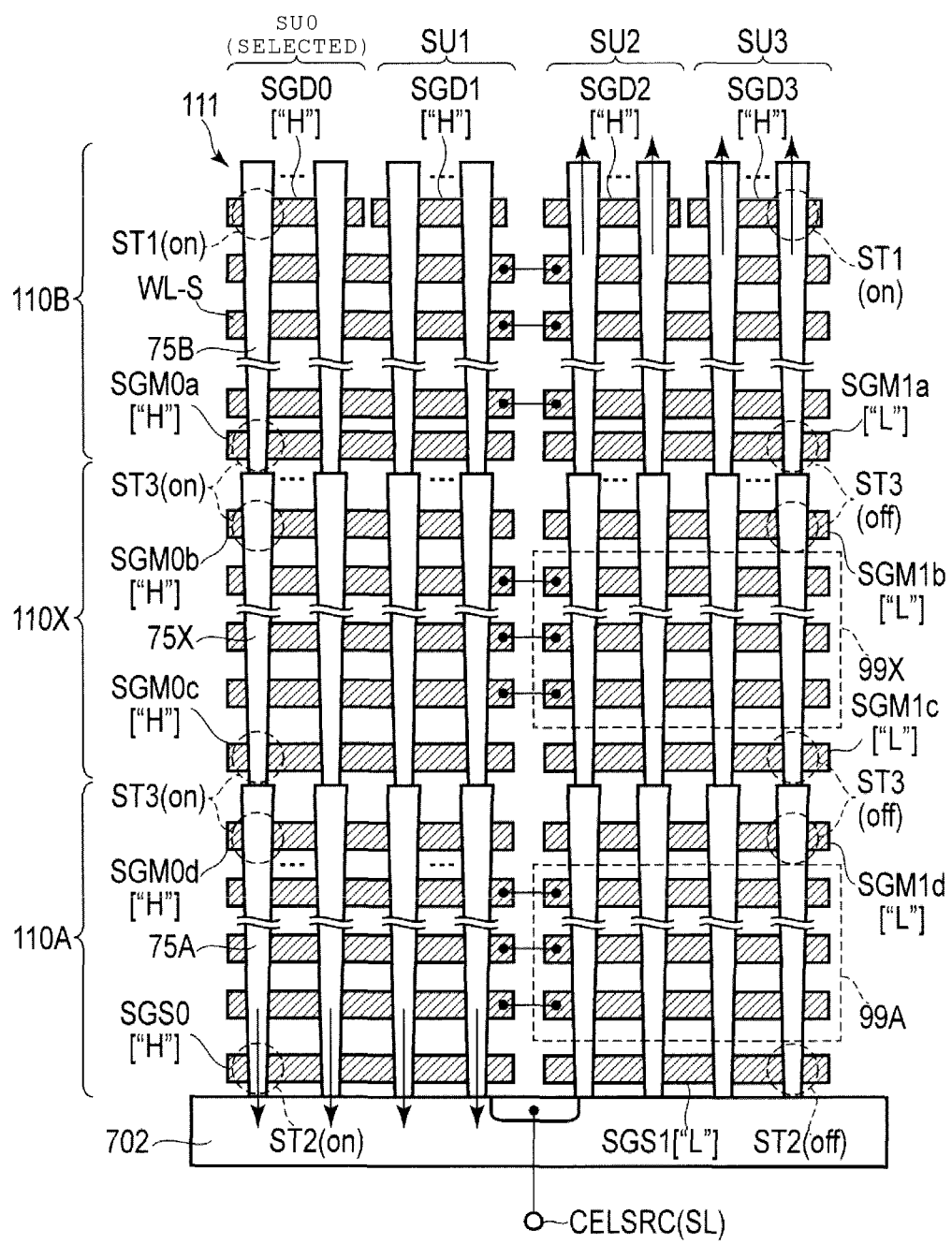
FIG. 31 is a diagram illustrating a modification example of the memory device of the embodiment.

FIG. 31 is a schematic sectional view for explaining a structure of a flash memory according to a modification example of the embodiments.

As illustrated in FIG. 31, in a memory cell array of the flash memory according to the modification example, a block may include three or more array layers 110A, 110B and 110X.

The three array layers 110A, 110B and 110X are stacked in a vertical direction to a surface of a substrate. The array layer 110X provided between the lower array layer 110A and the upper array layer 110B will be referred to as an intermediate array layer 110X.

The intermediate array layer 110X includes a plurality of semiconductor pillars (hereinafter, referred to as intermediate semiconductor pillars) 75X. A lower end of the semiconductor pillar 75X comes into contact with the upper end of the lower semiconductor pillar 75A, and an upper end of the semiconductor pillar 75X comes into contact with the lower end of the upper semiconductor pillar 75B.

For example, the intermediate array layer 110X includes intermediate select gate lines SGM0b and SGM1b on an upper part (upper array layer side) in the intermediate array layer 110X, and includes intermediate select gate lines SGM0c and SGM1c on a lower part (lower array layer side) in the intermediate array layer 110X.

The intermediate select gate lines SGM0b and SGM1b are provided in a boundary region between the upper array layer 110B and the intermediate array layer 110X. The intermediate select gate lines SGM0c and SGM1c are provided in a boundary region between the lower array layer 110A and the intermediate array layer 110X.

In the intermediate array layer 110X, conductive layers 71 between the intermediate select gate lines SGM0b and SGM0c function like word lines WL. Conductive layers 71 between the intermediate select gate lines SGM1b and SGM1c also function like word lines WL. Some of the word lines WL of the intermediate array layer 110X may be used as dummy word lines.

Hereinafter, the intermediate select gate lines SGM of the upper array layer 110B are referred to as intermediate select gate lines SGM0a and SGM1a. The intermediate select gate lines SGM of the lower array layer 110A are referred to as intermediate select gate lines SGM0d and SGM1d.

In the respective string units SU, potentials of the intermediate select gate lines SGM of the array layers 110A, 110B and 110X can be controlled separately from each other. Consequently, electrical connection between the intermediate array layer 110X and the upper array layer 110B, and electrical connection between the intermediate array layer 110X and the upper array layer 110B can be controlled separately from each other.

Operation Example

Figure 32:
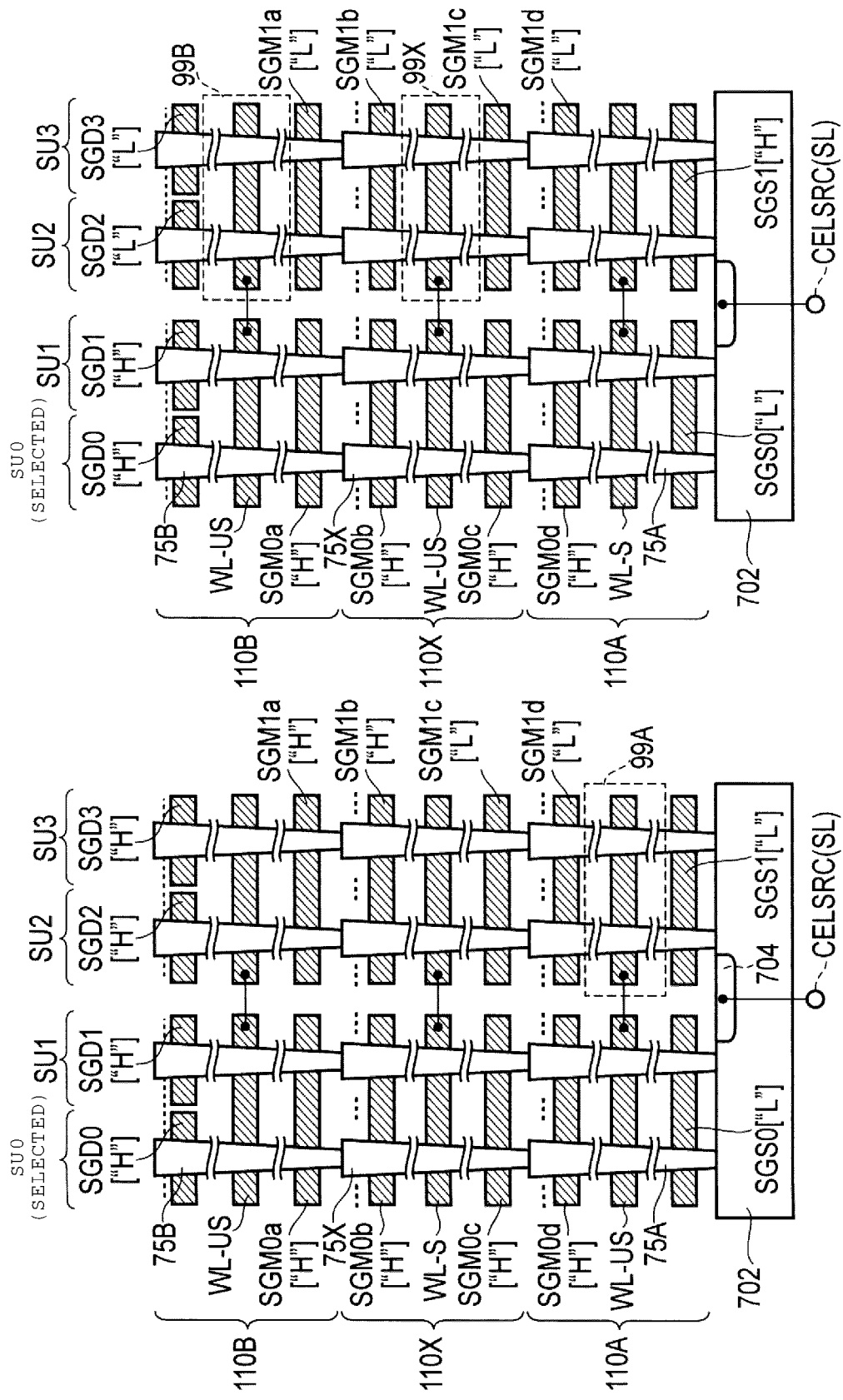
FIGS. 32A and 32B are diagrams illustrating a modification example of the memory device of the embodiment.

With reference to FIGS. 31 and 32, a description will be made of an operation example of the flash memory of the present modification example. FIGS. 31 and 32 are diagrams schematically illustrating an operation example of the flash memory of the present modification example. In this example, timings of controlling potentials of respective wirings in a read operation of the flash memory are substantially the same as the timings in the operation examples described in the first to tenth embodiments. Here, a description will be made of a relationship between potentials of the respective intermediate select gate lines SGM in the above-described read operation period (electric charge release period) TA in the flash memory.

FIG. 31 schematically illustrates a relationship between the respective intermediate select gate lines SGM in a read operation if the word line WL of the upper array layer 110B is selected. In FIG. 31, the string unit SU0 is selected an operation target.

As illustrated in FIG. 31, in the period TA from starting of control of potentials of the select gate lines to starting of application of a reading voltage to the selected word line WL-S, the voltage VSG having an "H" level are applied to the respective select gate lines SGD0, SGS0 and SGM0 (SGM0a to SGM0d) of the selected string unit SU0, and thus the select transistors ST1, ST2 and ST3 are turned on.

In the period TA, in the non-selected string units SU2 and SU3, the voltage VSG is applied to the drain side select gate lines SGD2 and SGD3, and thus the select transistors ST1 are turned on. Consequently, electric charge in the semiconductor pillars 75B of the upper array layer 110B is released to bit lines (not illustrated). As a result, reading disturbance is reduced.

At this time, in the non-selected string units SU2 and SU3, the ground voltage VSS having an "L" level is applied to the intermediate select gate lines SGM1a, SGM1b, SGM1c and SGM1d, and thus the select transistors ST3 are turned off.

Consequently, the semiconductor pillars 75A and 75X of the lower array layer 110A and the intermediate array layer 110X are electrically separated from the semiconductor pillars 75B of the upper array layer 110B, the bit lines BL, and the source line SL (CELSRC).

Therefore, when data is read from memory cells of the upper array layer 110B, the semiconductor pillars 75X of a portion 99X of the intermediate array layer 110X and the semiconductor pillars 75A of a portion 99A of the lower array layer 110A are subject to channel boosting.

Consequently, loads caused by capacitance components of the upper and intermediate semiconductor pillars 75A and 75X are reduced.

Data is read from memory cells of the intermediate array layer 110X and the lower array layer 110A through control similar thereto as follows.

FIG. 32A schematically illustrates a relationship between potentials of the respective intermediate select gate lines SGM during a read operation if a word line WL of the intermediate array layer 110X is selected.

In the period TA, the voltage VSG having an "H" level is applied to the intermediate select gate lines SGM1$a$ and SGM1$b$ in the non-selected string units SU2 and SU3. Consequently, in the non-selected string units, not only the upper semiconductor pillars 75B but also the intermediate semiconductor pillars 75X are electrically connected to the bit lines (not illustrated). Consequently, electric charge in the intermediate semiconductor pillars 75X is released to the bit lines BL. As a result, reading disturbance is reduced.

In this case, when data is read from memory cells of the intermediate array layer 110X, in the non-selected string units, semiconductor pillars 75A of the portion 99A of the lower array layer 110A are subject to channel boosting, and thus loads caused by capacitance components of the lower semiconductor pillars 75A are reduced.

If the ground voltage VSS having an "L" level is applied to the intermediate select gate line SGM1$d$ of the lower array layer 110A, the voltage VSG having an "H" level may be applied to the intermediate select gate line SGM1$c$.

Alternatively, in order to release electric charge in the semiconductor pillars 75X of the intermediate array layer 110X in the non-selected string units, the ground voltage VSS may be applied to the intermediate select gate line SGM1$b$ on the upper array layer 110B side, and the voltage VSG may be applied to the intermediate select gate line SGM1$c$ on the lower array layer 110A side. In this case, in the non-selected string units, the voltage VSG is applied to the intermediate select gate line SGM1$d$ and the source side select gate line SGS1 of the lower array layer 110A, and the ground voltage VSS is applied to the drain side select gate lines SGM2 and SGM3 of the upper array layer 110B.

Consequently, electric charge in the semiconductor pillars 75X of the intermediate array layer 110X is released to the source line (not illustrated) via the semiconductor pillars 75A of the lower array layer 110A.

FIG. 32B schematically illustrates a relationship between potentials of the respective intermediate select gate lines SGM during a read operation if a word line WL of the lower array layer 110A is selected.

In the period TA, the ground voltage VSS is applied to the drain side select gate lines SGD1, SGD2 and SGD3, and the voltage VSG is applied to the source side select gate lines SGS0 and SGS1, in the non-selected string units SU2 and SU3. Consequently, the semiconductor pillars 75 of the non-selected string units are electrically separated from the bit lines, and are electrically connected to the source line.

The ground voltage VSS having an "L" level is applied to the non-selected intermediate select gate lines SGM1$a$, SGM1$b$, SGM1$c$ and SGM1$d$. Consequently, in the non-selected string unit, the semiconductor pillars 75B and 75X of the upper array layer 110B and the intermediate array layer 110X are electrically separated from the semiconductor pillars 75A of the lower array layer 110A.

Therefore, electric charge in the lower semiconductor pillars 75A is released to the source line, and thus reading disturbance is reduced.

When data is read from the memory cells of the lower array layer 110A, the semiconductor pillars 75B of the portion 99B of the upper array layer 110B and the semiconductor pillars 75X of the portion 99X of the intermediate array layer 110X are subject to channel boosting. As a result, loads caused by capacitance components of the lower and intermediate semiconductor pillars 75A and 75X are reduced.

As in FIG. 32B, in order to release electric charge in the semiconductor pillars 75X of the intermediate array layer 110X, the voltage VSG having an "H" level may be applied to the intermediate select gate lines SGM1$c$ and SGM1$d$. In this case, the occurrence of reading disturbance is further reduced.

As in the present modification example, even if the memory cell array 11 includes three array layers, some of the semiconductor pillars of the non-selected string units in the selected block BK can be caused to be subject to channel boosting. Therefore, reading disturbance can be reduced, and a capacitance component during a read operation (or a verification operation) can also be reduced.

Therefore, the flash memory of the present modification example can reduce power consumption and can thus suppress a decrease in an operation speed.

(b) Modification Example 2

Figure 33:
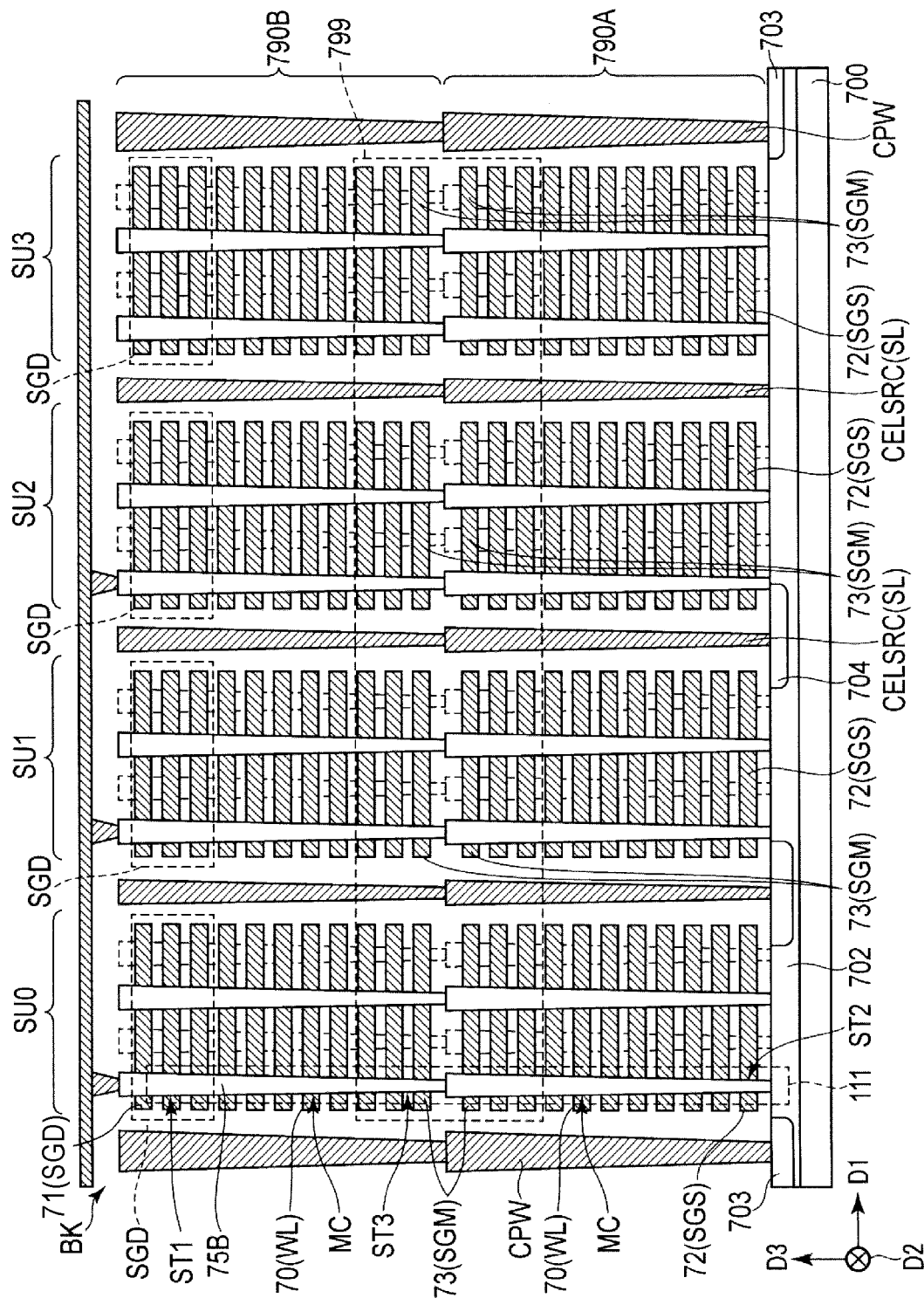
FIG. 33 is a diagram illustrating a modification example of the memory device of the embodiment.

FIG. 33 is a diagram for explaining a structure of a flash memory according to a modification example of the embodiments. FIG. 33 illustrates a sectional structure of the flash memory according to the present modification example.

As illustrated in FIG. 33, the select gate lines SGD, SGS and SGM, the word lines WL, and the string units SU may be separately provided in each of the string units SU. The source line contact CELSRC is provided between the string units. The respective string units SU do not share the select gate lines SGD, SGS and SGM.

In the example illustrated in FIG. 33, a single string unit corresponds to a single area FNG.

Even if the flash memory includes blocks having the structure illustrated in FIG. 33, the flash memory can perform each operation example described in the first to tenth embodiments.

(c) Modification Example 3

FIGS. 34A to 34F are diagrams for explaining a structure of a flash memory according to a modification example of the embodiments.

FIGS. 34A to 34F illustrate modification examples of a structure of a string unit including intermediate select gate lines in the flash memory of the present embodiment.

As illustrated in FIG. 34A, an intermediate select gate line SGM of the upper array layer 110B and an intermediate select gate line SGM of the lower array layer 110A may be provided between a dummy word line DWLA of the lower array layer 110A and a dummy word line DWLB of the upper array layer 110B in the D3 direction.

As illustrated in FIG. 34B, in each of the array layers 110A and 110B, an intermediate select gate line SGM may be provided between two dummy word lines DWL in the D3 direction.

As illustrated in FIG. 34C, an array layer not including an intermediate select gate line SGM may be provided in a block (memory cell array).

For example, in FIG. 34C, the upper array layer 110B includes the intermediate select gate line SGM, and the lower array layer 110A does not include the intermediate select gate line. The intermediate select gate line SGM is provided between a dummy word line DWL of the upper array layer 110B and a dummy word line DWL of the lower array layer 110A in the D3 direction.

As illustrated in FIG. 34D, the upper array layer 110B does not include an intermediate select gate line SGM, and the lower array layer 110A includes the intermediate select gate line SGM.

As illustrated in FIGS. 34E and 34F, in an array layer including an intermediate select gate line SGM, the intermediate select gate line SGM may be provided between two dummy word lines of the array layer.

As mentioned above, positions of the intermediate select gate lines SGM in the string unit, and layouts of the intermediate select gate lines SGM and the dummy word lines DWL may be changed as appropriate. Any one of FIGS. 34A to 34F illustrating the structures of the NAND string 111 may be applied to the flash memories of the first to tenth embodiments.

During a read operation of the flash memory, reading disturbance in a non-selected string unit may be reduced not only by electrically separating the stacked array layers 110A and 110B from each other using the intermediate select gate lines SGM but also by applying a voltage Vx lower than the voltage VSG to the dummy word lines DWL. The voltage Vx is higher than the ground voltage VSS.

In this case, in the same manner as the drain side select gate lines SGM or the intermediate select gate lines SGM, the dummy word lines DWL are electrically separated from each other for each string unit or every two string units.

(12) Others

If a flash memory used in the memory system of the present embodiment is a multi-value flash memory, a read operation of the multi-value flash memory includes the following determination voltages.

A determination voltage applied to a selected word line in a read operation at the A level is in a range of, for example, 0 V to 0.55 V. However, a determination voltage for the A level is not limited to the range, and may be any one of the ranges of 0.1 V to 0.24 V, 0.21 V to 0.31 V, 0.31 V to 0.4 V, 0.4 V to 0.5 V, and 0.5 V to 0.55 V.

A determination voltage applied to a selected word line in a read operation at the B level is in a range of, for example, 1.5 V to 2.3 V. However, a determination voltage for the B level is not limited to the range, and may be any one of the ranges of 1.65 V to 1.8 V, 1.8 V to 1.95 V, 1.95 V to 2.1 V, and 2.1 V to 2.3 V.

A determination voltage applied to a selected word line in a read operation at the C level is in a range of, for example, 3.0 V to 4.0 V. However, a determination voltage for the C level is not limited to the range, and may be any one of the ranges of 3.0 V to 3.2 V, 3.2 V to 3.4 V, 3.4 V to 3.5V, 3.5 V to 3.6 V, and 3.6 V to 4.0 V.

A period (tR) of a read operation may be any one of, for example, 25 μs to 38 μs, 38 μs to 70 μs, and 70 μs to 80 μs.

A write operation of the multi-value flash memory includes a program operation and a verification operation.

In the write operation of the multi-value flash memory, a voltage which is initially applied to a selected word line during the program operation is in a range of, for example, 13.7 V to 14.3 V. The voltage is not limited to this range, and may be either one of, for example, 13.7 V to 14.0 V and 14.0 V to 14.6 V.

If the program operation is performed according to an incremental step pulse program (ISPP) method, a step-up voltage is, for example, about 0.5 V.

A non-selection voltage (pass voltage) applied to a non-selected word line has a value in a range of, for example, 6.0 V to 7.3V. However, a non-selection voltage is not limited to this value, and may have a value in a range of, for example, 7.3 V to 8.4 V, and may be equal to or less than 6.0 V.

A pass voltage to be applied may be changed depending on whether a non-selected word line is an odd-numbered word line or an even-numbered word line.

A period (tProg) of a write operation may be any one of, for example, 1700 μs to 1800 μs, 1800 μs to 1900 μs, and 1900 μs to 2000 μs.

In an erasing operation of the multi-value flash memory, a voltage applied to a well region which is formed on an upper part in a semiconductor substrate and above which a memory cell is disposed has a value in a range of, for example, 12 V to 13.6 V. The voltage is not limited to this value, and may have a value in any one of ranges, for example, 13.6 V to 14.8 V, 14.8 V to 19.0 V, 19.0 V to 19.8 V, and 19.8 V to 21 V.

A period (tErase) of the erasing operation may be one of ranges of, for example, 3000 μs to 4000 μs, 4000 μs to 5000 μs, and 4000 μs to 9000 μs.

The memory cell has the charge storage layer which is disposed on the side surface of the semiconductor pillar via the tunnel insulating film of 4 nm to 10 nm. The charge storage layer has a structure in which an insulating film (for example, SiN or SiON) having a film thickness of 2 nm to 3 nm, and polysilicon having a film thickness of 3 nm to 8 nm are laminated. Polysilicon may contain a metal such as Ru.

The insulating film is formed on the charge storage layer. The insulating film includes a lower-layer high-k film having a thickness of 3 nm to 10 nm, an upper-layer high-k film having a thickness of 3 nm to 10 nm, and a silicon oxide film having a thickness of 4 to 10 nm. The high-k film may be an HfO film. A thickness of the silicon oxide film may be larger than a thickness of the high-k film.

A control gate electrode having a film thickness of 30 nm to 70 nm is provided on the insulating film via a material having a film thickness of 3 nm to 10 nm. Such a material is a metal oxide film such as TaO, or a metal nitride film such as TaN. The control gate electrode may be a metal such as tungsten (W).

An air gap may be provided between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
   a first memory string including a first memory cell, a second memory cell, a first select transistor above the first memory cell, a second select transistor below the second memory cell, and a third select transistor between the first and second memory cells;
   a second memory string including a third memory cell, a fourth memory cell, a fourth select transistor above the third memory cell, a fifth select transistor below the fourth memory cell, and a sixth select transistor between the third and fourth memory cells;
   a first word line electrically connected to gates of the first and third memory cells;
   a second word line electrically connected to gates of the second and fourth memory cells; and
   a controller configured to execute a read operation on one of the memory cells, the read operation including a first phase and a second phase, wherein
   when a read target is one of the first and second memory cells,
      during the first phase, a first voltage is applied to the first, second, and third select transistors, and one of the fourth and fifth select transistors, and a second voltage lower than the first voltage is applied to the sixth select transistor and the other one of the fourth and fifth select transistors, and
      during the second phase, the second voltage is applied to the fourth, fifth, and sixth select transistors, and a read target voltage is applied to one of the first and second word lines.

2. The device according to claim 1, wherein, when the read target is the first memory cell,
   during the first phase, the first voltage is applied to the first, second, third, and fourth select transistors, and the second voltage is applied to the fifth and sixth select transistors, and
   during the second phase, the second voltage is applied to the fourth, fifth, and sixth select transistors, and the read target voltage is applied to the first word line.

3. The device according to claim 1, wherein, when the read target is the second memory cell,
   during the first phase, the first voltage is applied to the first, second, third, and fifth select transistors, and the second voltage is applied to the fourth and sixth select transistors, and
   during the second phase, the second voltage is applied to the fourth, fifth, and sixth select transistors, and the read target voltage is applied to the second word line.

4. The device according to claim 1, wherein the read operation is carried out during a program verify operation.

5. The device according to claim 1, wherein
   at a beginning of the second phase, the voltage applied to the second select transistor transitions from the first voltage to the second voltage, and
   during the second phase, the voltage applied to the second select transistor transitions from the second voltage to the first voltage.

6. The device according to claim 1, wherein the second voltage is ground voltage.

7. The device according to claim 1, wherein the second voltage is higher than ground voltage.

8. A memory device comprising:
   a first memory string including a first memory cell, a second memory cell, a first select transistor above the first memory cell, a second select transistor below the second memory cell, and a third select transistor between the first and second memory cells;
   a second memory string including a third memory cell, a fourth memory cell, a fourth select transistor above the third memory cell, a fifth select transistor below the fourth memory cell, and a sixth select transistor between the third and fourth memory cells;
   a first word line electrically connected to gates of the first and third memory cells;
   a second word line electrically connected to gates of the second and fourth memory cells; and
   a controller configured to execute a read operation on one of the memory cells, the read operation including a first phase and a second phase, wherein
   when a read target is one of the first and second memory cells,
      during the first phase, a first voltage is applied to the first and third select transistors, and one of the fourth and fifth select transistors, and a second voltage lower than the first voltage is applied to the second and sixth select transistor and the other one of the fourth and fifth select transistors, and
      during the second phase, the first voltage is applied to the second select transistor, and the second voltage is applied to the fourth, fifth, and sixth select transistors.

9. The device according to claim 8, wherein
   during the first phase, the voltage applied to one of the first and second word lines is increased from the second voltage while the voltage applied to the other one of the first and second word lines is equal to the second voltage.

10. The device according to claim 9, wherein when the read target is the first memory cell,
    during the first phase, the voltage applied to the first word line is increased from the second voltage while the voltage applied to the second word line is equal to the second voltage.

11. The device according to claim 8, wherein the read operation is carried out during a program verify operation.

12. The device according to claim 8, wherein
    at a beginning of the second phase, the voltage applied to the second select transistor is maintained at the second voltage, and
    during the second phase, the voltage applied to the second select transistor transitions from the second voltage to the first voltage.

13. The device according to claim 8, wherein the second voltage is ground voltage.

14. A memory device comprising:
    a first memory string including a first memory cell, a second memory cell, a first select transistor above the first memory cell, a second select transistor below the second memory cell, and third and fourth select transistors between the first and second memory cells;
    a second memory string including a third memory cell, a fourth memory cell, a fifth select transistor above the third memory cell, a sixth select transistor below the fourth memory cell, and seventh and eighth select transistors between the third and fourth memory cells;
    a first word line electrically connected to gates of the first and third memory cells;
    a second word line electrically connected to gates of the second and fourth memory cells; and
    a controller configured to execute a read operation on one of the memory cells, the read operation including a first phase and a second phase, wherein when a read target is one of the first and second memory cells,
- during the first phase, a first voltage is applied to the first, second, third, and fourth select transistors, one of the fifth and sixth select transistors, and one of the seventh and eighth select transistors, and a second voltage lower than the first voltage is applied to the sixth select transistor and the other one of the seventh and eighth select transistors, and
- during the second phase, the second voltage is applied to the fifth and sixth select transistors, and the other one of the seventh and eighth select transistors, and the voltage applied to said one of the seventh and eighth select transistors is maintained at the first voltage.

15. The device according to claim 14, wherein, when the read target is the first memory cell,
- during the first phase, the first voltage is applied to the first, second, third, fourth, fifth, and eighth select transistors, and the second voltage is applied to the sixth and seventh select transistors, and
- during the second phase, the second voltage is applied to the fifth, sixth, and seventh select transistors, and a read target voltage is applied to the first word line.

16. The device according to claim 15, wherein
- at a beginning of the second phase, the voltage applied to the second select transistor transitions from the first voltage to the second voltage, and
- during the second phase, the voltage applied to the second select transistor transitions from the second voltage to the first voltage.

17. The device according to claim 14, wherein, when the read target is the second memory cell,
- during the first phase, the first voltage is applied to the first, second, third, fourth, sixth, and seventh select transistors, and the second voltage is applied to the fifth and eighth select transistors, and
- during the second phase, the second voltage is applied to the fifth, sixth, and eighth select transistors, and a read target voltage is applied to the second word line.

18. The device according to claim 17, wherein
- at a beginning of the second phase, the voltage applied to the second select transistor transitions from the first voltage to the second voltage, and
- during the second phase, the voltage applied to the second select transistor transitions from the second voltage to the first voltage.

19. The device according to claim 14, wherein the read operation is carried out during a program verify operation.

20. The device according to claim 14, wherein the second voltage is ground voltage.

* * * * *